(12) United States Patent
White et al.

(10) Patent No.: US 7,712,056 B2
(45) Date of Patent: May 4, 2010

(54) CHARACTERIZATION AND VERIFICATION FOR INTEGRATED CIRCUIT DESIGNS

(75) Inventors: David White, Cambridge, MA (US); Taber H. Smith, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 457 days.

(21) Appl. No.: 11/703,399

(22) Filed: Feb. 6, 2007

(65) Prior Publication Data

US 2007/0157139 A1 Jul. 5, 2007

Related U.S. Application Data

(60) Division of application No. 10/321,283, filed on Dec. 17, 2002, now Pat. No. 7,174,520, which is a continuation-in-part of application No. 10/165,214, filed on Jun. 7, 2002, now Pat. No. 7,393,755, and a continuation-in-part of application No. 10/164,844, filed on Jun. 7, 2002, now Pat. No. 7,124,386, and a continuation-in-part of application No. 10/164,847, filed on Jun. 7, 2002, now Pat. No. 7,152,215, and a continuation-in-part of application No. 10/164,842, filed on Jun. 7, 2002, now abandoned, and a continuation-in-part of application No. 10/200,660, filed on Jul. 22, 2002, now Pat. No. 7,363,099.

(51) Int. Cl.
*G06F 17/50* (2006.01)
*G06F 19/00* (2006.01)
*G21K 5/00* (2006.01)
*G03F 1/00* (2006.01)

(52) U.S. Cl. .............................. 716/4; 716/21; 700/121; 700/120; 378/35; 430/5

(58) Field of Classification Search ..................... 716/4, 716/21; 700/120, 121; 378/35; 430/35

See application file for complete search history.

(56) References Cited

U.S. PATENT DOCUMENTS 5,124,927 A   6/1992   Hopewell et al.

(Continued)

FOREIGN PATENT DOCUMENTS

| EP | 0453753 A2 | 10/1991 |
| WO | 03079240 A2 | 9/2003 |
| WO | 03079240 A3 | 9/2003 |

OTHER PUBLICATIONS

Ohtsuka et al., "A Novel Multiple Focus Position Control Method by Conjugated Twin-Shifter Phase Shift Lithography", International Electron Devices Meeting, Dec. 8-11, 1991, pp. 59-62.*

(Continued)

*Primary Examiner*—Phallaka Kik
(74) *Attorney, Agent, or Firm*—Vista IP Law Group LLP

(57) ABSTRACT

Variations are characterized in feature dimensions of an integrated circuit that is to be fabricated in accordance with a design by a process that produces topographical variation in the integrated circuit, the variations in feature dimension being caused by the topographical variations. The process includes lithography or etch. Predicted characteristics are verified to conform to the design, the characteristics including feature dimensions or electrical characteristics. A process is selected for use in fabricating the integrated circuit based on the relative predicted variations. Chip-level features of a design of an integrated circuit are verified for manufacture within focus limitations of a lithographic tool. Whether a design of a level of an integrated circuit can be lithographically imaged in accordance with the design is predicted, and if it cannot be, the design or processing parameters are adjusted so that it can be.

36 Claims, 77 Drawing Sheets

U.S. PATENT DOCUMENTS

| | | | |
|---|---|---|---|
| 5,581,475 A | 12/1996 | Majors | |
| 5,597,668 A | 1/1997 | Nowak et al. | |
| 5,663,076 A | 9/1997 | Rostoker et al. | |
| 5,705,301 A | 1/1998 | Garza et al. | |
| 5,763,955 A | 6/1998 | Findley et al. | |
| 5,798,298 A | 8/1998 | Yang et al. | |
| 5,821,621 A | 10/1998 | Jeng | |
| 5,854,125 A | 12/1998 | Harvey | |
| 5,861,342 A | 1/1999 | Gabriel et al. | |
| 5,903,469 A | 5/1999 | Ho | |
| 5,920,487 A | 7/1999 | Reich et al. | |
| 5,923,563 A | 7/1999 | Lavin et al. | |
| 5,923,947 A | 7/1999 | Sur | |
| 5,948,573 A | 9/1999 | Takahashi | |
| 5,972,541 A | 10/1999 | Sugasawara et al. | |
| 6,049,789 A | 4/2000 | Frison et al. | |
| 6,081,272 A | 6/2000 | Morimoto | |
| 6,093,631 A | 7/2000 | Jaso | |
| 6,109,775 A | 8/2000 | Tripathi et al. | |
| 6,118,137 A | 9/2000 | Fulford et al. | |
| 6,124,197 A | 9/2000 | Fulford | |
| 6,157,947 A | 12/2000 | Watanabe et al. | |
| 6,176,992 B1 | 1/2001 | Talieh | |
| 6,230,299 B1 | 5/2001 | McSherry et al. | |
| 6,249,904 B1 | 6/2001 | Cobb | |
| 6,255,125 B1 | 7/2001 | Schmidt et al. | |
| 6,259,115 B1 | 7/2001 | You et al. | |
| 6,263,476 B1 | 7/2001 | Browen et al. | |
| 6,289,499 B1 | 9/2001 | Rieger et al. | |
| 6,309,956 B1 | 10/2001 | Chiang et al. | |
| 6,323,113 B1 | 11/2001 | Gabriel et al. | |
| 6,327,555 B1 | 12/2001 | Shimizu et al. | |
| 6,328,872 B1 | 12/2001 | Talieh et al. | |
| 6,343,370 B1 | 1/2002 | Taoka et al. | |
| 6,344,408 B1 | 2/2002 | Chen et al. | |
| 6,344,409 B1 | 2/2002 | Jaso et al. | |
| 6,352,623 B1 | 3/2002 | Volodarsky et al. | |
| 6,355,387 B1 | 3/2002 | Fujinaga et al. | |
| 6,380,087 B1 | 4/2002 | Gupta et al. | |
| 6,396,158 B1 | 5/2002 | Travis | |
| 6,486,066 B2 | 11/2002 | Cleeves et al. | |
| 6,539,321 B2 | 3/2003 | Bruce et al. | |
| 6,550,041 B1 | 4/2003 | McBride | |
| 6,556,884 B1 | 4/2003 | Miller et al. | |
| 6,556,947 B1 | 4/2003 | Scheiner et al. | |
| 6,562,639 B1 | 5/2003 | Minvielle et al. | |
| 6,567,964 B2 | 5/2003 | Shin et al. | |
| 6,578,174 B2 | 6/2003 | Zizzo | |
| 6,578,188 B1 | 6/2003 | Pang et al. | |
| 6,611,045 B2 | 8/2003 | Travis et al. | |
| 6,613,688 B1 | 9/2003 | Brown et al. | |
| 6,625,801 B1 | 9/2003 | Pierrat et al. | |
| 6,651,226 B2 | 11/2003 | Houge et al. | |
| 6,660,569 B1 | 12/2003 | Barthelmess et al. | |
| 6,665,856 B1 | 12/2003 | Pierrat et al. | |
| 6,671,570 B2 | 12/2003 | Schulze | |
| 6,691,297 B1 | 2/2004 | Misaka et al. | |
| 6,704,920 B2 | 3/2004 | Brill et al. | |
| 6,708,129 B1 | 3/2004 | Pasadyn et al. | |
| 6,708,318 B2 | 3/2004 | Satoh et al. | |
| 6,742,165 B2 | 5/2004 | Lev et al. | |
| 6,751,785 B1 | 6/2004 | Oh | |
| 6,866,974 B2 | 3/2005 | Kim et al. | |
| 6,873,720 B2 | 3/2005 | Cai et al. | |
| 6,893,800 B2 | 5/2005 | Jessen et al. | |
| 6,904,581 B1 | 6/2005 | Oh | |
| 7,174,520 B2 | 2/2007 | White et al. | |
| 7,243,316 B2 | 7/2007 | White et al. | |
| 2001/0031506 A1 | 10/2001 | Plat et al. | |
| 2001/0052107 A1 | 12/2001 | Anderson et al. | |
| 2002/0045110 A1 | 4/2002 | Ohnuma | |
| 2002/0051567 A1 | 5/2002 | Ganz et al. | |
| 2002/0083401 A1 | 6/2002 | Breiner et al. | |
| 2002/0106837 A1 | 8/2002 | Cleeves et al. | |
| 2002/0157076 A1 | 10/2002 | Asakawa | |
| 2002/0162082 A1 | 10/2002 | Cwynar et al. | |
| 2003/0084416 A1 | 5/2003 | Dai et al. | |
| 2003/0107134 A1 | 6/2003 | Lee | |
| 2003/0199150 A1 | 10/2003 | Permana et al. | |
| 2003/0228714 A1 | 12/2003 | Smith et al. | |
| 2003/0229410 A1 | 12/2003 | Smith et al. | |
| 2003/0229412 A1 | 12/2003 | White et al. | |
| 2003/0229479 A1 | 12/2003 | Smith et al. | |
| 2003/0229868 A1 | 12/2003 | White et al. | |
| 2003/0229875 A1 | 12/2003 | Smith et al. | |
| 2003/0229880 A1 | 12/2003 | White et al. | |
| 2003/0229881 A1 | 12/2003 | White et al. | |
| 2003/0237064 A1 | 12/2003 | White et al. | |
| 2004/0044984 A1 | 3/2004 | Keogan et al. | |
| 2004/0058255 A1 | 3/2004 | Jessen et al. | |
| 2004/0076896 A1 | 4/2004 | Kim et al. | |
| 2004/0107410 A1 | 6/2004 | Misaka et al. | |
| 2005/0037522 A1 | 2/2005 | Smith et al. | |
| 2005/0132306 A1 | 6/2005 | Smith et al. | |
| 2005/0196964 A1 | 9/2005 | Smith et al. | |
| 2005/0235246 A1 | 10/2005 | Smith et al. | |
| 2005/0235248 A1 | 10/2005 | Victoria et al. | |
| 2005/0289500 A1 | 12/2005 | Misaka et al. | |

OTHER PUBLICATIONS

Sugihara et al., "Novel Annular Illumination Using Controlled Phase and Transparency", 1994 Symposium on VLSI Technology, Jun. 7-9, 1994, pp. 95-96.*

Bakker "Using Calibre in a Design for Manufacturing Environment" Deep Submicron Technical Publication, Mentor Graphics, Sep. 2001.

Boning, D. et al. "Statistical Metrology of Interlevel Dielectric Thickness Variation" Proceedings of the SPIE Symposium on Microelectronic Manufacturing, Oct. 1994, vol. 2334, pp. 316-327.

Boning, D. et al. "Models for Pattern Dependencies: Capturing Effects in Oxide, STI and Copper CMP" Jul. 17, 2001, Semcon West.

Boning, D. et al. "Pattern Dependent Modeling for CMP Optimization and Control" MRS Spring Meeting, Proc. Symposium P: Chemical Mechanical Polishing, San Francisco, CA, Apr. 1999.

Boning, D. et al. "A General Semiconductor Process Modeling Framework" IEEE Transactions on Semiconductor Manufacturing, Nov. 1992, vol. 5, No. 4, pp. 266-280.

Chen, Y. et al. "Monte-Carlo Algorithms for Layout Density Control" Asia and South Pacific Design Automation Conference, Jan. 2002, pp. 523-528.

Chen, Y. et al. "Hierarchical Dummy Fill for Process Uniformity" Asia and South Pacific Design Automation Conference, Jan. 2001, pp. 139-144.

Chen, Y. et al. "Practical Iterated Fill Synthesis for CMP Uniformity" ACM/IEEE Design Automation Conference, Jun. 2000, pp. 671-674.

Conrad, et al. "Model Considerations, Calibration Issues, and Metrology Methods for Resist-Bias Models" in Metrology, Inspection, and Process Control for Microlithography XIII, B. Singh, ed., Proc. SPIE 3667, 1999, pp. 940-955.

Davis, J.C. et al. "Automatic Synthesis of Equipment Recipes from Specified Wafer-State Transitions" IEEE Transactions on Semiconductor Manufacturing, Nov. 1998, vol. 11, No. 4, pp. 527-536.

Hosack, H.H. et al. "Recent Advances in Process Synthesis for Semiconductor Devices" IEEE Transactions on Electron Devices, Mar. 1998, vol. 45, No. 3, pp. 626-633.

Kahng, A.B. et al. "New and Exact Filling Algorithms for Layout Density Control" UCLA Department of Computer Science, Los Angeles, CA, 1999.

Kahng, A.B. et al. "Filling and Slotting: Analysis and Algorithms" International Symposium on Physical Design, Monterey, CA, 1998, pp. 95-102.

Kahng, A.B. et al. "New Multilevel and Hierarchical Algorithms for Layout Density Control" UCLA Department of Computer Science, Los Angeles, CA, 1999.

Kahng, A.B. et al. "Filling Algorithms and Analyses for Layout Density Control" IEEE Transactions on Computer-Aided Design of Integrated Circuits and Systems, Apr. 1999, vol. 18, No. 4, pp. 445-462.

Kim, Y.-H. et al. "CHAMPS (CHemicAl-Mechanical Planarization Simulator)" International Conference on Simulation of Semiconductor Processes and Devices, Seattle, WA, Sep. 6-8, 2000.

Lee, B. et al. "Using Smart Dummy Fill and Selective Reverse Etchback for Pattern Density Equalization" Proceedings CMP-MIC, Santa Clara, CA, Mar. 2000, pp. 255-258.

Lee et al. "Analyzing the Effects of Floating Dummy-Fills: From Feature Scale Analysis to Full-Chip RC Extraction" Proc. of IEDM 2001 et al., Dec. 2001.

Lee, K.-H. "Analyzing the Effects of Floating Dummy-Fills: From Feature Scale Analysis to Full-Chip RC Extraction" 2001, Samsung Electronics Co., Ltd., Korea.

Mehrotra, V. et al. "Technology Scaling Impact of Variation on Clock Skew and Interconnect Delay" International Interconnect Technology Conference (IITC), San Francisco, CA, Jun. 2001.

Mehrotra, V. et al. "A Methodology for Modeling the Effects of Systematic Within-Die Interconnect and Device Variation on Circuit Performance" Design Automation Conference, Los Angeles, CA, Jun. 2000.

Mehrotra, V. et al. "Modeling the Effects of Manufacturing Variation on High-Speed Microprocessor Interconnect Performance" Annual ACM-IEEE Design Automation Conference, Los Angeles, CA, 2000, pp. 168-171.

McGhee, J. et al. "The MMST Computer-Integrated Manufacturing System Framework" IEEE Transactions of Semiconductor Manufacturing, May 1994, vol. 7, No. 2, pp. 107-116.

Moyne, W.P. "Enhancing MEMS Design Using Statistical Process Information" Massachusetts Institute of Technology, Department of Electrical Engineering and Computer Science, Apr. 7, 2000.

Ohta, et al. "A New SP (simultaneous polishing) Model for Copper CMP Processes" International Conference on Simualtion of Semiconductor Processes and Devices (SISPAD '02), Piscathaway, NJ, Sep. 4-6, 2002, pp. 257-260.

Ouma, D. et al. "An Integrated Characterization and Modeling Methodology for CMP Dielectric Planarization" International Interconnect Technology Conference, San Francisco, CA, Jun. 1998.

Ouma, D. et al. "An Integrated Characterization and Modeling Methodology for CMP Dielectric Planarization" Proceedings of Interconnect Technology Conference, Feb. 1998, pp. 67-69.

Park, T.H. et al. "Pattern Dependent Modeling of Electroplated Copper Profiles" International Interconnect Technology Conference (IITC), Jun. 2001.

Park, T. et al. "Electrical Characterization of Copper Chemical Mechanical Polishing" SEMATECH, Austin, TX, Feb. 1999.

Park, T. et al. "Pattern and Process Dependencies in Copper Damascene Chemical Mechanical Polishing Processes" VLSI Multilevel Interconnect Conference (VMIC), Santa Clara, CA, Jun. 1998.

Park, J.-K. et al. "An Exhaustive Method for Characterizing the Interconnect Capacitance Considered the Floating Dummy-Fills by Employing an Efficient Field Solving Algorithm" International Conference on Simulation of Semiconductor Processes and Devices, 2000 pp. 98-101.

Peters, L. "Removing Barriers to Low-k Dielectric Adoption" Semiconductor International, May 1, 2002.

Sakurai, T. "Closed-Form Expressions for Interconnection Delay, Coupling, and Crosstalk in VLSI's" IEEE Transactions on Electron Devices, Jan. 1993, vol. 40, No. 1.

Saxena, S. et al. "A Methodology for the Top-down Synthesis of Semiconductor Process Flows" Proc. 3rd IEEE/SEMI International Symposium on Semiconductor Manufacturing, 1995, pp. 36-40.

Singer, P. "Progress in Copper: A Look Ahead" Semiconductor International, May 1, 2002.

Smith, T.H. "Device Independent Process Control of Delectric Chemical Mechanical Polishing" Thesis, Massachusetts Institute of Technology, Sep. 1997.

Smith, T.H. "A CMP Model Combining Density and Time Dependencies" Proc. CMP-MIC, Santa Clara, CA, Feb. 1999.

Stine, B.E. "A General Methodology for Assessing and Characterizing Variation in Semiconductor Manufacturing" Thesis, Massachusetts Institute of Technology, Sep. 1997.

Stine, B.E. et al. "A Simulation Methodology for Assessing the Impact of Spatial/Pattern Dependent Interconnect Parameter Variation on Circuit Performance" 1997 International Electron Devices Meeting, Washington, DC, Dec. 1997, pp. 133-136.

Stine, B. et al. "The Physical and Electrical Effects of Metal-Fill Patterning Practices for Oxide Chemical-Mechanical Polishing Processes" IEEE Transactions of Electron Devices, Mar. 1998, vol. 45, No. 3, pp. 665-679.

Stine, B.E. et al. "On the Impact of Dishing in Metal CMP Processes on Circuit Performance" International Workshop on Statistical Metrology Technical Papers, 1998, pp. 64-67.

Stine, B. et al. "A Closed-From Analytic Model for ILD Thickness Variation in CMP Processes'" Proc. CMP-MIC, Santa Clara, CA, Feb. 1997.

Tian et al. "Model-Based Dummy Feature Placement for Oxide Chemical-Mechanical Polishing Manufacturability" Proceedings of the 37th Design Automation Conference, 2000, pp. 667-670.

Tuinhout, H.P. et al. "Characterization of Systematic MOSFET Current Factor Mismatch Caused by Metal CMP Dummy Structures" IEEE Transactions on Semiconductor Manufacturing, Nov. 2001, vol. 14, No. 4, pp. 302-312.

Tugbawa, T. et al. "A Mathematical Model of Pattern Dependencies in Cu CMP Processes" CMP Symposium, Electrochemical Society Meeting, Honolulu, HA, Oct. 1999.

Tugbawa, T. et al. "Integrated Chip-Scale Simulation of Pattern Dependencies in Copper Electroplating and Copper Chemical Mechanical Polishing Processes" International Interconnect Technology Conference, San Francisco, CA, Jun. 2002.

Tugbawa, T. et al. "Framework for Modeling of Pattern Dependencies in Multi-Step Cu CMP Processes" SEMICON West 2000, Jul. 11, 2000.

Tugbawa, T. et al. "Modeling of Pattern Dependencies for Multi-Level Copper Chemical-Mechanical Polishing Processes" Material Research Society Spring Meeting, San Francisco, CA Apr. 2001.

Zaman, M.H. et al. "Automatic Generation of Thin Film Process Flows—Part I: Basic Algorithms" IEEE Transactions on Semiconductor Manufacturing, Feb. 1999, vol. 12, No. 1, pp. 116-128.

Zaman, M.H. et al. "Automatic Generation of Thin Film Process Flows—Part II: Recipe Generation, Flow Evaluation, and System Framework" IEEE Transactions on Semiconductor Manufacturing, Feb. 1999, vol. 12, No. 1, pp. 129-138.

"MIT Statistical Metrology" Publications List, located at http://www-mtl.mit.edu/Metrology/PAPERS/, 1994-2003.

Slide Presentation, Exhibit A.

Slide Presentation, Exhibit B1.

Slide Presentation, Exhibit B2.

Praesagus Business Plan, Exhibit C.

International Search Report dated Nov. 24, 2004 for PCT Appl. No. PCT/US03/17655.

Supplemental European Search Report dated Apr. 26, 2007 for Appl. No. 03741876.1.

Office Action dated Jun. 17, 2004 for U.S. Appl. No. 10/200,660.

Office Action dated Feb. 11, 2005 for U.S. Appl. No. 10/200,660.

Advisory Action dated Aug. 1, 2005 for U.S. Appl. No. 10/200,660.

Office Action dated Jun. 16, 2006 for U.S. Appl. No. 10/200,660.

Notice of Allowance dated Jan. 18, 2007 for U.S. Appl. No. 10/200,660.

Notice of Allowance dated Nov. 13, 2007 for U.S. Appl. No. 10/200,660.

Office Action dated Jun. 28, 2004 for U.S. Appl. No. 10/321,298.

Office Action dated Dec. 15, 2004 for U.S. Appl. No. 10/321,298.

Office Action dated Jul. 12, 2005 for U.S. Appl. No. 10/321,298.

Notice of Allowance dated Jan. 19, 2006 for U.S. Appl. No. 10/321,298.

Notice of Allowance dated May 15, 2006 for U.S. Appl. No. 10/321,298.

Notice of Allowance dated Oct. 18, 2006 for U.S. Appl. No. 10/321,298.

Notice of Allowance dated May 7, 2007 for U.S. Appl. No. 10/321,298.
Notice of Allowance dated Oct. 2, 2007 for U.S. Appl. No. 10/321,298.
Office Action dated Jul. 14, 2004 for U.S. Appl. No. 10/321,777.
Office Action dated Jun. 2, 2005 for U.S. Appl. No. 10/321,777.
Office Action dated Mar. 1, 2006 for U.S. Appl. No. 10/321,777.
Office Action dated Dec. 4, 2006 for U.S. Appl. No. 10/321,777.
Notice of Allowance dated Jan. 18, 2005 for U.S. Appl. No. 10/321,777.
Notice of Allowance dated Apr. 10, 2007 for U.S. Appl. No. 10/321,777.
Notice of Allowance dated Aug. 24, 2007 for U.S. Appl. No. 10/321,777.
Office Action dated Aug. 25, 2005 for U.S. Appl. No. 10/321,290.
Office Action dated Mar. 21, 2006 for U.S. Appl. No. 10/321,290.
Notice of Allowance dated Oct. 25, 2006 for U.S. Appl. No. 10/321,290.
Notice of Allowance dated Jul. 3, 2007 for U.S. Appl. No. 10/321,290.
Notice of Allowance dated Sep. 5, 2007 for U.S. Appl. No. 10/321,290.
Notice of Allowance dated Jun. 15, 2007 for U.S. Appl. No. 11/005,651.
Notice of Allowance dated Dec. 14, 2007 for U.S. Appl. No. 11/005,651.

* cited by examiner

36 A computer aided design (CAD) process is used to translate a circuit design to a design layout that represents various levels of an IC.

37 Electronic layout design files are used to finalize a design or "tape-out" a design before creating lithography masks

38 Lithography masks are created

39 Lithography masks are used with a lithography tool to print circuit patterns onto a wafer covered with photosensitive film.

Fig. 2

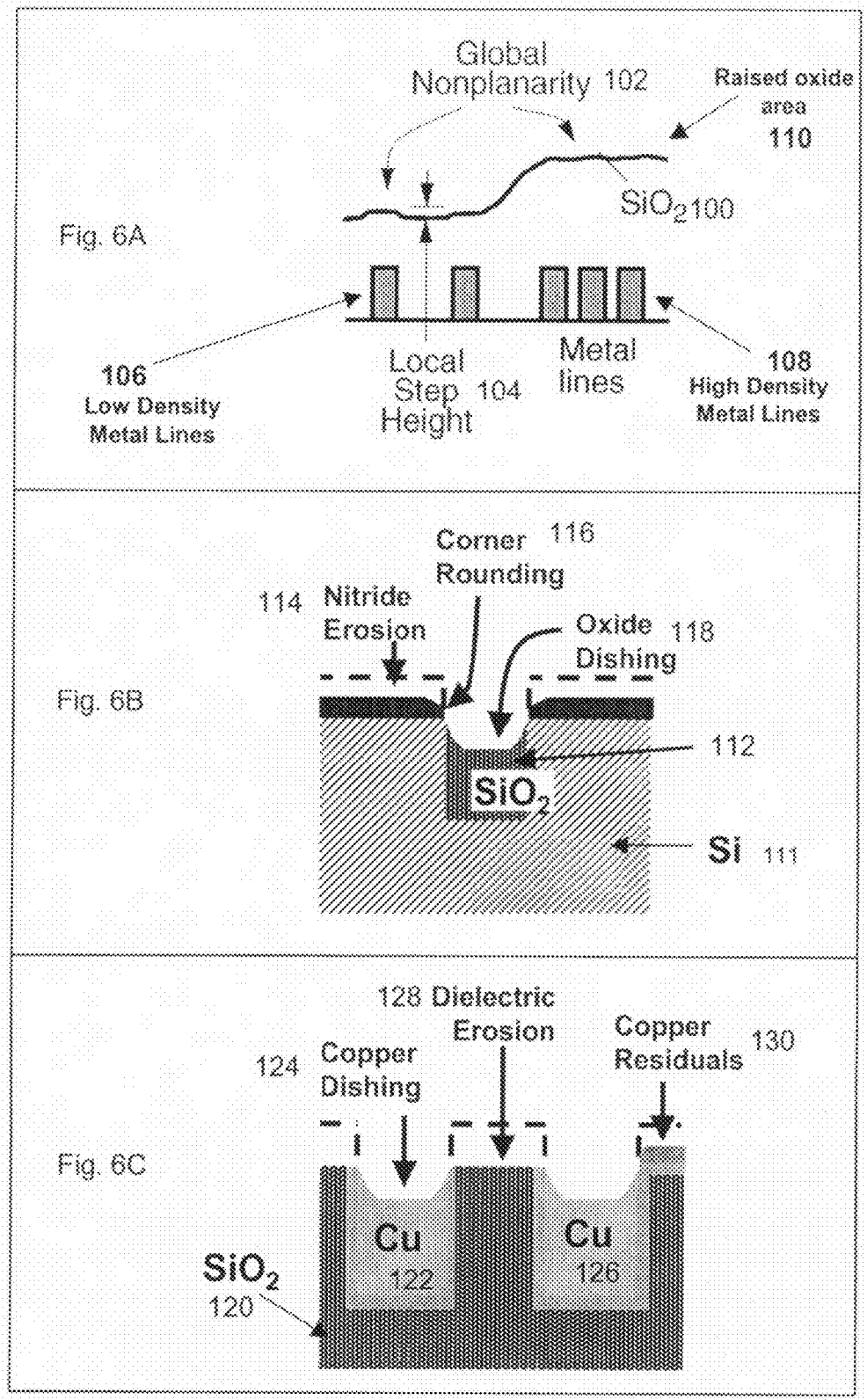

| 1620 | 1622 | 1624 | 1626 | 1628 | 1630 |
|---|---|---|---|---|---|
| $x$ | $y$ | $FW^*$ | $h$ | $FW_p$ | $\Delta CD$ |
| 100 | 100 | 0.20 | 2000 | 0.30 | 0.10 |

CHARACTERIZATION AND VERIFICATION FOR INTEGRATED CIRCUIT DESIGNS

CROSS-REFERENCE TO RELATED APPLICATIONS

This application is a divisional of U.S. patent application Ser. No. 10/321,283, filed on Dec. 17, 2002, now U.S. Pat. No. 7,174,520, which is a continuation in part of, and claims the benefit of priority of, U.S. patent application Ser. Nos. 10/165,214, now U.S. Pat. No. 7,393,755, 10/164,844, now U.S. Pat. No. 7,124,386, 10/164,847, now U.S. Pat. No. 7,152,215 and 10/164,842, now abandoned all filed Jun. 7, 2002, and Ser. No. 10/200,660, now U.S. Pat. No. 7,363,099 filed Jul. 22, 2002. The contents of those patent applications are incorporated by reference here in their entireties.

BACKGROUND

This description relates to lithography mask creation for integrated circuits (ICs).

Lithography mask creation and printing assume that projection is done on a film, within a predetermined depth of focus range. However pattern dependencies between the process by which the ICs are fabricated and the pattern that is being created often cause processed films to have significant variation in thickness across a surface, resulting in variation in feature dimensions (e.g. line widths) of integrated circuits (ICs) that are patterned using the mask. As successive nonconformal layers are deposited and polished, the variation becomes worse. Because interconnect lines and connections on higher layers carry power to portions of the chip, the variations can increase the sheet resistance and thus affect the power effectiveness of the chip.

One way to reduce the variations in fabricated chips is to make physical measurements on manufactured wafers containing initial designs of devices and use these measurements to adjust the mask design. Other methods to reduce variation include optical proximity correction (OPC) where subwavelength distortions due to patterned features are identified and corrected.

SUMMARY

In general, in one aspect, the invention features a method that includes characterizing variations in feature dimensions of an integrated circuit that is to be fabricated ill accordance with a design by a process that produces topographical variation in the integrated circuit, the variations in feature dimension being caused by the topographical variations. The process that produces topographical variation comprises electroplated copper deposition or chemical mechanical polishing. The process includes a lithographic or etching process that interacts with the topographical variation to produce the variations in feature dimensions. The etching process comprises a plasma etching process.

In general, in another aspect, the invention features a method that includes using a pattern-dependent model of topographical variation to predict feature dimension variations or electrical characteristics of an integrated circuit that is to be fabricated in accordance with a design by a process that produces topological variation, and verifying that the predicted feature dimensions or electrical characteristics conform to the design.

In general, in another aspect, the invention features a method that includes using a pattern-dependent model of topographical variation to predict characteristics of an integrated circuit that is to be fabricated in accordance with a design by a process that includes lithography or etch, and verifying that the predicted characteristics conform to the design, the characteristics including feature dimensions or electrical characteristics.

Implementations of the invention may include one or more of the following features. The process includes plasma etch and the characteristics include sidewall angle, trench width, or trench depth. The characteristics include feature dimensions. The characteristics include electrical characteristics. The process includes electroplated copper deposition. The process includes chemical mechanical polishing. The characteristics comprise feature width. The characteristics are associated with all of the integrated circuit. The characteristics are associated with less than all of the integrated circuit. The verifying of the predicted characteristics includes verifying feature widths. The verifying of the predicted characteristics also includes verifying the topographical variation. The verifying of the predicted characteristics includes verifying physical and electrical parameters that result from feature width variation. The prediction or verification is done in response to a request received electronically from a network. The prediction or verification is provided as a web service. Using a pattern-dependent model of topographical variation to predict characteristics of the integrated circuit includes using the model with respect to at least two different process features. The process features comprise process recipes. The process recipes include different tool settings for a tool. The process recipes include power settings. The process recipes include etch times. The process recipes include polish times. The process recipes include deposition times. The process recipes include pressures. The process features comprise tools. The tools comprise tools made by two different vendors. The process features comprise consumables. The consumables compose photoresists or mask types. The choosing among the process features is based on the predictions. The characterizing is provided as a service in a network. The network comprises an intranet, an extranet, or an internet, and the characterizing is provided in response to user requests. An electronics design automation (EDA) tool in conjunction with the characterizing.

In general, in another aspect, the invention features a method comprising using a pattern-dependent model to predict variations in feature dimensions of an integrated circuit that is to be fabricated in accordance with a design by a process that includes a fabrication process that will impart topographical variation to the integrated circuit.

Implementations of the invention may include one or more of the following features. The fabrication process comprises electroplated copper deposition (ECD). The fabrication process comprises chemical mechanical polishing (CMP). The model predicts variations in feature dimension resulting from interaction between the fabrication process and a lithography or etch process. The predicting is, provided as a service in a network. The network comprises an intranet, an extranet, or an internet, and the predicting is provided in response to user requests. An electronics design automation (EDA) tool is used in conjunction with the predicting.

In general, in another aspect, the invention features a method comprising using a pattern-dependent model to predict feature dimension characteristics of a level of an integrated circuit that is to be fabricated in accordance with a design, and certifying that the predicted feature dimension characteristics meet specifications of the design.

Implementations of the invention may include one or more of the following features. A circuit component is added to the design after the feature dimension characteristics are predicted, and, after the component is added to the design, the predicted feature dimension characteristics are certified to meet the design specifications. The dimension comprises feature width. The predicting and certifying are provided as a service in a network. The network comprises an intranet, an extranet, or an internet, and the predicting and certifying are provided in response to user requests. An electronics design automation (EDA) tool is used in conjunction with the predicting and the certifying.

In general, in another aspect, the invention features a method comprising using a pattern-dependent model to predict characteristics of an integrated circuit that is to be fabricated in accordance with a design by a process that includes (a) a fabrication process that will impart topographical variation to the integrated circuit and (b) a lithography or etch process, and certifying that the predicted characteristics meet specifications of the design.

In general, in another aspect, the invention features a method comprising using a pattern-dependent model to predict characteristics of an integrated circuit that is to be fabricated in accordance with a design by a process that includes (a) a fabrication process that will impart topographical variation to the integrated circuit and (b) a subsequent lithography or etch process, and certifying that the predicted characteristics resulting from the process up to the lithography or etch process will meet specifications of the design.

In general, in another aspect, the invention features a method comprising applying a lithographic or etching process to a test wafer, deriving, from the processed test wafer, characterization information about variations of feature dimensions resulting from the lithographic or etching process, and using the characterization information in a pattern-dependent model of the lithographic or etching process.

In general, in another aspect, the invention features a method comprising using a pattern-dependent model to predict relative variations of feature dimensions of an integrated circuit that is to be fabricated in accordance with a design by processes that respectively include different lithographic or etching tools or consumables, and selecting one of the processes for use in fabricating the integrated circuit based on the relative predicted variations.

Implementations of the invention may include one or more of the following features. The predicting is provided as a service in a network. The network comprises an intranet, an extranet, or an internet, and the predicting is provided in response to user requests. An electronics design automation (EDA) tool is used in conjunction with the predicting. The lithography comprises deep ultra-violet (DUV), extremely short UV (EUV), or ion projection lithography (IPL). The feature dimensions are measured by scanning electron microscopy (SEM), scatterometry and scanning probe microscopy, line edge roughness (LER) tools, or three-dimensional measurement techniques.

In general, in another aspect, the invention features a method comprising using a pattern-dependent model to verify that chip-level features of a design of an integrated circuit can be manufactured within focus limitations of a lithographic tool.

Implementations of the invention may include one or more of the following features. The verifying is provided as a service in a network. The network comprises an intranet, an extranet, or an internet, and the verifying is provided in response to user requests. The using an electronics design automation (EDA) tool in conjunction with the verifying.

In general, in another aspect, the invention features a method comprising using a pattern-dependent model to predict whether a design of a level of an integrated circuit can be lithographically imaged in accordance with the design, and if not, adjusting the design or processing parameters so that it can be.

Implementations of the invention may include one or more of the following features. The adjusting includes selecting optimal tool settings of a lithography tool. The adjusting includes selecting optimal photoresist materials. The adjusting includes selecting optimal photoresist deposition recipes. The adjusting includes adjusting tool settings for a tool. The adjusting includes adjusting power settings. The adjusting includes adjusting etch times. The adjusting includes adjusting polish times. The adjusting includes adjusting deposition times. The adjusting includes adjusting pressures.

Other advantages and features of the invention will become apparent from the following description and from the claims.

BRIEF DESCRIPTION OF THE DRAWINGS

FIG. 2 describes the process for using IC designs and patterns to create lithography masks.

FIG. 6A illustrates film thickness variation that results from oxide chemical mechanical polishing (CMP).

FIG. 6B illustrates erosion, dishing and corner rounding effects associated with a CMP step used in a process of forming of shallow trench isolation (STI).

FIG. 6C illustrates copper dishing, dielectric erosion and residual copper effects associated with a copper CMP step used in damascene processes.

DETAILED DESCRIPTION

Figure 1:
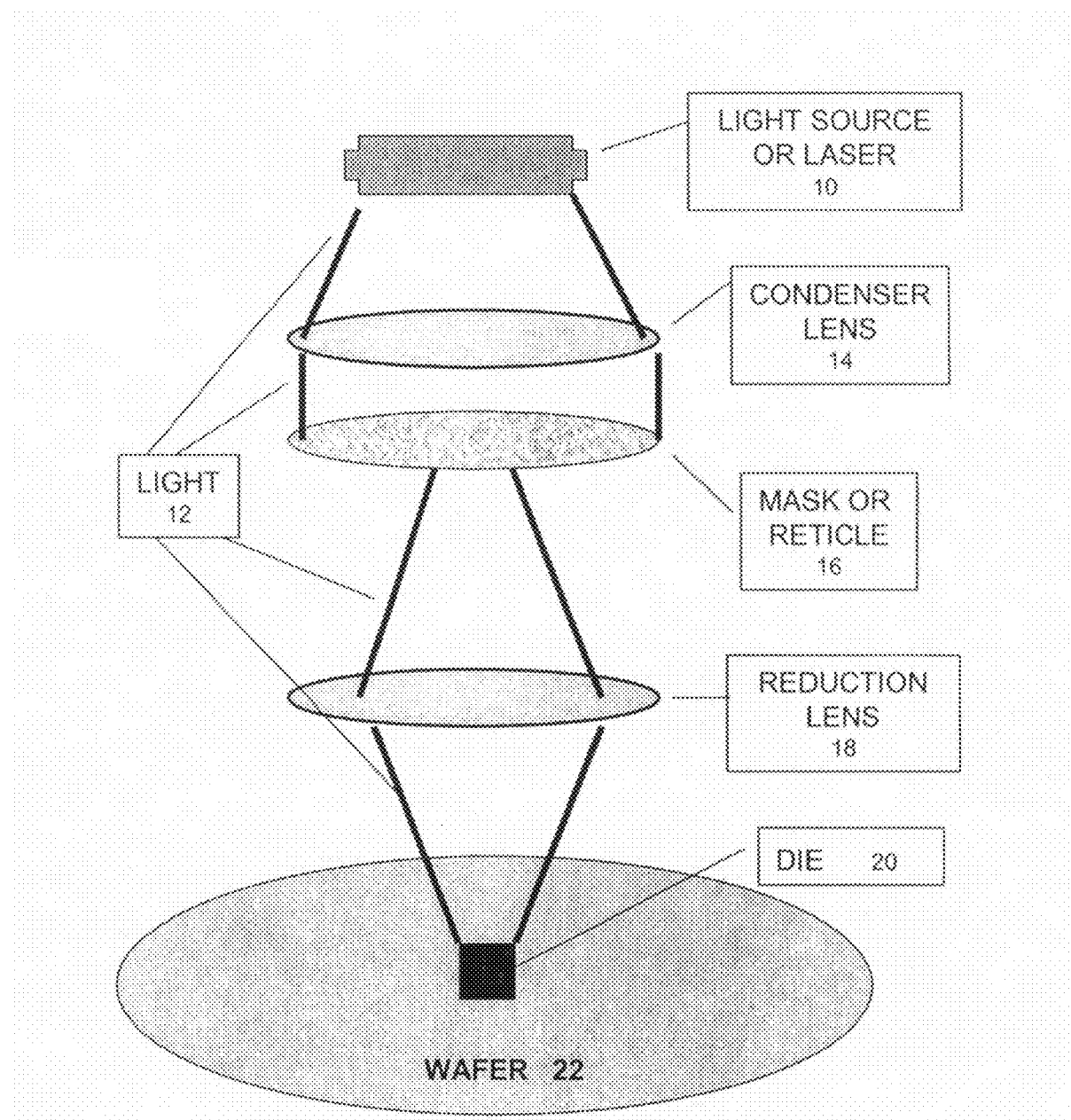
FIG. 1 illustrates how lithography works.

In what follows, we describe approaches that are useful to identify and correct, in advance of lithographic mask creation, areas of an integrated circuit (IC) that are likely to be problematic due to variations in film thickness, surface topography uniformity, and electrical impact that arise in the manufacture of an integrated circuit. The identifications or corrections may be based on predicted or modeled physical and electrical properties of a manufactured IC, arising from dependencies between predefined circuit layout patterns and the characteristics of the processes used in the manufacture of the integrated circuit.

These approaches are applicable to (a) high-density plasma (HDP) and chemical-mechanical polishing (CMP) processes used in the formation of shallow trench isolation (STI) structures; (b) lithographic, high-density plasma (HDP), electroplated copper deposition (ECD), and chemical mechanical polishing (CMP) processes used in the formation of single- and multi-level interconnect structures for integrated circuit (IC) devices; (c) processes and flows used to create oxide and low-k dielectric layers; (d) plasma-etch processes and the measurement of critical feature dimensions; (e) lithographic process flows that may include pre and post photo resist deposition and removal steps and a subsequent plasma etch step used to physically etch the patterned features into the wafer; (f) photoresist deposition and photoresist material selection, (g) any step or steps in damascene process flows; and (h) computation of corrections to mask dimensions to achieve desired critical IC dimensions.

In fabricating integrated circuits, the degree of interconnect film uniformity (in terms of both thickness and surface topography) is dependent on characteristics of circuit layout patterns (e.g. material density, line widths, line spaces, and other feature dimensions). Surface and thickness non-uniformities often lead to subsequent manufacturability and process integration issues. Pattern dependencies often cause processed films to have significant variation. The variation becomes worse as subsequent non-conformal layers are deposited and polished.

An integrated circuit (IC) typically includes multiple levels of materials that have been deposited, planarized, and selectively etched to reproduce circuitry defined by a computer generated design. Lithography is a frequently repeated process step during the manufacture of ICs in which a pattern that defines the dimensions of the circuitry is transferred to a silicon wafer. The patterns are subsequently used with the etch process to physically etch the features into the wafer surface or other thin films deposited on the wafer surface. The terms feature dimensions or feature size refer to dimensions of the geometries within the circuit. Examples include: the width of a line, the spacing between structures (e.g. the spacing between two lines in an array of lines or a buffer distance between working circuitry and dummy fill structures), the critical dimension (CD) of a circuit (i.e. the smallest dimension of any geometry in the circuit), widths of arrays of lines or other repeating structures, as well as the metrics (e.g. minimum, maximum, and average) on individual geometries or on groups of geometries (e.g. an array of lines). Feature dimensions may also include vertical and other dimensions, including sidewall angle, feature height (e.g. trench depth). Lithography equipment includes mechanisms (e.g. steppers) used to project images of patterns onto wafers and pattern transfer tools (e.g., masks and reticles) used to transfer circuitry patterns onto wafers coated with a photosensitive film. Etch: equipment includes mechanisms to selectively remove materials (e.g. oxide) from a wafer surface or thin films on the wafer surface patterned with lithography equipment.

A basic projection lithography process is illustrated in FIG. 1. A light source (e.g., a lamp or laser) 10 is used to project light 12 through a condenser lens 14, which directs light through a mask or reticle 16 that contains a pattern that represents the printed circuit features. The light 12 then passes through a reduction lens, which focuses the image onto a wafer 22. The minimum feature size that can be imaged can be defined using the Rayleigh equations as:

$$M_{fs} = k_1 \frac{\lambda}{NA}$$

where $\lambda$ is the exposing wavelength and NA is the numerical aperture of the optics. The parameter $k_1$, normally between 0.65 and 0.4 for deep ultraviolet (DUV) imaging systems, is a process and system dependent variable that includes effects such as resist, process improvements, light source, and reticle characteristics.

FIG. 2 describes the process of how a lithography mask may be created from an IC design. A computer-aided-design (CAD) system 36 is used to translate a functional circuit design to an electronic layout design file that represents a physical device, layer-by-layer. The result is a design layout that describes each level of the device from the lowest level, for example a transistor level, up to higher levels, for example interconnect layers that transmit signals among transistors and supply power to the components on the chip. The electronic design files are used during so called tape-out to generate specifications for making a mask 37. The masks are then manufactured 38 and used with the lithography tool to transfer circuit features to a wafer 39.

Many projection systems use step-and-repeat mechanisms that expose only a sub-area of the wafer or a die, also referred to as the optical field, and then repeat the process until the entire wafer is imaged. The stepper may be controlled to accommodate wafer-level variation that occurs across the wafer as a result of, for example, warp or bow. This is normally used to accommodate variability that occurs from die to die, but not variability that occurs within each die. To ensure that the printed circuit is within a depth-of-focus associated with the optics, the stepper may adjust the focal length of the optics based on measurements of test keys or alignment marks, which are formed on a surface of the wafer, to accommodate variation in the thickness of the photosensitive film or photoresist. Underlying film thickness variation in materials below the photoresist often causes the variation.

Figure 3:
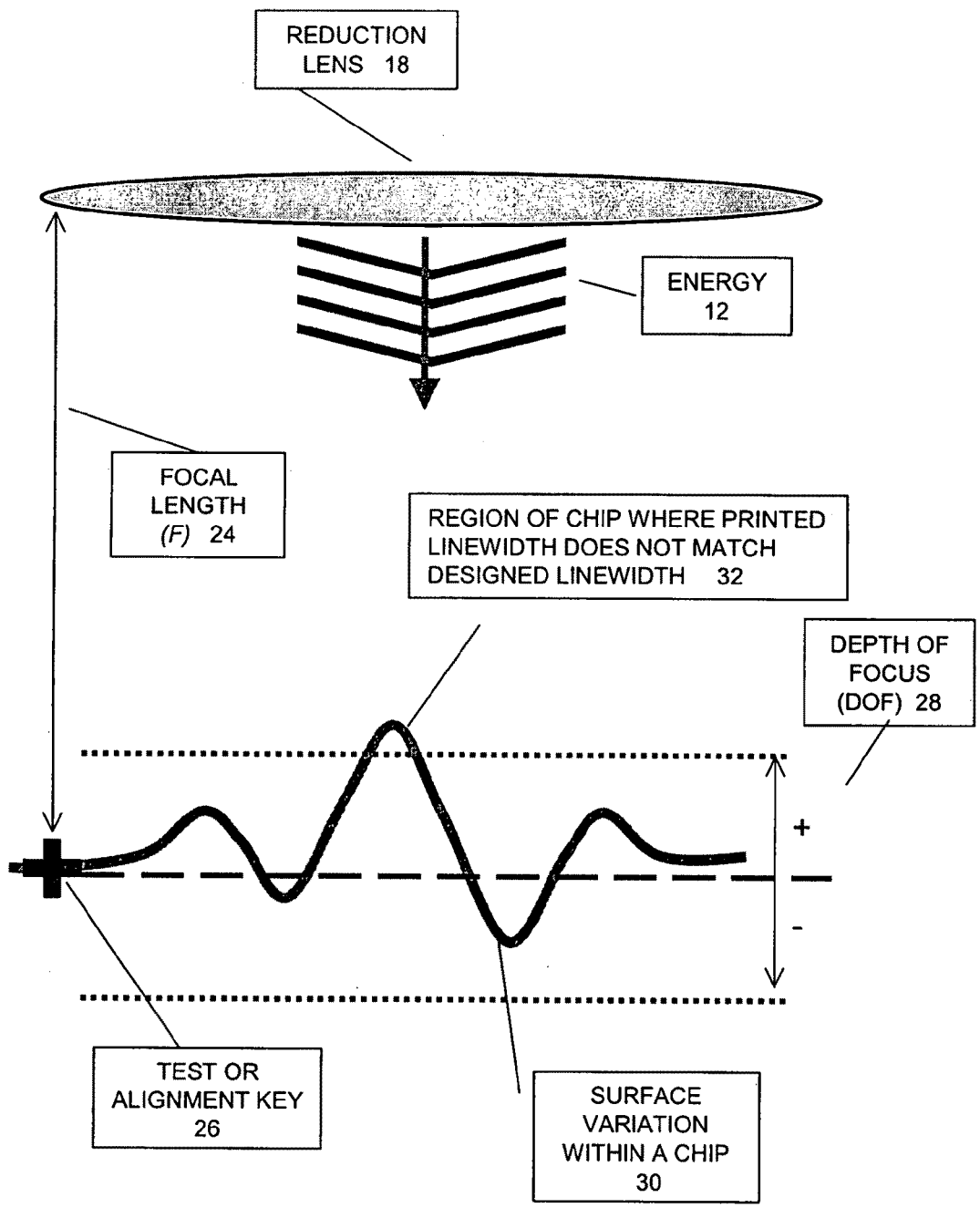
FIG. 3 illustrates a case in which the focal distance to an alignment key is proper; but chip-level variation is outside the depth of focus limits.

FIG. 3 illustrates that while the stepper can account for die-to-die variation, it may not adequately address within die variation caused by IC pattern dependencies. The reduction lens 18 of FIG. 1 is shown above the die surface 30 in FIG. 3. The projection system adjusts so that the focal length 24 matches the measured distance to a test key or alignment mark 26. The depth of focus 28 determines what features along the optical axis can be reproduced with the desired resolution $M_{fs}$. Using the Rayleigh equations, depth of focus $D_f$ 28 can be expressed as:

$$D_f = \pm k_2 \frac{\lambda}{(NA)^2}$$

where $\lambda$ is the exposing wavelength and NA is the numerical aperture of the optics. The parameter $k_2$ (normally around one for deep ultraviolet or DUV imaging systems) is a scaling factor based upon process related characteristics. During deposition of copper material via ECD or through the CMP of oxide or copper, for example, process related pattern dependencies often cause within die variation 30 across the chip. If the chip-level variation exceeds the depth of focus, then the printed features 32 may not accurately represent the critical dimensions of the IC design as patterned on the mask and the errors as imaged on the wafer, may negatively impact the performance of the device. As explained below, it is possible to adapt the mask design so that the printed IC dimensions better match the designed dimensions.

The next few paragraphs describe the cause and result of process related IC pattern dependencies.

The lithography process is repeated throughout the manufacture of a semiconductor device as each subsequent layer is created. One area where the techniques described here may be particularly helpful is during a damascene process in which metal lines, that connect device components (called interconnect), are created. Multiple layers of connections are used to transmit signals and power among device components.

Figure 4:
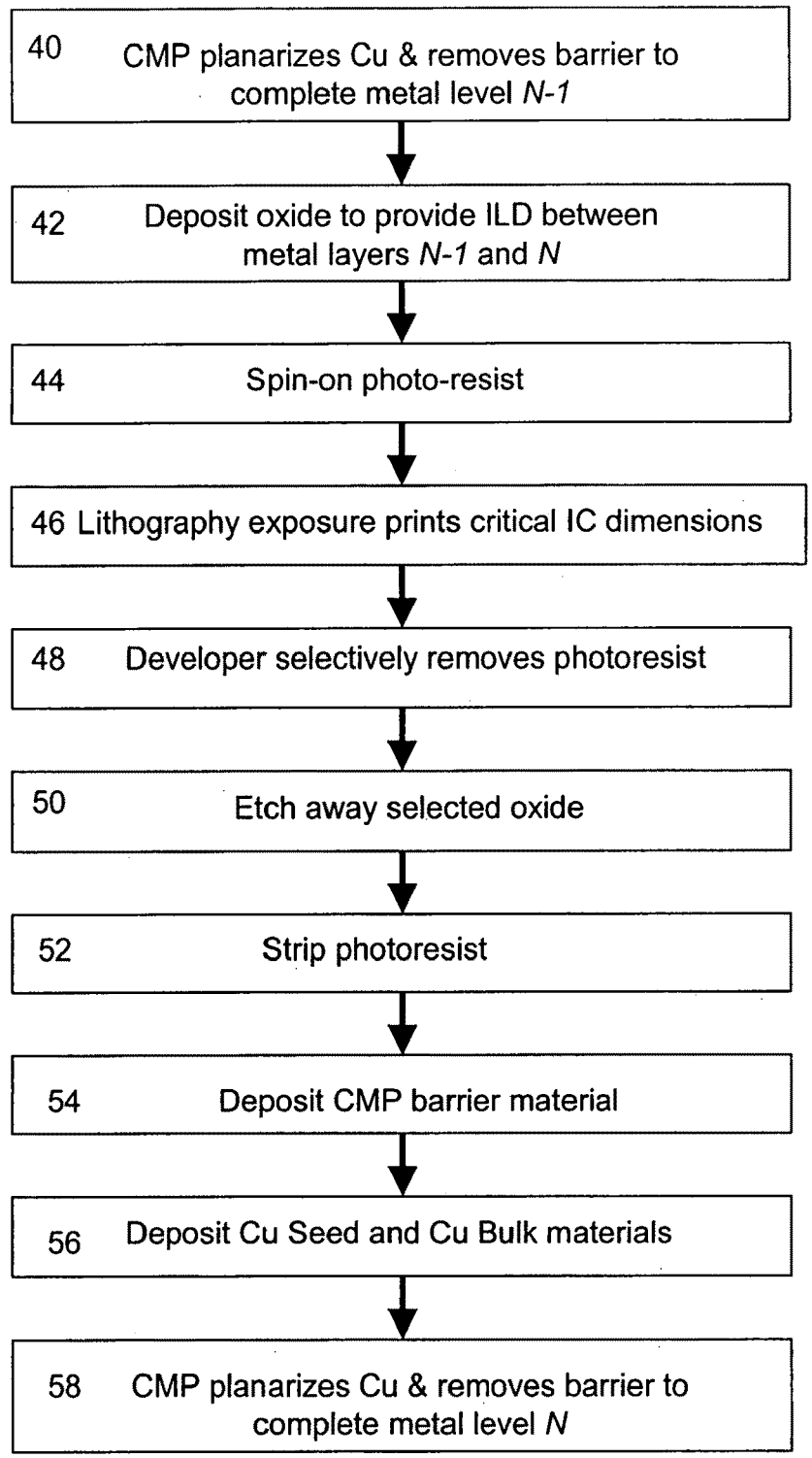
FIG. 4 shows where lithography fits within a damascene process.

The damascene process flow for a given interconnect layer is described in FIG. 4. The flow begins with a post-CMP planarized surface 40 of the prior interconnect level (level N−1). A dielectric material (e.g. oxide or low-k material) is deposited 42 to electrically isolate the previous and current interconnect layers N−1 and N. (The dielectric forms what is called an inter-level dielectric or ILD layer. Although pattern dependencies due to underlying features may require a CMP planarization step on the ILD, that step is optional and is not shown in this flow example.) A photosensitive film (e.g. photoresist) is deposited on the ILD wafer surface 44. A lithography system images the wafer 46 to define circuit features for the current interconnect layer using a process similar to that illustrated in FIG. 1. A developer is used to selectively remove photoresist 48. Plasma etch is used to remove selective oxide areas 50 and the remaining photoresist is subsequently removed 52. A barrier material is then deposited 54 and subsequently ECD is used to deposit metal, for example copper 56. CMP is used to polish away selective copper areas and remove the barrier material 58. This completes the formation of metal interconnects for level N. Often pattern-related non-uniformity is transferred from underlying levels to overlying interconnect levels resulting in variations in the ILD and photoresist thickness that is imaged during lithography.

Figure 5:
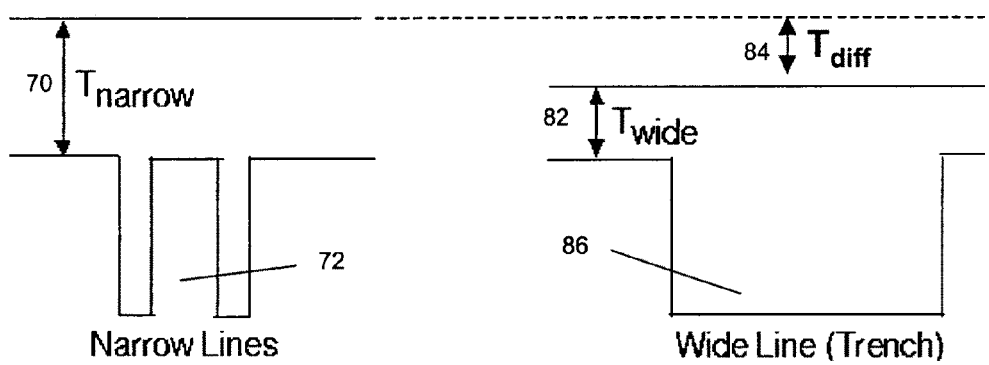
FIG. 5 illustrates pattern dependencies for electroplated copper deposition (ECD).

As described in FIG. 5, electroplated copper deposition (ECD) is a process step in a copper damascene flow that is used to deposit copper material within the interconnect structures. The goal is to completely fill an etched trench region in a void-free manner while minimizing a variation in the deposited copper thickness and minimizing a variation in surface topography. There exist pattern-dependencies in ECD that result in plated surface variation. FIG. 5 shows, for example, the difference in post-plated thickness $T_{diff\ 84}$ commonly observed between the deposited copper thickness $T_{narrow}$ 70 that occurs over narrow line widths 72 and the deposited copper thickness $T_{wide}$ 82 that occurs over a wide line width or trench 86.

Film thickness variation in chemical mechanical polishing (CMP) processes can be separated into various components: lot-to-lot, wafer-to-wafer, wafer-level, and die-level. Often, the most significant component is the pattern dependent die-level component. Die-level film thickness variation is often due to differences in layout patterns on the chip. For example, in the CMP process, differences in the underlying metal pattern result in large long-range variation in the post CMP film thickness, even though a locally planar surface topography is achieved. This variation occurs in copper, oxide, and shallow trench isolation (STI) CMP and is described in following figures.

For oxide polishing, the major source of variation is caused by within-die pattern density variation 102, shown as two groups of metal lines in FIG. 6A. The metal lines 106 on the left side of FIG. 6A have a lower density in the direction of the plane of the integrated circuit than do the metal lines 108 on the right side of the figure. Pattern density, in this case, is defined as the ratio of raised oxide area 110 divided by the total area of the region. The region may be taken as a square with the length of the sides equal to some length, for example, the planarization length. The planarization length is usually determined by process factors such as the type of polishing pad, CMP tool, slurry chemistry, etc.

Figure 7A:
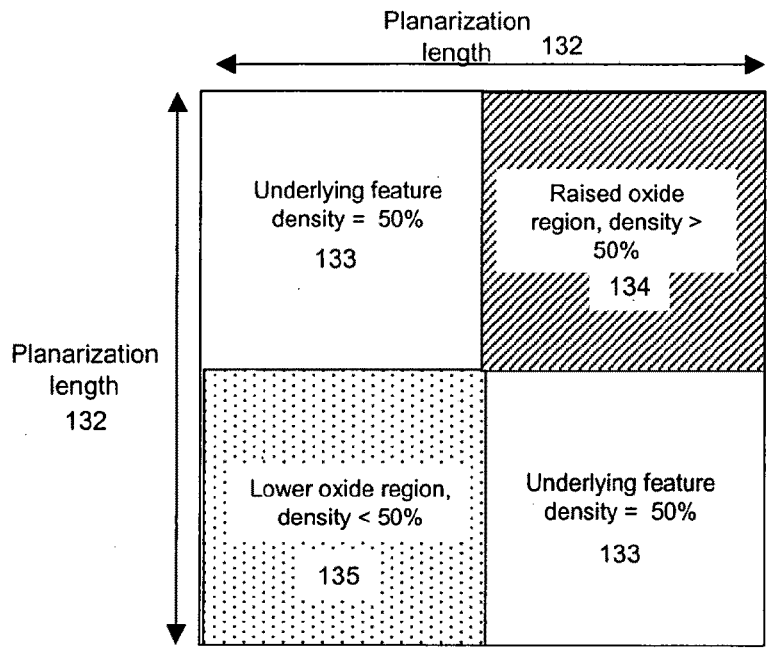
FIG. 7A illustrates a top-down view of different density features within a square region.
Figure 7B:
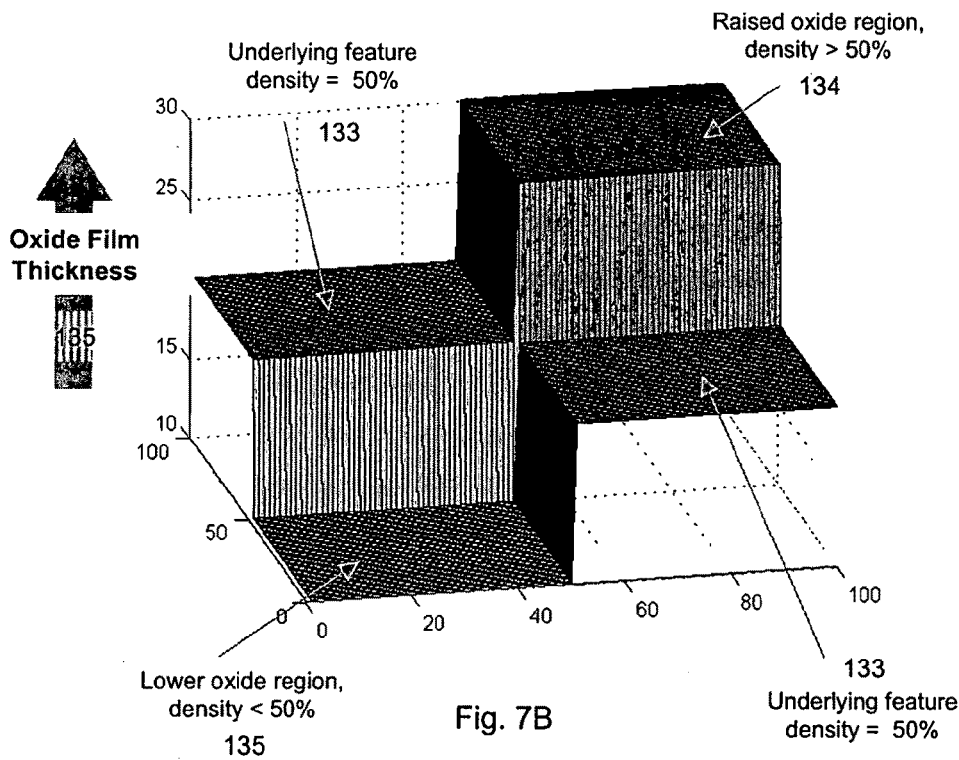
FIG. 7B illustrates the variation in oxide thickness for features within a region.

FIG. 7A illustrates an example of how the underlying feature density affects the film thickness variation. FIG. 7B plots the film thickness variation corresponding to each density type. For a given square area defined by planarization length 132, the higher underlying feature density leads to larger film thickness variation 134. The lower underlying feature density leads to a reduced film thickness 135. Designers often try to maintain density tightly around 50% 133 to promote planarity. The effective pattern density may be computed for each location on the die by filtering the designed layout densities, often by using various two-dimensional filters of densities around the given location. FIG. 6A illustrates how the underlying features 106 and 108 cause variation in local surface topography (step-height) 104 and global non-planarity 102.

In creating shallow trench isolation (STI) structures (examples are shown in FIG. 6B), $SiO_2$ 112 is deposited in a trench etched in silicon 111 and planarized using CMP to electrically isolate devices. As with oxide inter-level dielectric (ILD) polishing, the underlying pattern of isolated trenches results in unwanted variation in the deposited $SiO_2$. Problematic areas often are created as a result of CMP such as nitride erosion 114 (where the nitride barrier is removed and possibly exposes the underlying Si to contaminants and damage), corner rounding 116 and oxide dishing 118. The corner rounding has the effect of potentially widening the trench and where the exposure of Si 110 destroys the device. The oxide dishing results in topography variation that impacts subsequent lithography. In STI polishing, pattern density is an important feature with regard to topographical variation and other CMP effects.

FIG. 6C illustrates the effects of polishing metal features (e.g., copper lines 122 and 126) entrenched in a dielectric (e.g., $SiO_2$) 120, during a damascene CMP process. For metal polishing, computation of pattern density is important to characterizing full-chip pattern dependencies; however determining other physical layout effects, such as the line width and line space, may also be required. Two unwanted effects known as dishing and erosion result from metal damascene CMP. Dishing 124 is measured as the difference in metal thickness at the edge of a line and its center. Erosion 128 is defined as the difference in oxide thickness above a metal line, typically within an array of lines, to the oxide thickness in an adjacent unpatterned region. Another unwanted effect is residual copper 130 that is has not been removed from dielectric field (or up areas) of the chip and remains on the wafer after polishing is complete. It is common for process engineers to set polish times such that all residual copper is removed. For those patterned areas where copper is cleared first, dishing and erosion continue to occur, thereby increasing the non-uniformity of the wafer surface. Each of the described CMP processes contribute to surface level non-uniformity and thus may negatively impact lithography. While the techniques described here are applicable to any process related pattern dependencies, ECD and CMP are two processes that cause specific concern regarding non-uniformity. Although these processes will be used to illustrate the methods, the methods are applicable to pattern dependencies related to any process.

Figure 8:
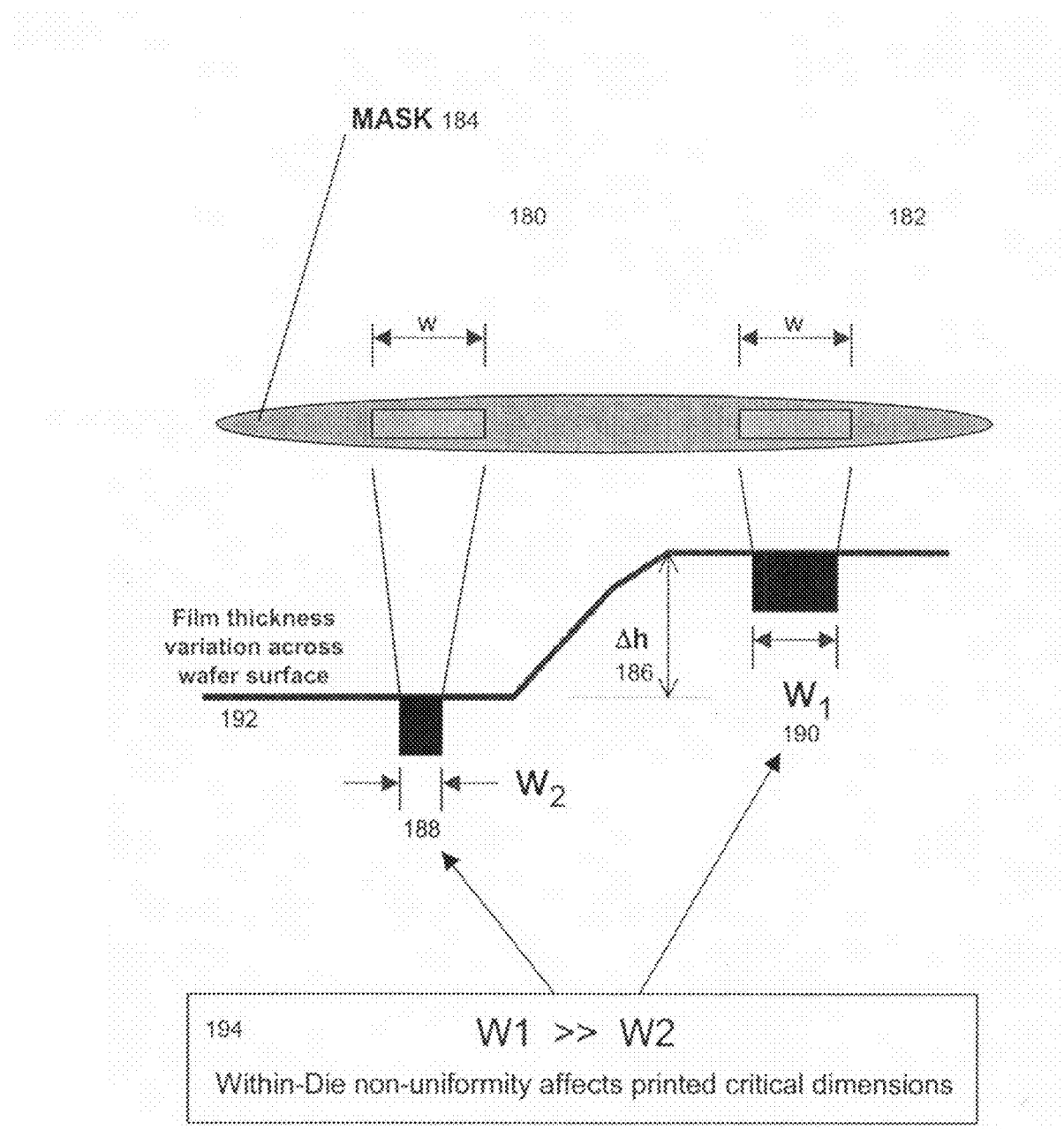
FIG. 8 illustrates how surface topography may affect printed feature dimensions.

The impact of process related pattern dependency on lithography is illustrated in FIG. 8. For the sake of clarity, the mask 184 and wafer 192 are shown and the related optics are not shown. As a matter of terminology used throughout, feature width (FW) is taken to be the smallest dimension of any given object. This term encompasses various types of layout objects, such as lines, rectangles, polygons, etc. Also, the critical dimension (CD) is understood to be the smallest dimension of any feature on the layout, i.e. the smallest FW.

A mask 184 is shown with two features with the same feature width, (w), 180 and 182 to be printed onto a wafer surface 192. When lithography is performed, the within-die non-uniformity 192 due to process-related pattern dependencies (as illustrated in FIGS. 5, 6, and 7) may result in a film thickness difference ($\Delta h$) 186 across the chip between the two printed line widths $w_2$ 188 and $w_1$ 190. In this case 194, the printed line width $w_1$ 190 is much larger than $w_2$ 188. Although both line widths 180 and 182 have been designed and created on the mask with the same dimensions, surface level non-uniformity may result in significantly different dimensions in the printed features 188 and 190, which subsequently affects the performance of the manufactured IC.

Figure 9:
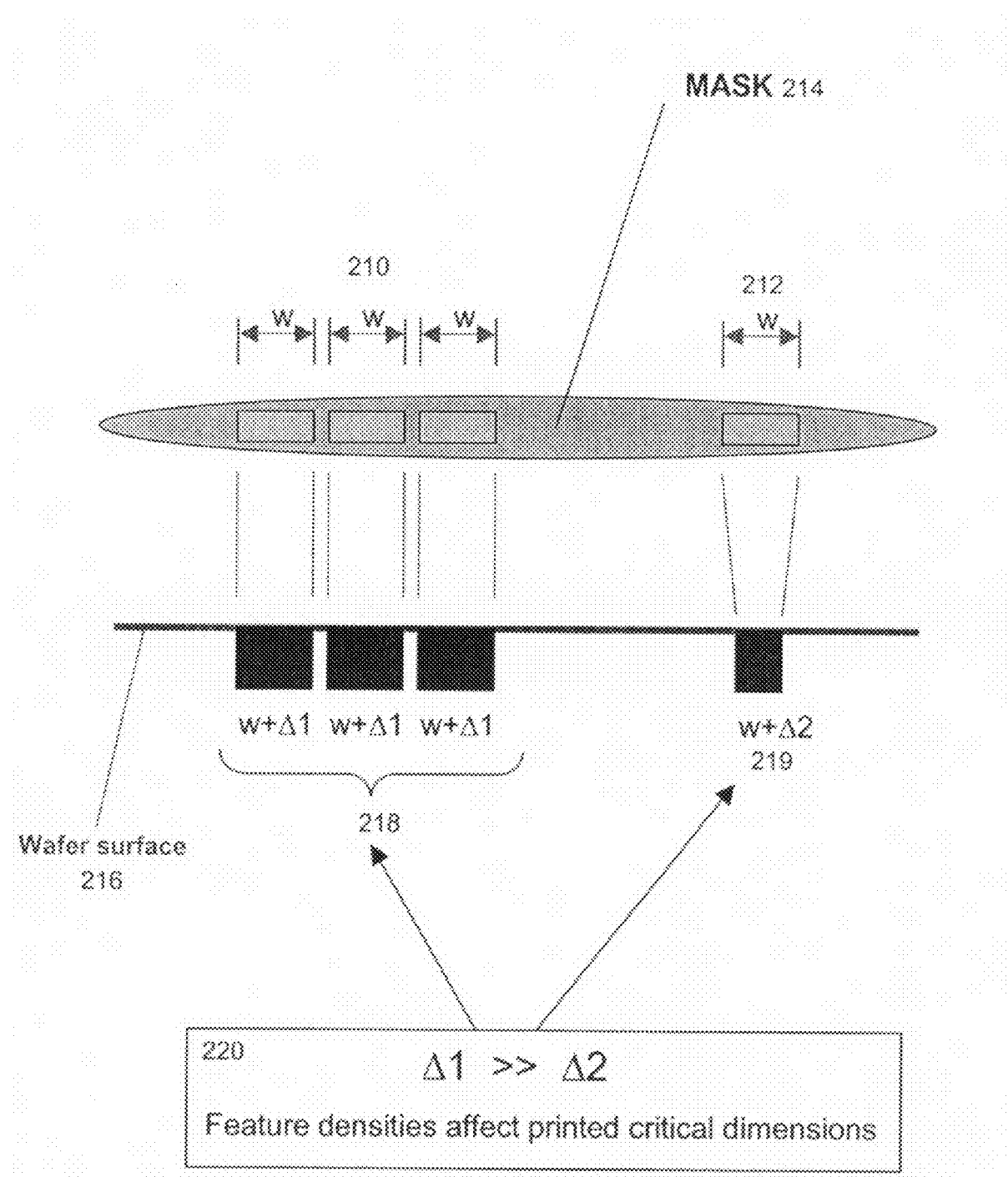
FIG. 9 illustrates how feature density may affect printed feature dimensions.

Process related pattern-dependencies may also occur within the lithography process itself where the density of features often affect how well the printed features reproduce those designed. In FIG. 9, a mask 214 is shown with two sets of features: one with higher density 210 and one with lower density 212. As features on the chip are placed closer to each other (i.e. feature density increases), the diffraction patterns associated with them change often resulting in a feature dimension that varies from that designed, Even with a perfectly planar wafer surface across the chip 216, the printed feature dimensions (e.g. line widths) (w+$\Delta 1$) 218 and (w+$\Delta 2$) 219 may vary 220 from the dimensions designed and patterned on the mask.

Topographical variation may occur over all components within a chip and thus a full-chip characterization or prediction may be useful. In some cases, it is useful to focus on critical components or circuit areas call sub-networks or sub-nets. Within this context, full-chip prediction is meant to include any focus on topographical variation within a critical sub-net.

IC pattern dependent relationships can be used to verify whether feature dimensions produced by lithography match the dimensions as they were designed, and, if not, to modify the design layout and masks to yield the designed features. Lithography models may be combined with etch models to predict the physical feature dimensions created within the wafer. Electrical extraction and simulator components may also be used to assess the electrical impact of variations in features (e.g. width, height, depth, sidewall angle) across the chip and fine-tune the specified tolerances for the chip.

Figure 10A:
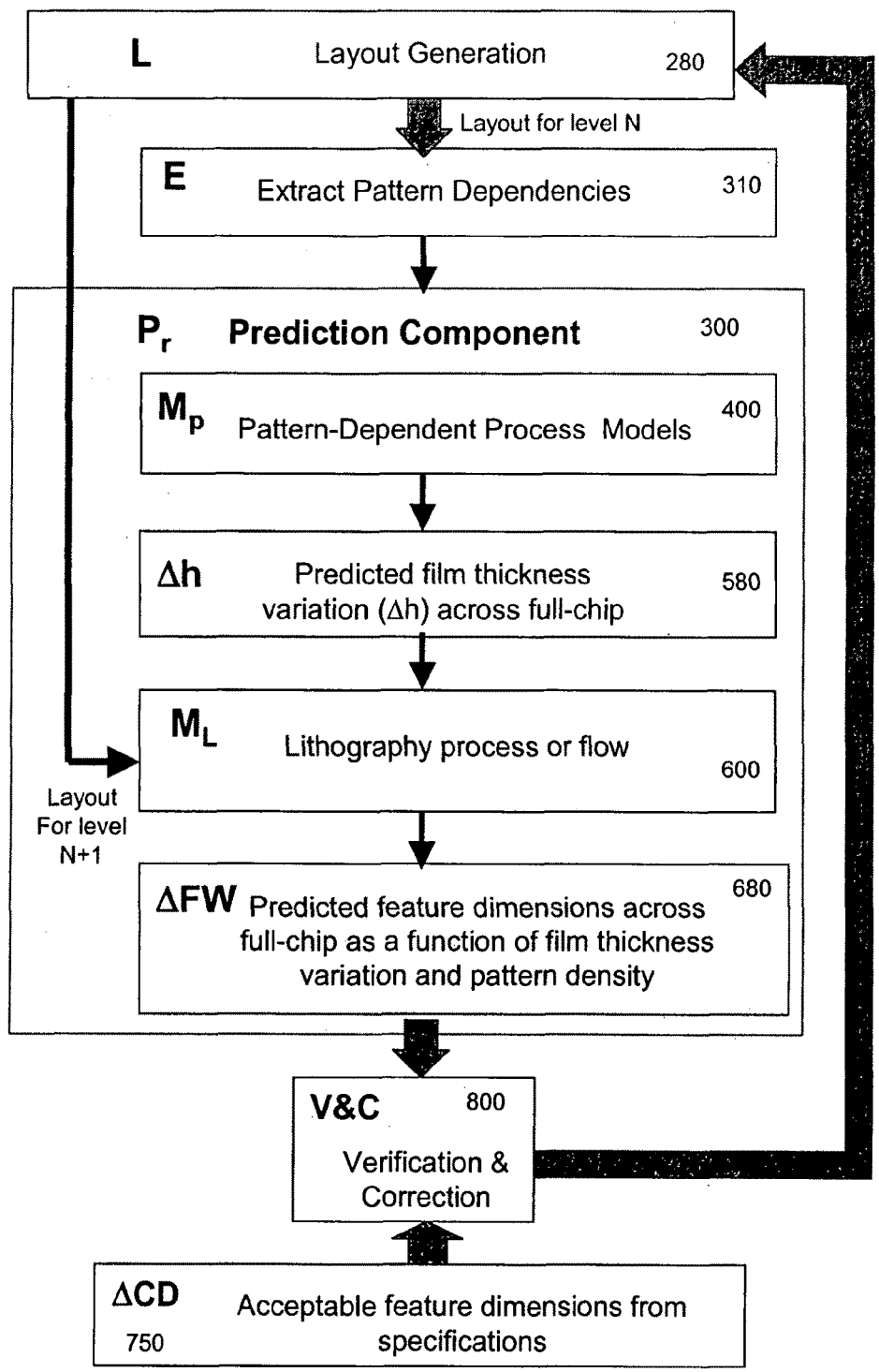
FIG. 10A provides a high-level flow diagram of a method.

The following paragraphs describe an embodiment of the method, which is depicted in FIG. 10A. Sub-blocks (310, 400, 600 and 800) within FIG. 10A will be described in greater detail below.

An IC design is commonly represented electronically, e.g., in a Graphical Data Stream (GDS) format, in a library of files that define structures and their locations at each level of an integrated circuit 280. These files are typically large, although the features that are relevant to process variation may be described more efficiently. A process of layout extraction 310 involves summarizing discrete grids (sub-portions) of IC designs in a compact set of parameters such as feature width, feature space, and density for each grid. Layout extraction is not required but may be helpful where computation resources are constrained. A description of how to perform layout extraction is described in section a below.

In the prediction component ($P_r$) 300, the layout features 280 of the design are mapped 310 to parameters of wafer topography ($\Delta h$) 580 such as film thickness, dishing, erosion, and total copper loss. This information may be used by a process model (e.g., a CMP model) or a set of process models $M_p$ (e.g., ECD and a multi-step CMP process or a more complex process flow) 400 to predict or simulate the manufacturing results and corresponding variation that will occur when the design represented by the layout features is manufactured on the modeled process. The variation of the resulting fabricated device can be measured physically, such as by optical measurement of the film thickness or surface profiling of the wafer surface to determine actual topography (e.g. dishing or step height and erosion or array height). The chip-level surface topography and associated electrical parameters 580, relevant for comparison to the desired specifications 750, are computed for the full-chip, both within die and for multiple dies across the wafer.

The predicted chip-level topography 580 is input into a lithography modeling $M_L$ step 600 that maps the variation in wafer surface height 580 to the variation in printed feature dimensions 680 for the particular lithography tool. This mapping may use the tool specifications and equations for minimum feature size ($M_{fs}$) and depth of focus ($D_f$) to compute the feature dimension variation with respect to surface topography (as shown in FIG. 8) and an optical proximity correction tool (e.g., existing commercial versions) to compute the feature dimension variation with regard to feature density (as shown in FIG. 9). Another approach is to utilize test wafers and a calibration process described in FIGS. 36A and 36B and section f to capture pattern dependencies with regard to surface topography and feature density. The result of these approaches is the predicted variation in feature dimensions and line widths across the full-chip 680 for one or multiple dies across a wafer that has been processed using lithography process or flow 680.

One option is to use models in which the lithography process flow 600 is defined to include not only the lithography process step but may also include pre and post photoresist deposition and subsequent plasma etch. This may be useful if the actual physical feature dimensions are desired, as an alternative to the patterned feature dimensions that lithography models alone provide. It is recommended to use a pattern dependent etch model that provides additional feature dimensions such as sidewall angle and trench profiles. This step concludes the prediction component P,. 300.

The predicted feature dimension variation 680 and the desired feature dimension specification and tolerances 750 are input into a verification and correction component 800 which identifies any features that will exceed or approach the tolerances. This component also may be used to correct the dimensions of the identified features within the design layout and in subsequent mask creation so as to achieve the designed (or desired) feature dimensions across the chip. Once these modifications are made to the IC design, dummy fill may be reinserted or adjusted and a new layout generated.

Dummy fill is a method of improving film thickness uniformity in integrated circuits through the addition of the structures or the removal of existing structures. Adding metal dummy fill increases the pattern density since density is defined as the amount of metal divided by the total area within a given region. Conversely, adding oxide dummy (also called slotting) removes sections of the copper line and decreases the pattern density. The addition of fill can also alter other parameters such as line width and line space. If dummy metal is inserted between two parallel lines, the line space changes for both of those lines. Similarly, if oxide dummy is inserted within a wire, its effective line width is changed. By modifying the existing layout through the addition of dummy fill, physical parameters such as pattern density, line width, and line space are changed.

The new layout is then input into the prediction component to ensure that the new design meets not only the lithography related feature dimension requirements but also the design and electrical rules and specifications as well. This will likely be an iterative process until the criteria are met across all concerns.

Figure 10B:
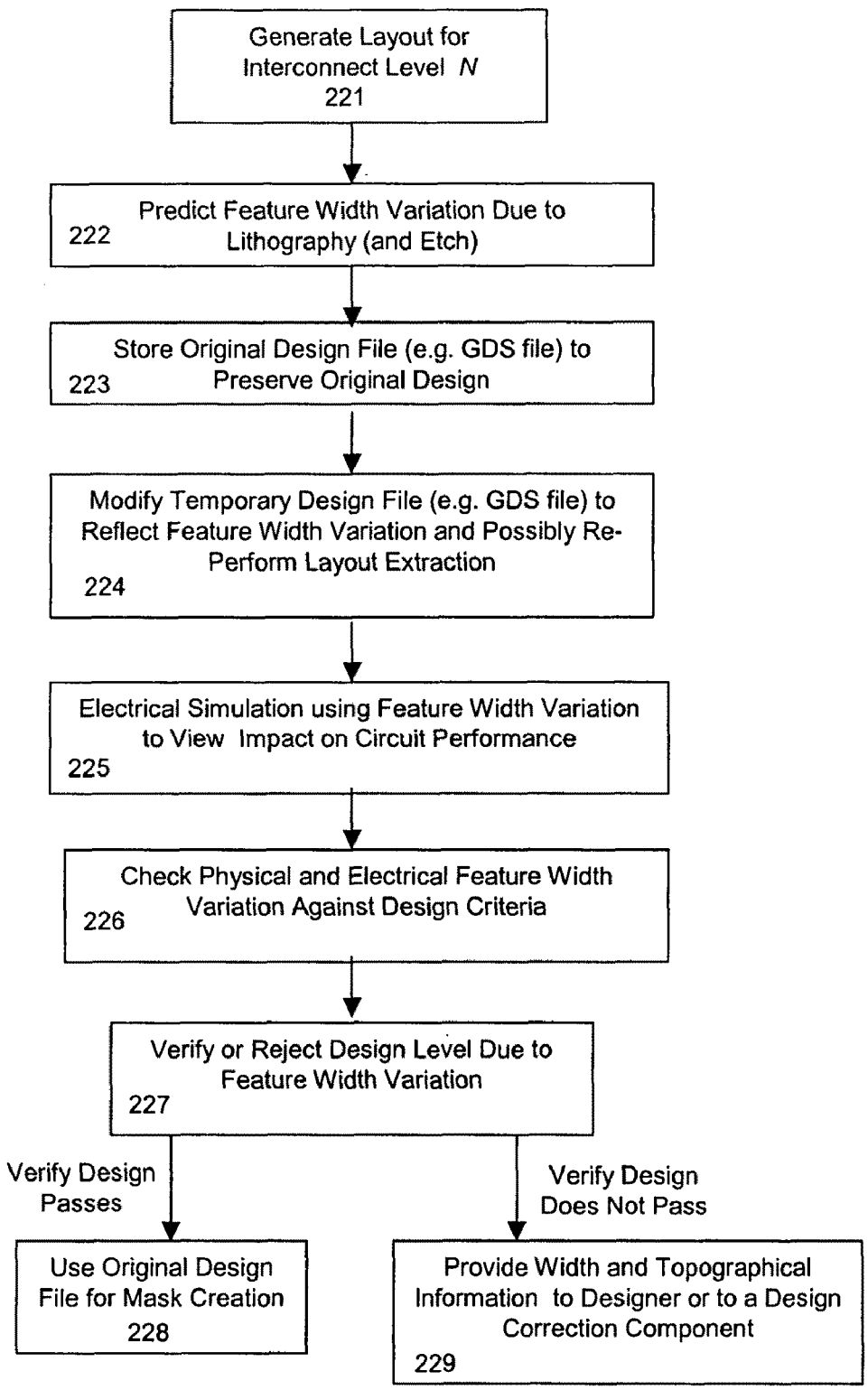
FIG. 10B provides a high-level flow diagram of a method for design verification
Figure 10C:
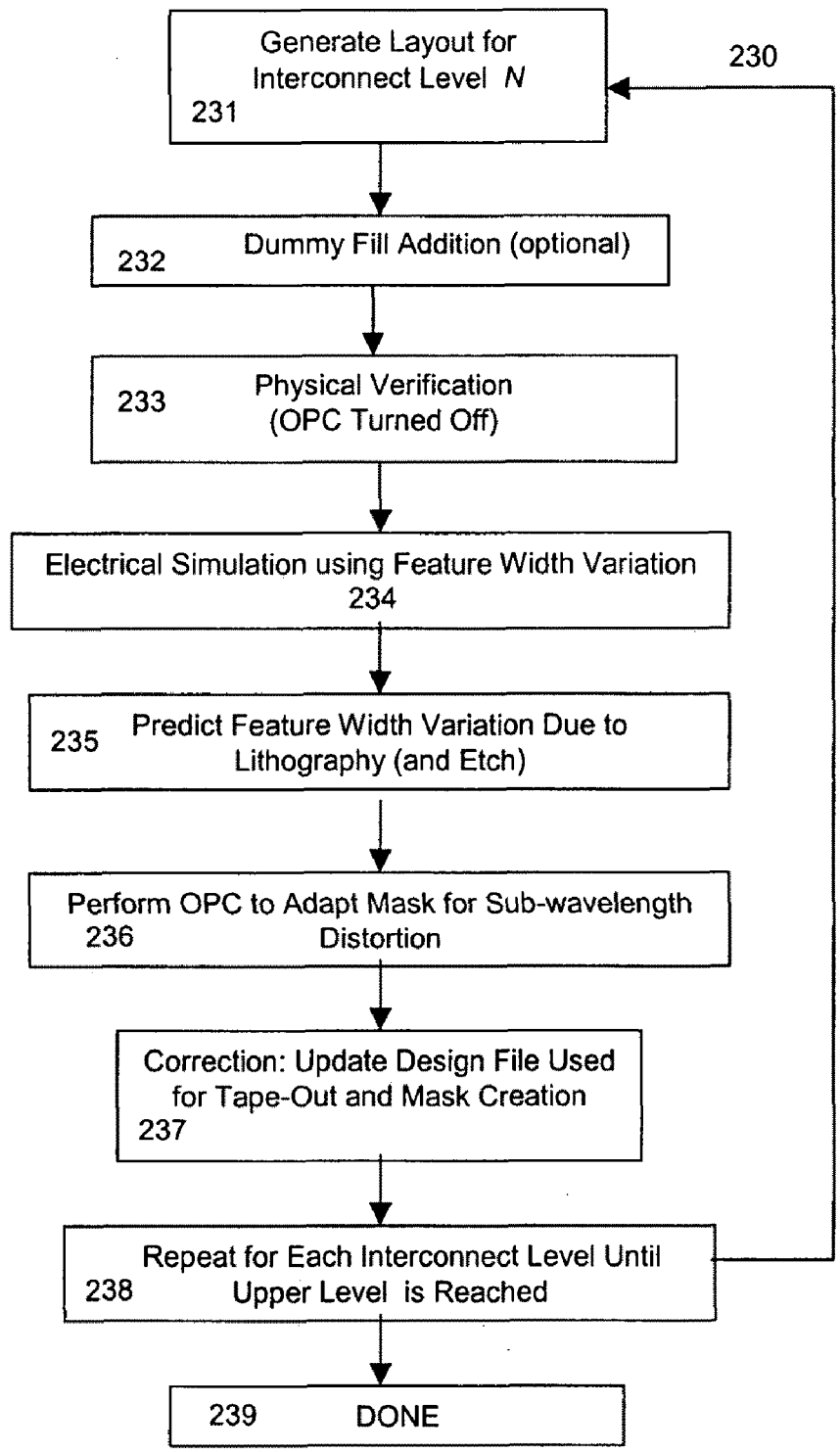
FIG. 10C provides a high-level flow diagram of a method for mask correction

FIG. 10A describes the basic flow for design verification and for mask correction. FIGS. 10B and 10C provide more detailed flows for design verification and mask correction, respectively. The motivation behind design verification is to predict feature width and topographical variations and to use electrical simulations to verify that a given design meets the desired criteria. As such, it is important to modify the design file to reflect the feature dimensions that will result for each interconnect level. As shown in FIG. 10B, the first step is to generate the layout for an interconnect level (e.g. level N). The full-chip design, a critical sub-portion of the circuit design or an extraction from the layout is used to predict feature width variation 222 due to the lithography (and optionally, plasma etch as well) process. This is similar to the prediction component 300 shown in FIG. 10A. The original design file is stored 223 for future use because if the design passes verification, the original design will be used to create the masks. A temporary design file is modified 224 to reflect the feature width variation that will result from the lithography (and optionally, the plasma etch) process. The electrical impact of feature width variation can be evaluated 225 by performing full-chip or critical circuit network simulation using resistance capacitance. (RC) extraction and other electrical simulation tools. This allows for examination of issues, related to interconnect feature width variation such as coupling capacitance, noise and timing. The physical characteristics (e.g. total copper loss, dishing and erosion) and electrical characteristics (e.g. sheet rho variation, timing closure, signal integrity, power grid and overall performance) are checked 226 against specifications for the device. The verification step weighs the results and either passes or rejects this design level. If the design passes, the original design file is used for mask creation 228. If the design is rejected or fails to pass, both the feature width and topographical variation results are provided to the designer or may be input into a design or mask correction component 229, such as the mask correction approach described here. Approaches for both design verification and mask correction components are described in Section e.

Figure 54:
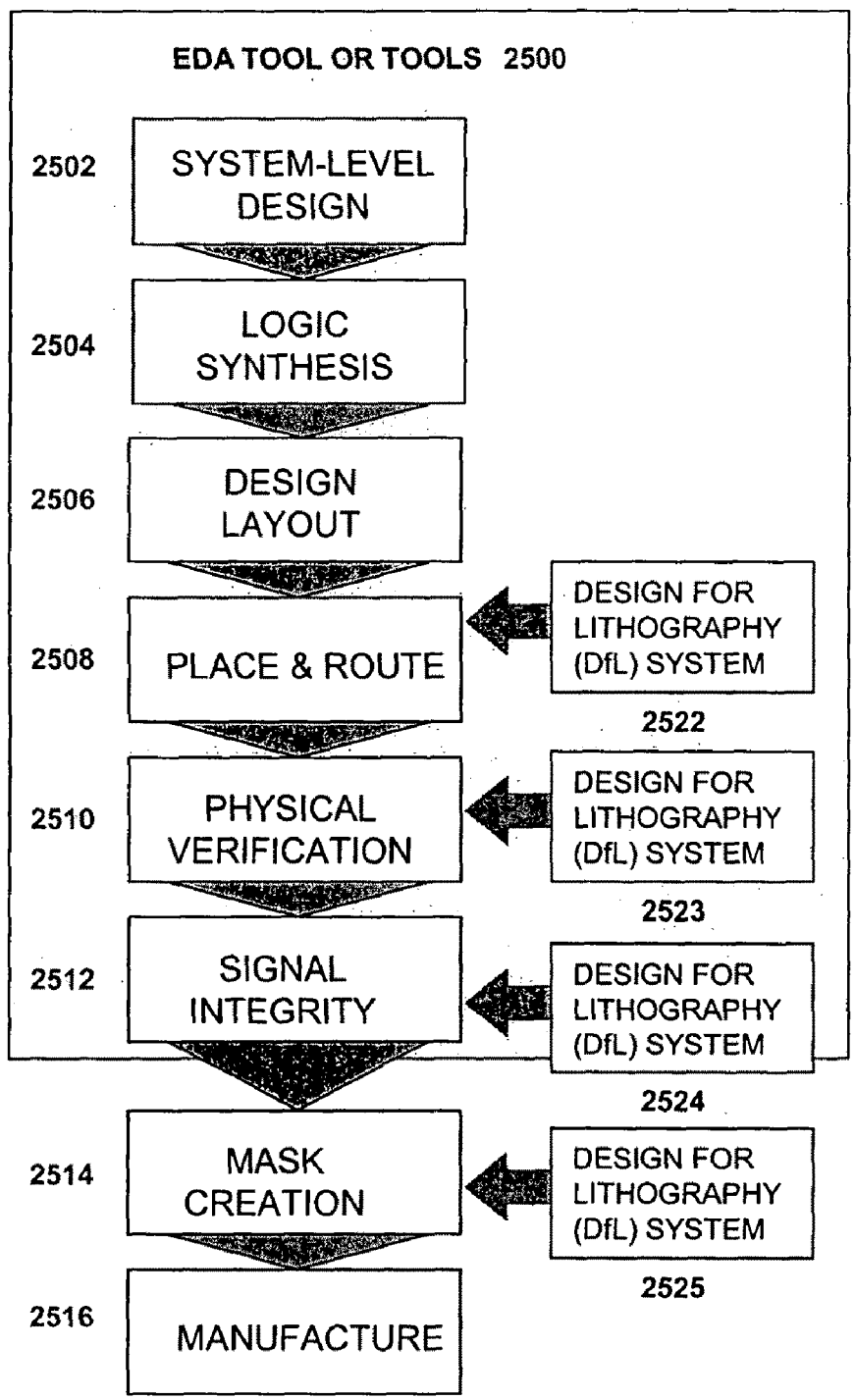
FIG. 54 illustrates an implementation of a method within an electronic design automation (EDA tool).
Figure 55:
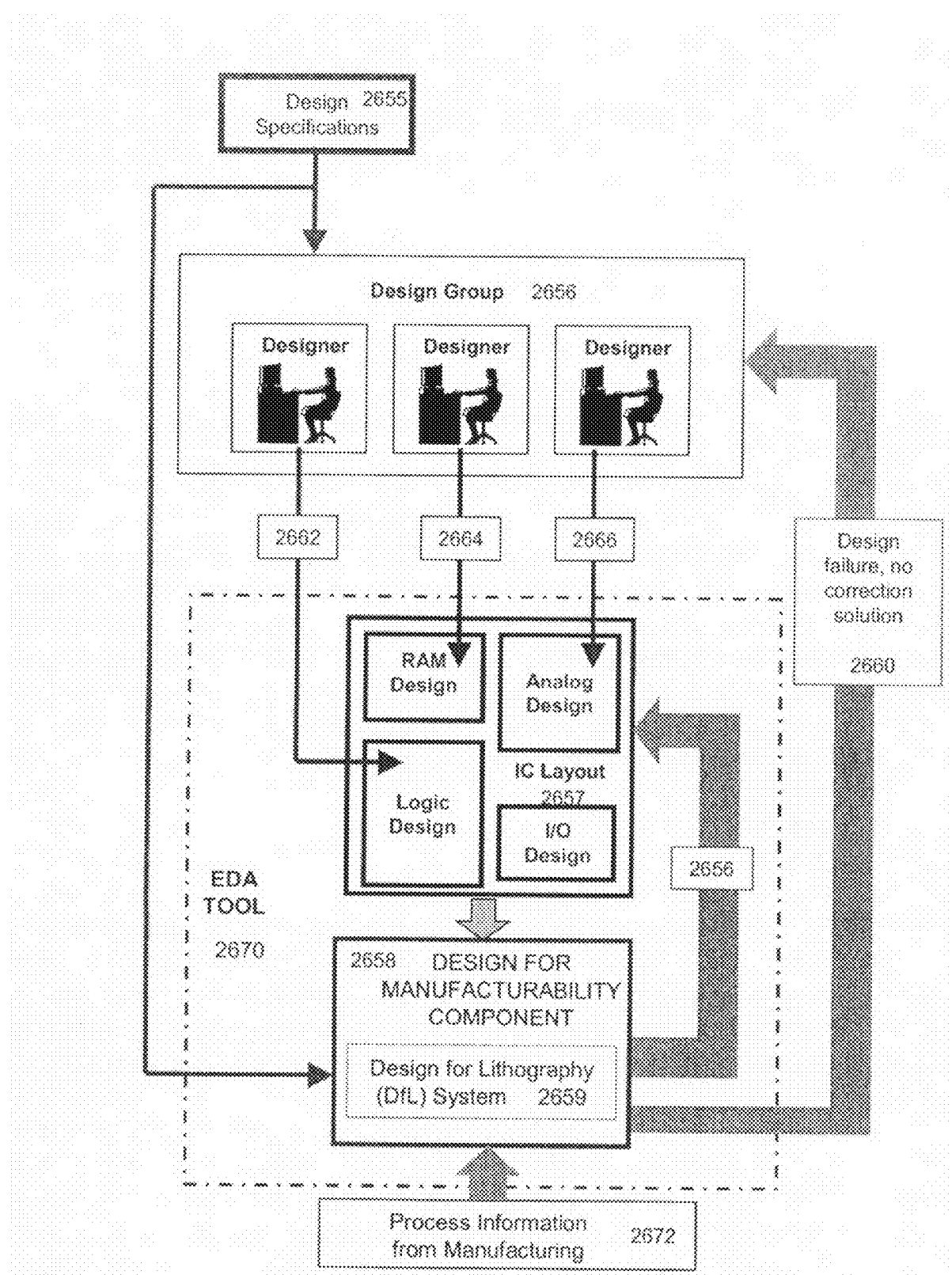
FIG. 55 illustrates a use of the implementation within an EDA tool.
Figure 56:
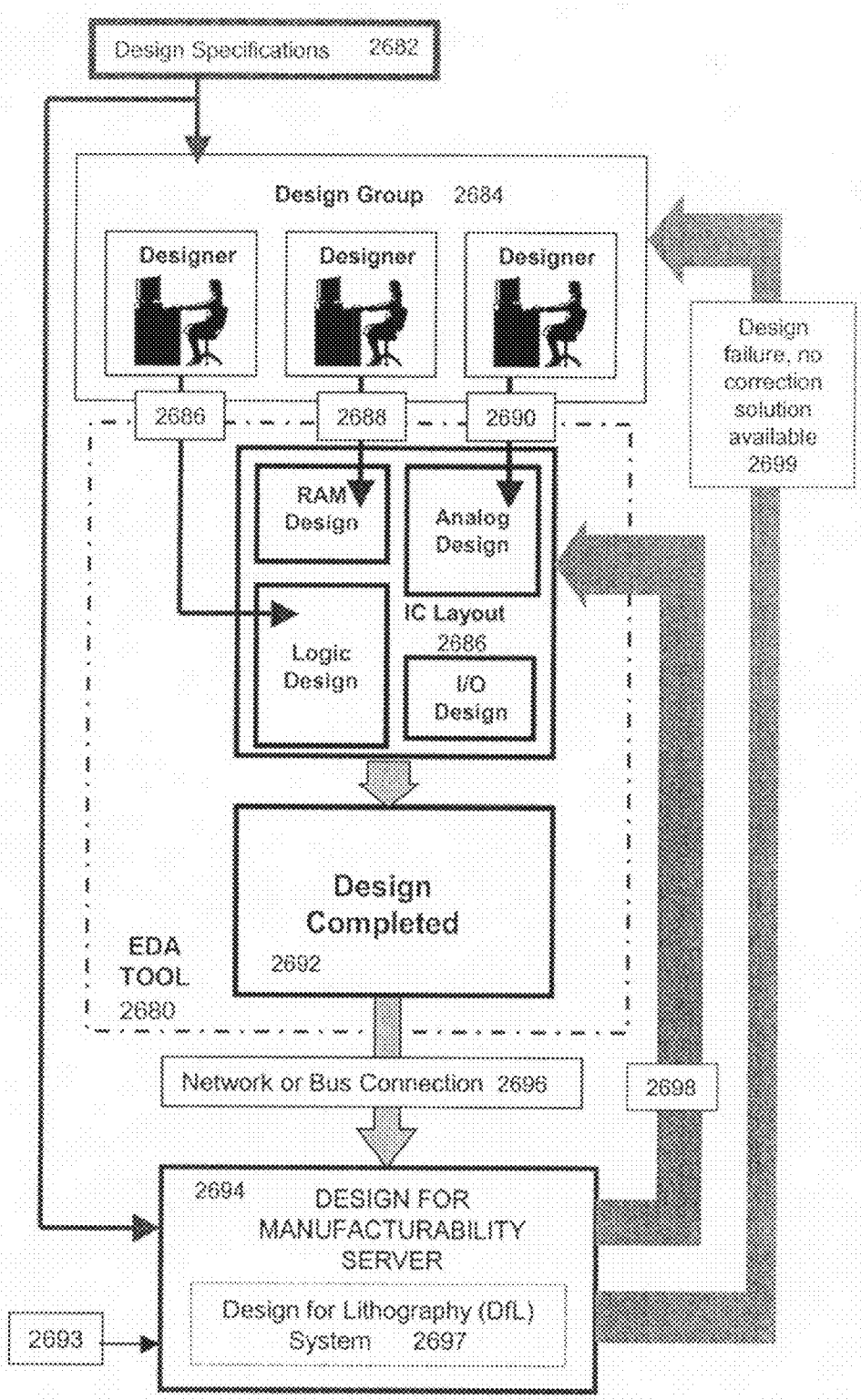
FIG. 56 illustrates a use of the implementation communicating with an EDA tool via a network.

A mask correction technique is shown in FIG. 10C and may be integrated with an electronic design automation (EDA) tool (as shown in FIG. 54 and 55) or used separately (FIG. 56). The first step is generate the layout for an interconnect level (e.g. level N) 231. The layout is normally generated using an EDA tool that places circuit components and routes wiring for interconnect levels. Often dummy fill is added 232 to promote uniformity. The dummy fill may be performed at this stage or performed during the prediction step in 235 when the topographical variation due to pattern dependencies is computed. The next step 233 is physical verification in which the design is checked to make sure that it meets all the design rules and parameters that are specified by manufacturing (e.g., a foundry). Physical verification is often part of the normal EDA tool flow that includes steps 231, 232, 233 and electrical simulation 234. Normally optical proximity correction (OPC) is done, as part of physical verification, to adapt features to compensate for sub-wavelength distortions. However it is recommended that this component be made inactive in any design flow and that OPC methods be used in step 235 instead. If both are used, then the design is adapted for mask creation before the topographical effects on lithography can be properly evaluated. The next recommended step is electrical simulation, which is used to verify that the feature widths, as designed, meet the electrical specifications 234. The full-chip design, a sub-network of the circuit or an extraction from the design layout is then input into the feature width prediction component that characterizes the impact of pattern dependencies on the lithography process (and optionally, the etch process as well) 235. This is similar to the prediction component 300 shown in FIG. 10A. Optical proximity correction (OPC) 236 may be performed within the prediction step, as shown in 640 FIG. 22A, or separately, as shown in 236, using an existing commercial tool. The next step is correction 237 where the design file is modified so that the mask features compensate for width variation. It is recommended that any modifications to the design files 237 by these components (235 and 236) be coordinated. These steps may be repeated 230 for each interconnect level until the highest interconnect level is reached. When modifications to design files, to be used for mask tape-out for each interconnect level, are complete, the electronic files are sent out for creating the masks. It is important to maintain separate design files though. The design files that have been modified to compensate for the width variation are only useful for mask creation. The masks if properly modified will result in feature dimensions that closely resemble those designed in the original design files. As such, any further simulation or analysis should use the original design files, whose dimensions will be accurately represented in the manufactured circuit.

Figure 11:
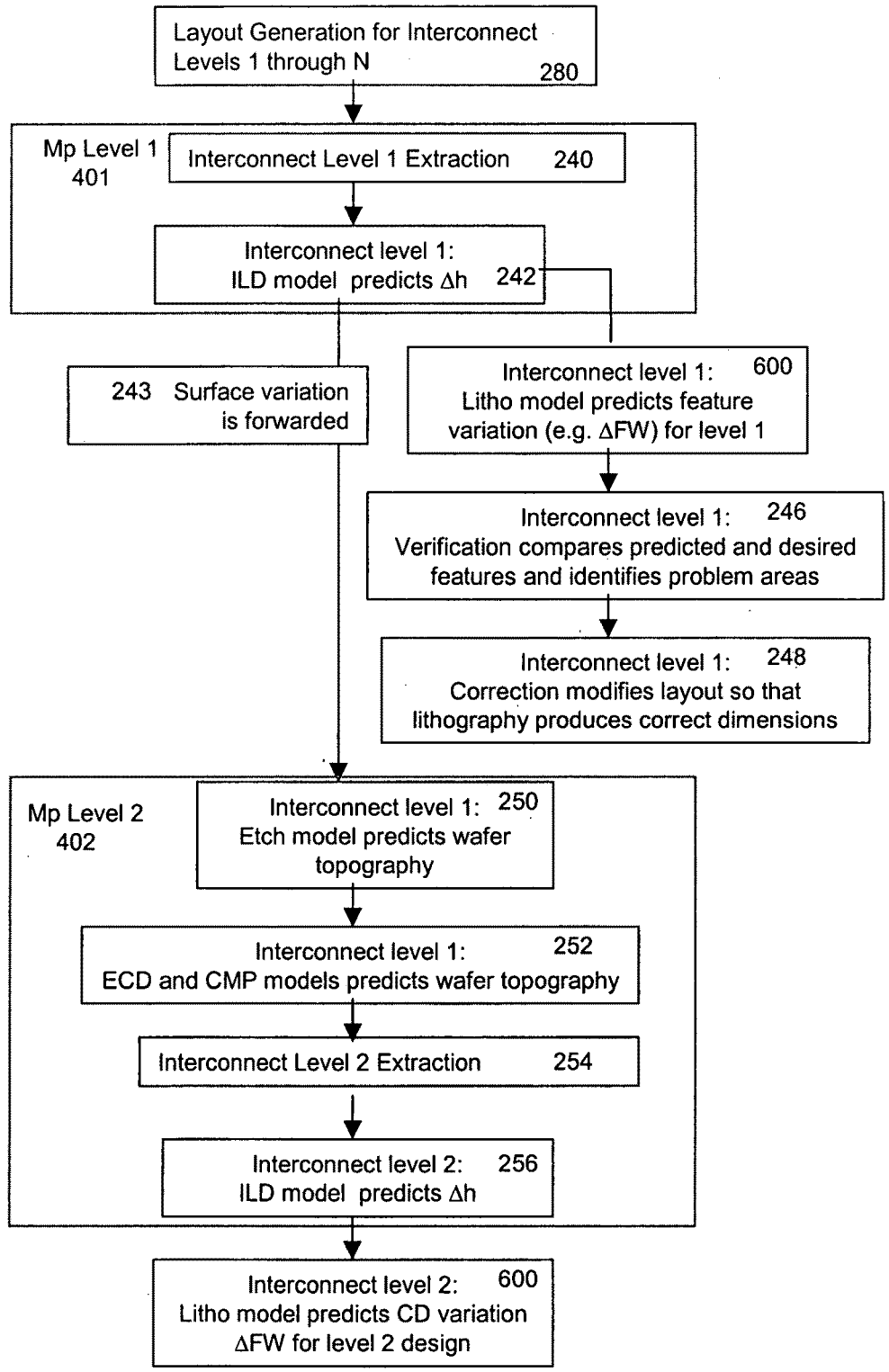
FIG. 11 describes an application in which designs are modified to meet desired printed or etched feature dimensions.
Figure 12:
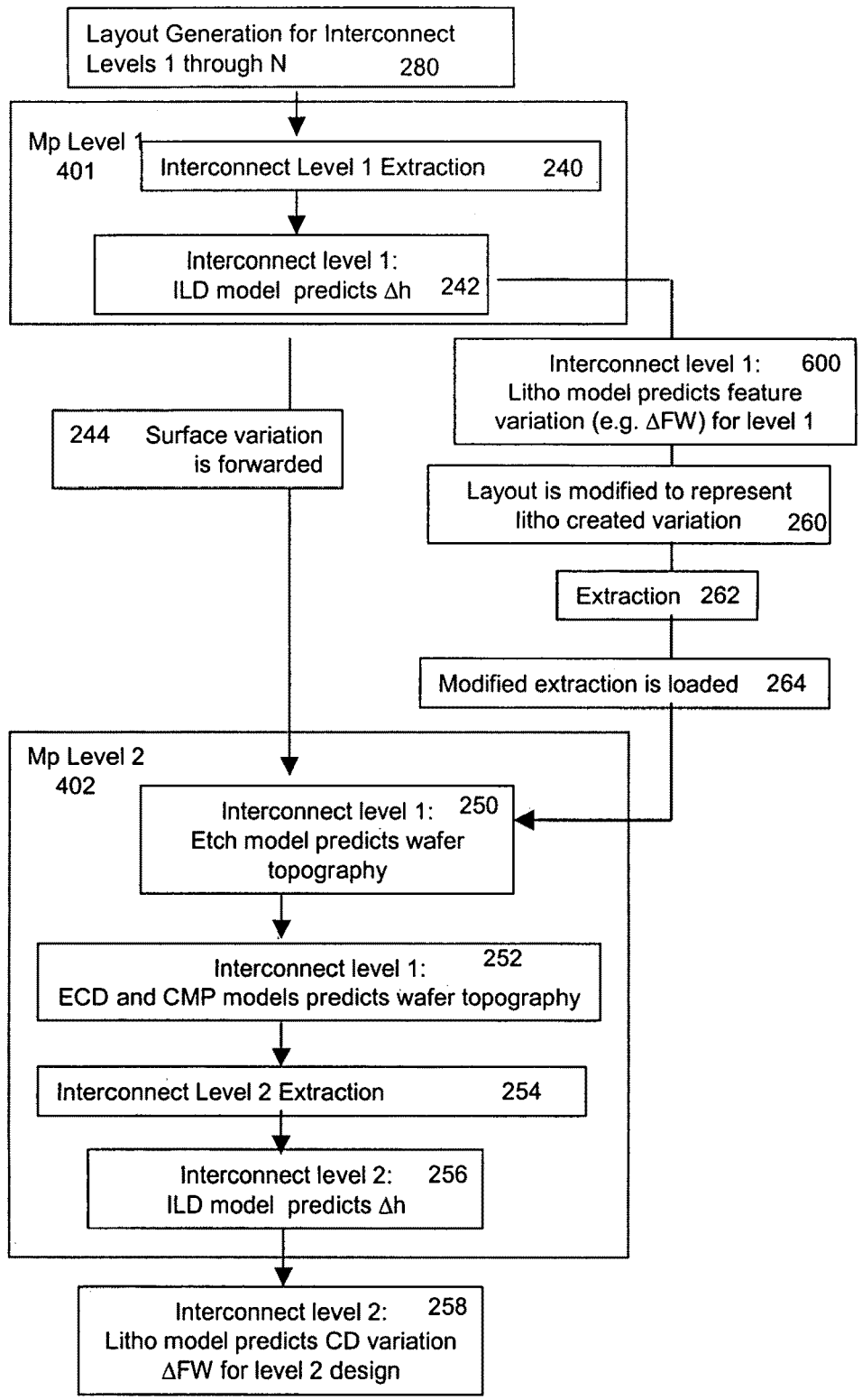
FIG. 12 describes an application in which designs are not modified to meet desired printed or etched feature dimensions.

Two examples of how the techniques may be applied to damascene process flows are provided in FIGS. 11 and 12, which will be referred to as modes A and B respectively. The damascene process flow is a good example because non-uniformity may propagate from level 1 to level 2 and so on until the final level N is reached, and the following figures illustrate the iterative nature of the approach. To simplify the process flow descriptions, pre and post wafer treatments that do not significantly affect wafer topography are ignored. Also, to simplify the example to a generic damascene flow, the term interconnect level is used as a global reference to include both metal and via levels; any additional oxide deposition or etch steps to form vias are not shown. The damascene flows illustrated can be easily extended to dual-damascene and other damascene process flows. Also, the process flows shown in FIGS. 11 and 12 are for the case where plasma etch is not included in the lithography process module 600 and is computed separately. If the option to predict etched or physically created feature dimensions is used, the etch model 250 is used within a lithography process flow component 600 before comparison 246 or modification 260.

The difference between the two approaches is that in mode A, the design is modified before mask creation and tape-out to produce the desired dimensions and thus the original design and extraction reflect the actual printed circuit dimensions (if one uses the corrections to the mask to produce the originally-designed features). The layout extraction for the original design still reflects the processed feature dimensions or may be close enough to assume the designed widths are used in subsequent ECD process steps.

In mode B, the design is modified to reflect the impact of width variation due to lithography. The variation in feature dimensions at each level needs to be reflected in subsequent steps that have pattern dependencies. As such, the design file is adapted, another layout extraction may be performed and the variation is propagated to the next interconnect level to examine multi-layer effects.

Mode A is oriented toward mask correction to yield minimal feature size variation. Mode B is useful for characterizing lithography process impact, for a given design, within the flow. This is also useful in determining measurement plans for feature dimension variation impact—perhaps for existing production device flows where the masks have already been made and being used in production. As such, the full-chip feature dimension variation has to be taken into consideration for subsequent process impact and the design appropriately modified to generate a new layout extraction for downstream process prediction. Also if the full physical and electrical impact of lithography variation is to be examined the changes to feature dimensions should be modified before simulation (perhaps using RC-extractor or EDA tool) as well. That allows for the electrical impact of lithography variation to be characterized as well.

FIG. 11 describes mode A in which the design is modified to yield minimal feature dimension variation after each lithography prediction. Please note that further details on each step will be provided in subsequent sections and these descriptions are to indicate the flow and operation of the components in FIG. 10.

The sample application begins with interconnect level 1, the layout is generated 280 for levels 1 through the final level N, the process model component 401 is used to extract layout parameters 240, and the ILD process model 242 is used to predict the full-chip dielectric thickness, also referred to as $\Delta h$ in FIG. 10. The lithography model component 600 is used to predict the feature dimension variation $\Delta FW$. One option is to import feature width variation to electrical simulation tools to characterize the electrical impact and transfer the electrical characterization of feature width variation to the verification component 246 as well.

The verification component 246 compares the prediction and specifications and identifies problematic areas. The correction component 248 modifies the design so that the lithography process yields the desired feature dimension levels. Since the printed features now match (or are sufficiently close within some acceptable threshold) the original layout extraction parameters 240, a new layout extraction is probably not required unless the feature specifications have been set too broad. This is a way in which the techniques may be used to modify design rules to be less conservative, once lithography variation has been minimized.

To generate the lithography prediction for interconnect level 2, the underlying topography for all the process steps between the two lithography steps should be addressed. To compute the incoming wafer topography $\Delta h$ for level 2, the prediction component $M_p$ Level 2 402 must use the predicted ILD topography from 242, the etch model prediction 250, the ECD model predicted wafer topography, and the CMP model predicted topography 252 from interconnect level 1 and the subsequent ILD topography 256 from interconnect level 2. The pattern that is imaged during interconnect level 2 lithography is the level 2 design, which is extracted 254 and input into the lithography model. Finally, the feed forward propagation through the model flow yields the incoming topographical variation 256 that is input into the lithography model along with the level 2 extraction parameters 254 for predicting the interconnect level 2 feature variation 600.

One option for the use outlined in FIG. 11 is to transfer feature width variation computed in 600 and 250 and the topographical variation computed in 252 into electrical simulations to characterize the electrical performance for interconnect level 1 and this may be repeated for each interconnect level.

FIG. 12 describes mode B. The mode B approach may be used to determine the impact of chip and wafer level pattern dependencies on the lithography process for multiple interconnect levels or the entire chip. In this approach, the printed or etched feature dimensions that result from a lithography process flow may not be the same as the desired feature dimensions and as such any pattern dependencies in subsequent process steps would be based on the printed or etched dimensions. Given that circuit dimensions allay be significantly different, it is recommended that the design or extraction be updated to the predicted variation. When the design is updated to reflect the variation, another extraction may need to be performed and forwarded to subsequent model prediction steps. Further details on each step will be provided in subsequent sections and this description is to indicate the flow and operation of the components in FIG. 10. The key difference in the steps described in FIG. 11 and FIG. 12 is that in FIG. 12 the lithography model prediction of feature dimension variation 600 is used to modify the layout 260 so that it accurately represents the full-chip printed feature width that will actually be printed on the wafer surface. The existing extraction may be modified or a new extraction 262 may be run and fed into the subsequent etch process step 250. In the option where etch models are used within lithography process flow in 600, the resulting variation in features are used to update the layout and a new extraction is ran and fed into the subsequent ECD step 252. The verification, mode B, operation may be used with existing process flows to determine measurement and sampling plans to measure problematic areas where feature dimension variation is a concern.

An option for the method in FIG. 10 is to add an electrical extraction or simulation component to predict the resistance, capacitance and overall electrical impact of the feature dimension variation that results from lithography a lithography process flow including etch. One may also use this invention for full interconnect level electrical characterization by combining predicted feature width and topographical variation that occurs subsequent ECD or CMP steps and providing this information to electrical extraction or simulation tools.

To evaluate electrical impact in FIG. 11, the feature width variation computed in 600 and the topographical variation computed in subsequent process steps 252 may be imported into electrical simulations to characterize the electrical performance for interconnect level 1 and this may be repeated for each interconnect level.

To evaluate electrical impact in FIG. 12, the feature width variation computed in 600 may be examined and transferred to the verification component in 246 and 250 and the topographical variation computed in 252 may be imported into electrical simulations to characterize the electrical performance for interconnect level 1 and this may be repeated for each interconnect level.

In the final verification pass for a given IC design a combination of both process models and electrical simulations may be used to gauge the performance of a given IC design and compare the prediction against the desired wafer quality and electrical parameters as well as design rule criteria 800.

Illustrative embodiments are described in the following sections: Section a. describes the layout generation process. Section b. describes the extraction of layout parameters related to process variation as a method to transform the large design files into a manageable set of features. Layout extraction is not required but is useful. Section c. describes a desirable use of process and electrical models to characterize the impact of pattern dependencies and process variation on chip-level topography. Section d. describes the mapping of wafer topography and designed (or desired) circuit features to predicted feature dimension variation that results from a lithography process flow. Section e. describes the verification process of comparing predicted and desired feature dimension values across the full-chip and a correction process for modifying design features and generating new GDS design files for mask tape-out and creation. Section f. describes the creation and use of test wafers to characterize pattern dependencies associated with lithography process flows. Section g. describes applications using the procedures described in sections b. through f. Section h. describes the construction and computational framework used to implement the methods and the applications described in Section g., as well as the operation of the system and methods by users.

a. Layout Generation

Depending on how the techniques is used (for example, as shown in 10B or 10C), the lithography prediction may be used within an EDA design flow, as shown in FIG. 55, or in series with an EDA design flow, as shown in FIG. 56.

Figure 29A:
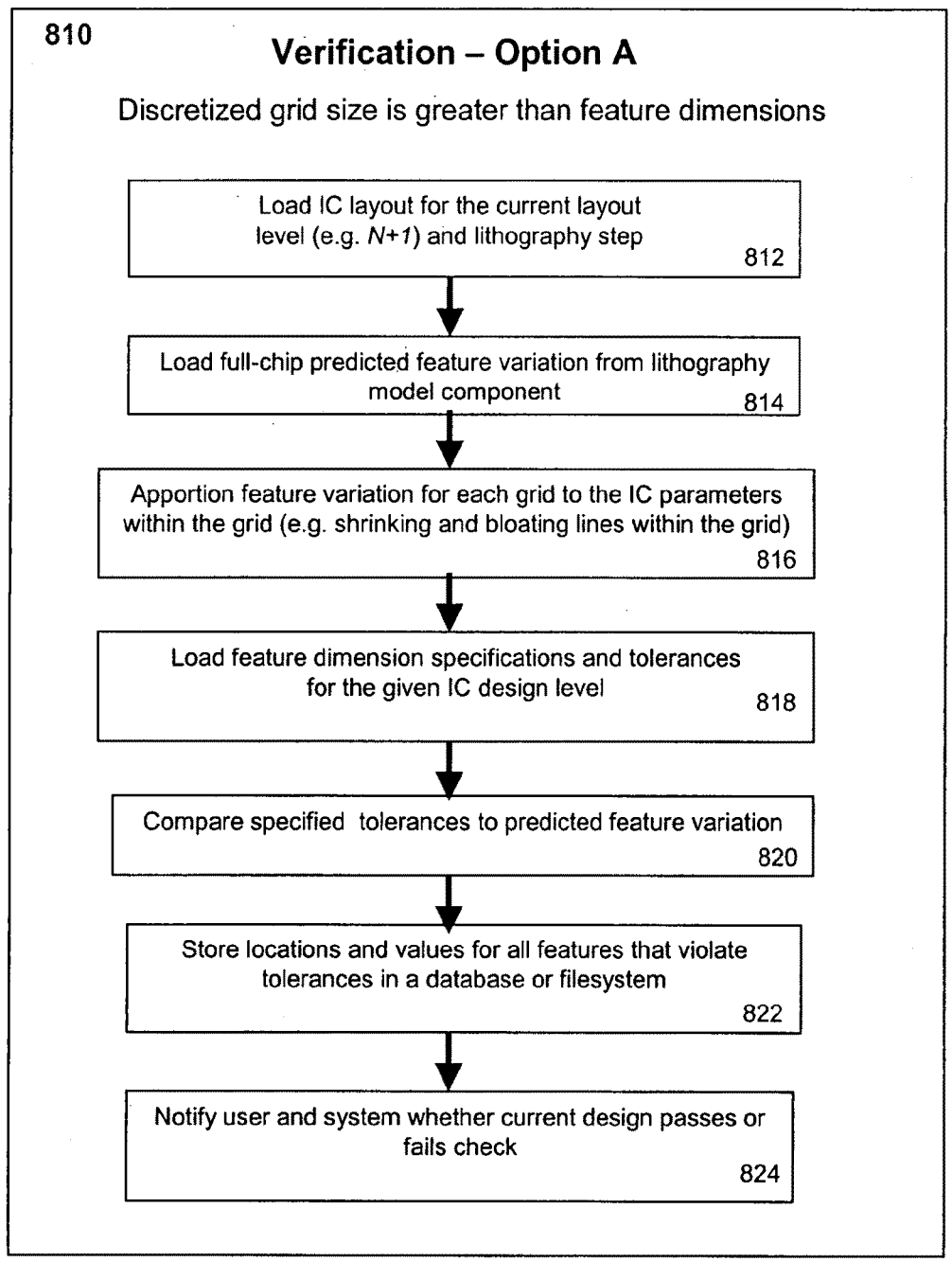
FIG. 29A illustrates steps in verification option A.

In both FIG. 11 and FIG. 12, the lithography modeling may come before or after the layout extraction component. Generally, layout design files are sent through an OPC correction step resulting in the creation of a post OPC layout design file. The OPC correction may either be rule based or model based, but in either case the layout design file is modified from its original form in order that the lines actually printed on the wafer surface after passing through the optics of the lithography process most closely represent what was originally intended. In FIG. 29C, verification is performed at the designed feature resolution and no abstraction of the features, using layout extraction, is needed. As such, this is a case where lithography variation is characterized and perhaps corrected at the feature dimension resolution.

The layout extraction component must be performed on a pre OPC design file and account for any possible errors that the OPC correction may fail to account for, or, if the layout extraction is performed on the post OPC design file, it must remove the effects of the OPC correction in order that it most closely represents what will actually be printed on the wafer surface.

If one is to utilize the lithography model component for OPC and rely on its ability to change the GDS design file such that you get what is designed into the GDS file, then modifications based on topography variations due to CMP may also be moved up above the lithography modeling/OPC block.

In other words, if the techniques are integrated within an EDA tool, any modification of feature widths are to be made before OPC, so that the OPC tool could insert and adjust changes to the GDS file (in it normal operating fashion). Alternatively, the topographical variations ($\Delta h$) could just be forwarded into the OPC tool and it could adjust for both the surface variations and the optical proximity. All of these are options, depending on how the techniques are to be used and whether it is used with an EDA tool and OPC component or not.

Figure 13A:
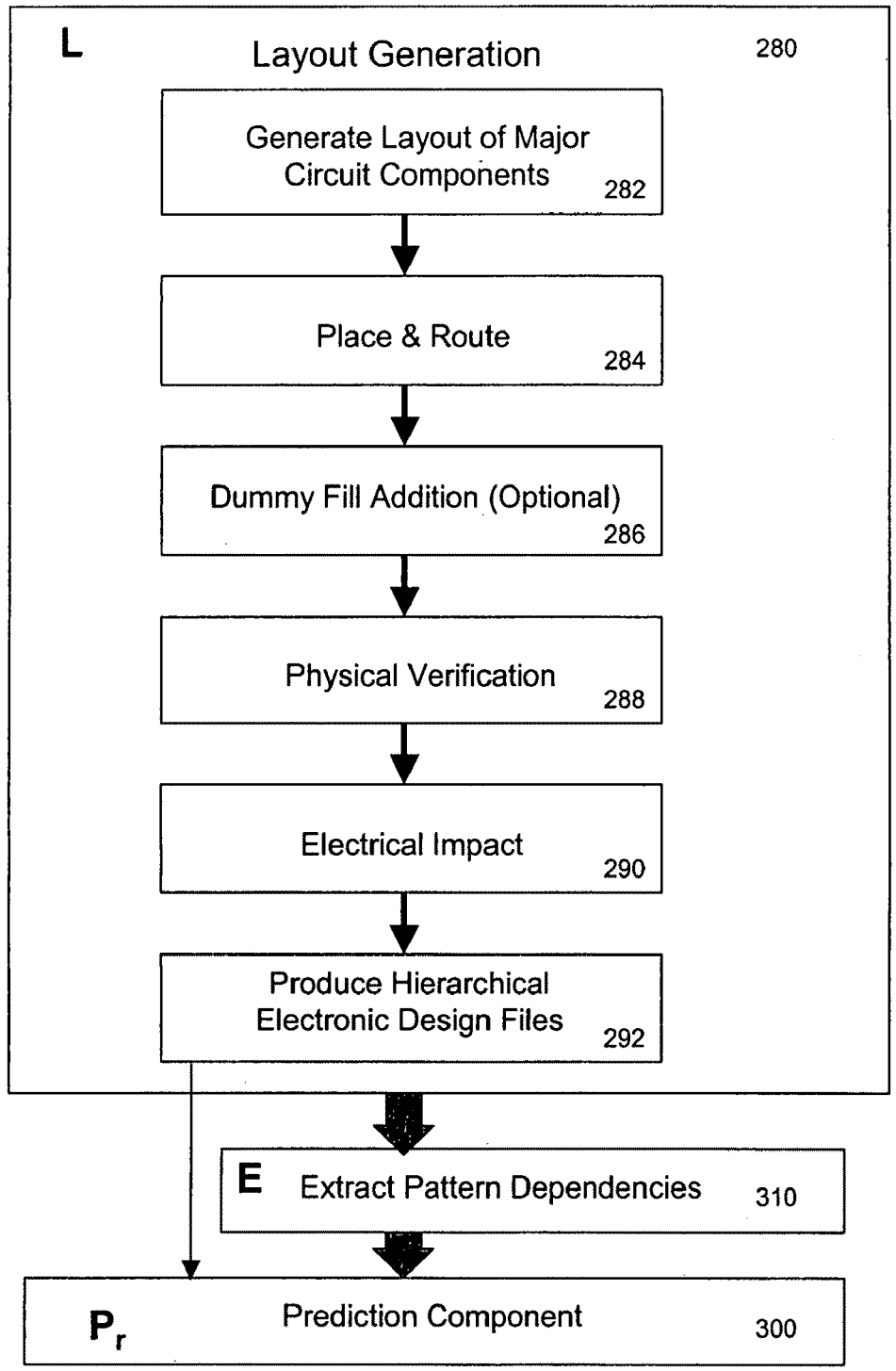
FIG. 13A describes steps commonly used for layout generation.
Figure 13B:
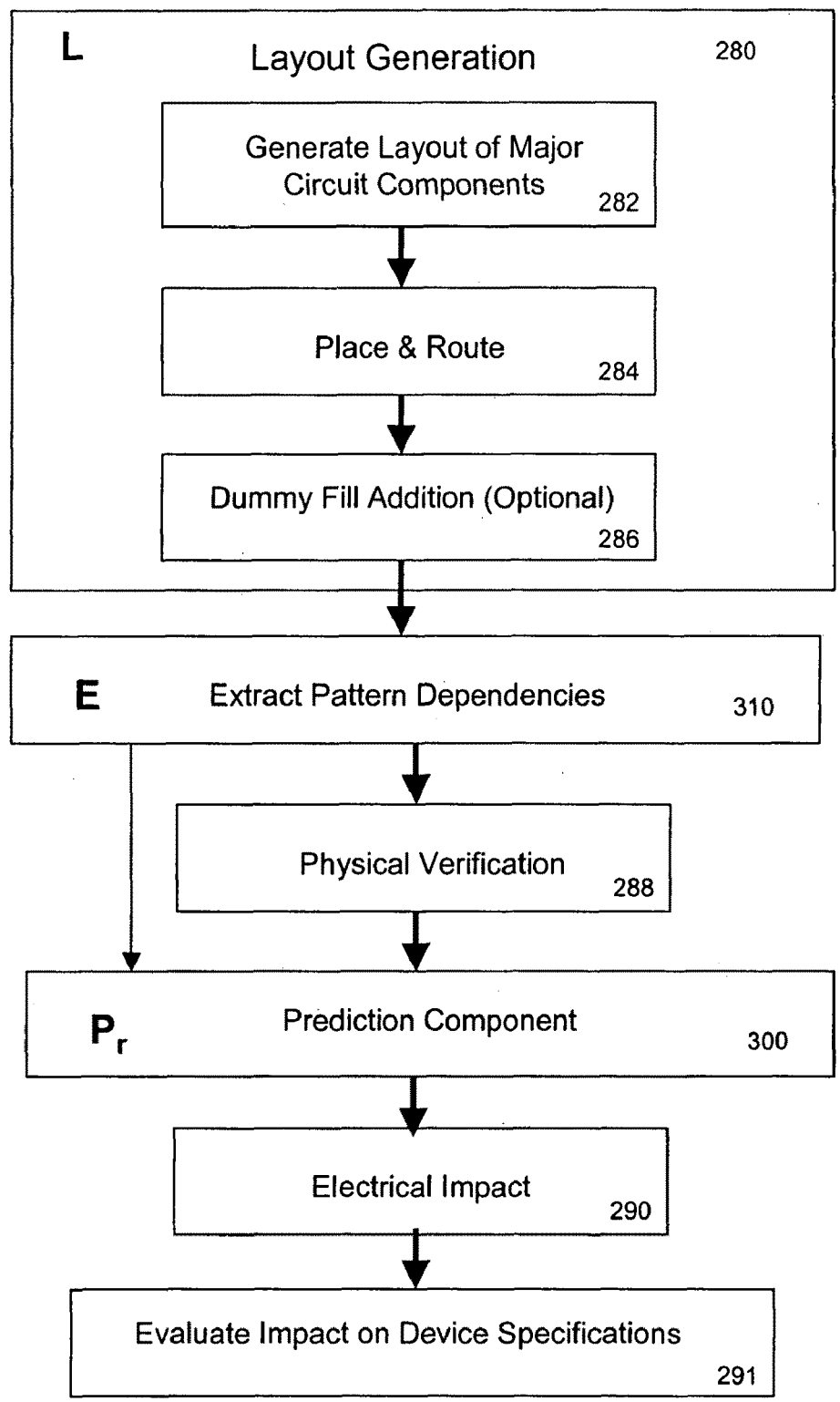
FIG. 13B describes steps commonly used for layout generation when design verification is inserted into the design flow.

Two such ways of generating process layouts (or electronic design files) are described in FIG. 13A and FIG. 13B. FIG. 13A describes a method of correcting masks for a layout generated in a design flow, typically performed using an EDA tool. Layout generation 280 describes the process that converts a functional circuit design to a layout. An IC design is commonly represented electronically in a layout design file (e.g., in a Graphical Data Stream or GDS format) in a library of files that define structures and their locations at each level of an integrated circuit. The process begins with a layout of where major components (blocks of circuitry) are located on the physical die 282. Place and route 284 is then done to determine precisely where every cell or block is positioned and how all components are connected. Dummy fill addition 286 may be performed to modify the density of materials in a given, layer, while minimizing the electrical impact (Additional information concerning dummy fill is set forth in U.S. patent application Ser. Nos. 10/165,214, 10/164,844, 10/164,847, and 10/164,842, all filed Jun. 7, 2002). Dummy fill may also be performed later after topographical variation is characterized as part of the prediction component 300. The next step 288 is physical verification in which the design is checked to make sure that it meets all the design rules and parameters that are specified by manufacturing (e.g., a foundry).

A common option, during or after the physical verification step in a design flow, is to pass the design through optical proximity correction (OPC) to adapt the design file used to create masks with regard to feature density. Within the methods described here, the step may be performed in the lithography modeling component 600 so that manufacturing variation may be taken into account along with feature density.

Often electrical extraction and simulation are performed 290 to verify that the chip, as verified in the prior step and with dummy fill added, meets electrical performance requirements. Within the context of the methods described here, electrical impact also includes full-chip prediction of sheet resistance, total copper loss, capacitance, drive current and timing closure parameters.

The design modifications are generated in a layout design file format and assembled into a library. To achieve a smaller electronic file size, a hierarchical method may be used to compress the size of the design files (Such a hierarchical method is described in U.S. patent application Ser. Nos. 10/165,214, 10/164,844, 10/164,847, and 10/164,842, all filed Jun. 7, 2002.). Once layout generation is completed, the design may be input into the layout extraction component 310. The layout extraction, the actual full-chip design at the feature resolution or some portion of the circuit such as a critical network is fed into the prediction component 300.

The layout generation process described in FIG. 13B the generation and verification of a design. The components are the same as described in FIG. 13A and the prior paragraphs in this section. However the order is different so that the physical and electrical impact of feature width variation may be inserted into the design process directly. The process in FIG. 13B is similar to that of FIG. 13A in that it begins with a layout of where major components (blocks of circuitry) are located on the physical die 282. Place and route 284 is then done to determine precisely where every cell or block is positioned and how all components are connected. Dummy fill addition 286 may be performed to modify the density of materials in a given layer, while minimizing the electrical impact (Additional information concerning dummy fill is set forth in U.S. patent application Ser. Nos. 10/165,214, 10/164,844, 10/164,847, and 10/164,842, all filed Jun. 7, 2002). Dummy fill may also be performed later after topographical variation is characterized as part of the prediction component 300. The next step 288 is physical verification in which the design is checked to make sure that it meets all the design rules and parameters that are specified by manufacturing (e.g., a foundry).

In this mode, the techniques described here work with the physical verification component and may, as shown later in FIG. 54 and FIG. 55, be directly embedded or integrated within a physical verification component within an EDA tool. In some cases where the computational burden is a constraint, a layout extraction may be performed (described in more detail in Section b.) 310. In other cases, the actual design file or some portion of the circuit (e.g. a critical sub-network) may be directly imported, into the physical verification 288 and prediction components 300.

The prediction component examines and characterizes feature width variation 300 and updates a design file, which reflects the variation in manufactured circuit if the masks use the original layout produced in 280. The electrical impact of this variation on circuit performance may be evaluated by using electrical extractions and simulations that are performed 290 to verify that the chip meets electrical performance requirements. Within the context of the methods described here, electrical impact also includes full-chip prediction of sheet resistance, total copper loss, capacitance, drive current and timing closure parameters. The overall impact of feature width variation on physical and electrical characteristics for the interconnect level are evaluated against desired device specifications.

In later figures and descriptions, layout generation will indicated with a 'L' and may include any and all of the cases discussed in this section but is not limited to the two cases described in FIG. 13A and FIG. 13B.

b. Layout Parameter Extraction

As described in section a., a layout is a set of electronic files that store the spatial locations of structures and geometries that comprise each layer of an integrated circuit. It is known that variation during manufacturing, which negatively impacts the chip-level planarity of processed films, is related to the variation in spatial densities and the spatial distribution of features within a given design. This relationship may be characterized using layout extraction, in which characteristics of the feature layout (e.g. width and spaces of lines and pattern density) are extracted spatially across a chip from the geometric descriptions in layout files. The extracted information may then be used to determine areas of the chip that exceed design rule criteria, such as limits on feature dimensions and distances to neighboring structures.

The layout parameter most often used to compute dummy fill is the effective pattern density. Although the dummy fill method works with extracted densities, it is useful to include the extracted feature widths and spaces. Since lithography impact must take into consideration all features, whether electrically active or dummy structures, it is recommended to use designs with dummy fill added and the associated layout parameters for purposes of layout extraction.

Figure 14A:
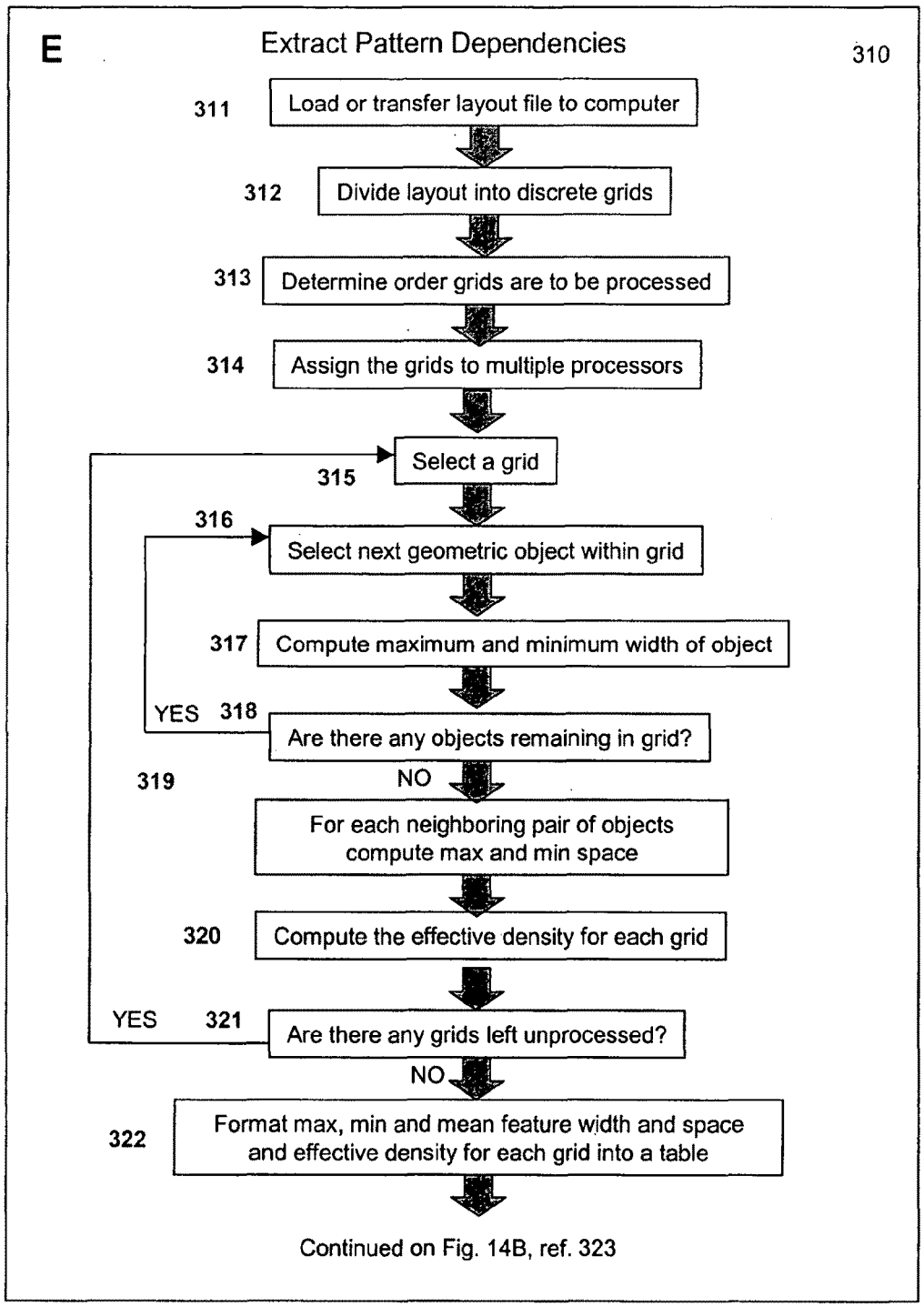
FIG. 14A illustrates the steps involved in layout extraction.
Figure 14B:
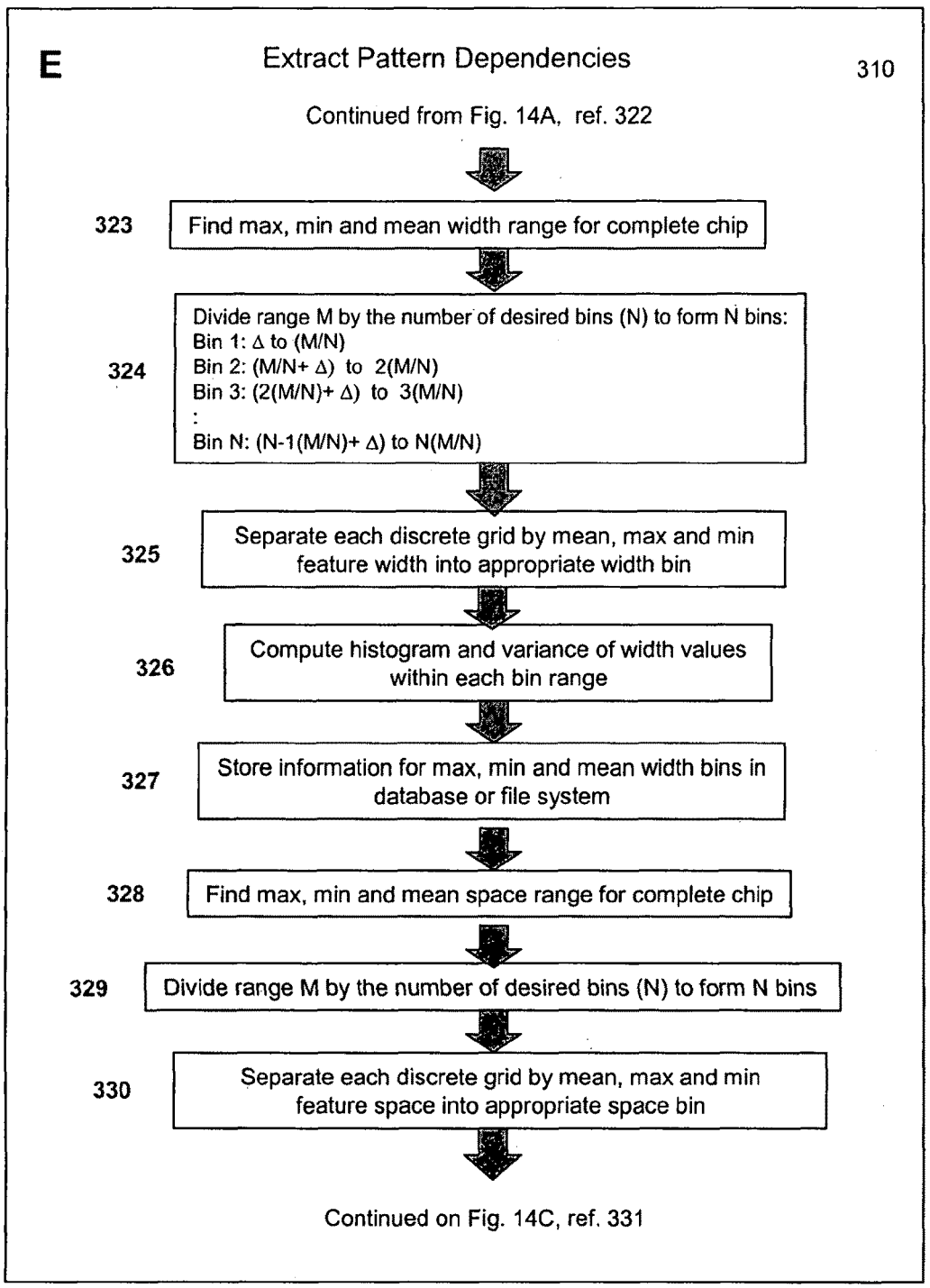
FIG. 14B illustrates a continuation of the steps involved in layout extraction.
Figure 14C:
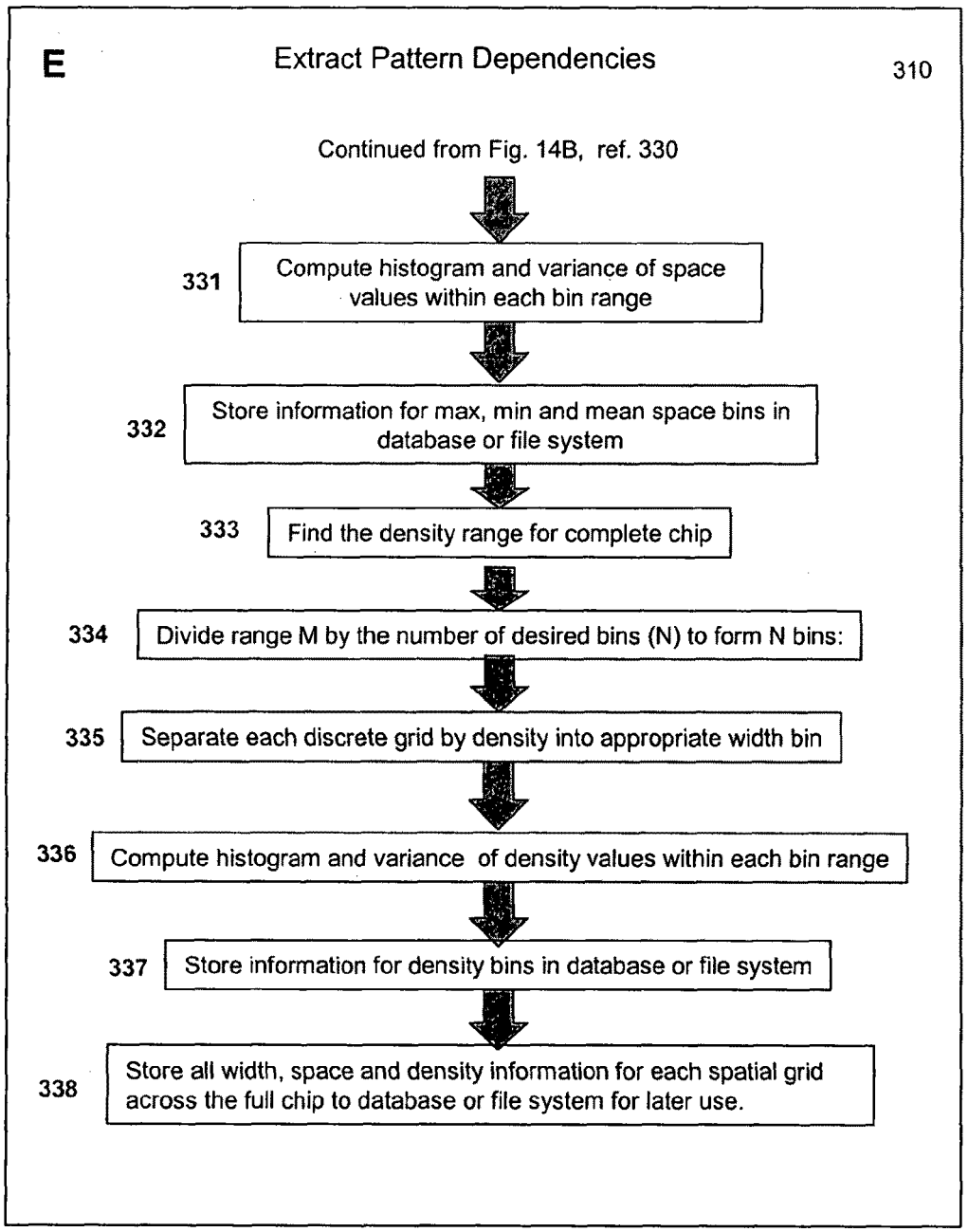
FIG. 14C illustrates a continuation of the steps involved in layout extraction.

The flowchart in FIGS. 14A, 14B and 14C provides a detailed flow of the layout extraction component 310 of FIG. 10. The layout file is transferred or uploaded to the computer where the extraction algorithm is, running 311. The layout is divided into discrete grids, small enough so that aggregate computations of mean, maximum, and minimum features can be used to represent the structures in the grid and still allow accurate feature representation 312. The trade-off is between higher and lower grid resolution is the increased extraction, calibration, and prediction compute times versus a more faithful representation of the layout and more accurate predictions. It is recommended to use a grid size that is less than feature dimensions; however section e. and FIG. 29A presents a method for using larger grid sizes such as 40 μm×40 μm for verification and correction. The grids are ordered or queued for processing 313. One desirable approach is to use multiple processors to compute the grids in parallel 314. A grid is selected 315 and within that grid the width of each object 316 is computed 317. This process is repeated for every object within that grid 318. For each set of neighboring objects (e.g. adjacent objects or objects within some defined distance of an object in being processed) the maximum, minimum, and mean space is computed 319. The effective density for the entire grid is then computed 320. This process is repeated for all the remaining grids 321. Once all the grids are processed, the extracted features such as width, space, and density are reassembled from the parallel processors 322.

A table is then created and the maximum, minimum, and mean width, space, and density for each grid are placed in it as well as the maximum, minimum, and mean width for the whole chip 323. The minimum and maximum widths for the whole chip are used to compute a range.

Bins are useful for computing statistical and probabilistic distributions for layout parameters within the range specified by the bin. The width range (M) for the chip is divided by a number of desired bins (N) 324 to determine the relative size of each of the N bins. For example, the first bin would span from the minimum width or small nonzero value Δ to the width (M/N). Successive bins would be defined similarly up to the $N^{th}$ bin, which will span the width from min $FW_{BinN}$= (N−1)·(M/N) to max $FW_{BinN}$=(N)·(M/N), which is also the maximum feature width. The limits for each of these bins may also be set manually by the user. There are three sets of bins, a set of bins for each of maximum, minimum, and mean width. Each grid is placed in the appropriate bins according to its max, min and mean width 325. A histogram is also created for each bin showing the distribution of values within that bin 326. This information is stored in the database and fed into process models 327.

The maximum, minimum, and mean feature space ranges are computed for the full chip 328. The space range (M) is divided by the number of desired bins (N) 329 to determine the relative size of each of the N bins. For example, the first bin would span from the minimum space or small nonzero value Δ to the space (M/N) and successive bins would be defined similarly up to the $N^{th}$ bin, which will span the space from min $FS_{BinN}$=(N−1)·(M/N) to max $FS_{BinN}$=(N)·(M/N), which is also the maximum space. The limits for these bins may also be set manually by the user. There are three sets of bins, a set of bins for each of maximum, minimum, and mean feature space for the full chip. Each grid is separated into the appropriate bins according to its max, min, and mean spare, 330. A histogram is also created for each bin showing the distribution of values within that bin 331. This information is stored in the database and fed into process models.

The density range is computed for the full chip 333. The density range (M) is divided by the number of desired bins (N) 334 to determine the relative size of each of the N bins. For example the first bin would range from the minimum density or small nonzero value $\Delta$ to the density value (M/N) and other bins would be defined similarly up to the $N^{th}$ bin which will span the density from min $FD_{BinN}$=(N−1)·(M/N)+$\Delta$ to max $FD_{BinN}$=(N)·(M/N), which is also the maximum density. The limits for these bins may also be set manually by the user. There is one set of bins for density. Each grid is assigned to the appropriate bins according to its density 335. A histogram is also created for each bin showing the distribution of values within that bin 336. This information is stored in the database and fed into process models 337. Finally all the width, space, and density information 338 are stored either in the database or on the file system for later use in process model prediction 400, 600, and 800.

Figure 15:
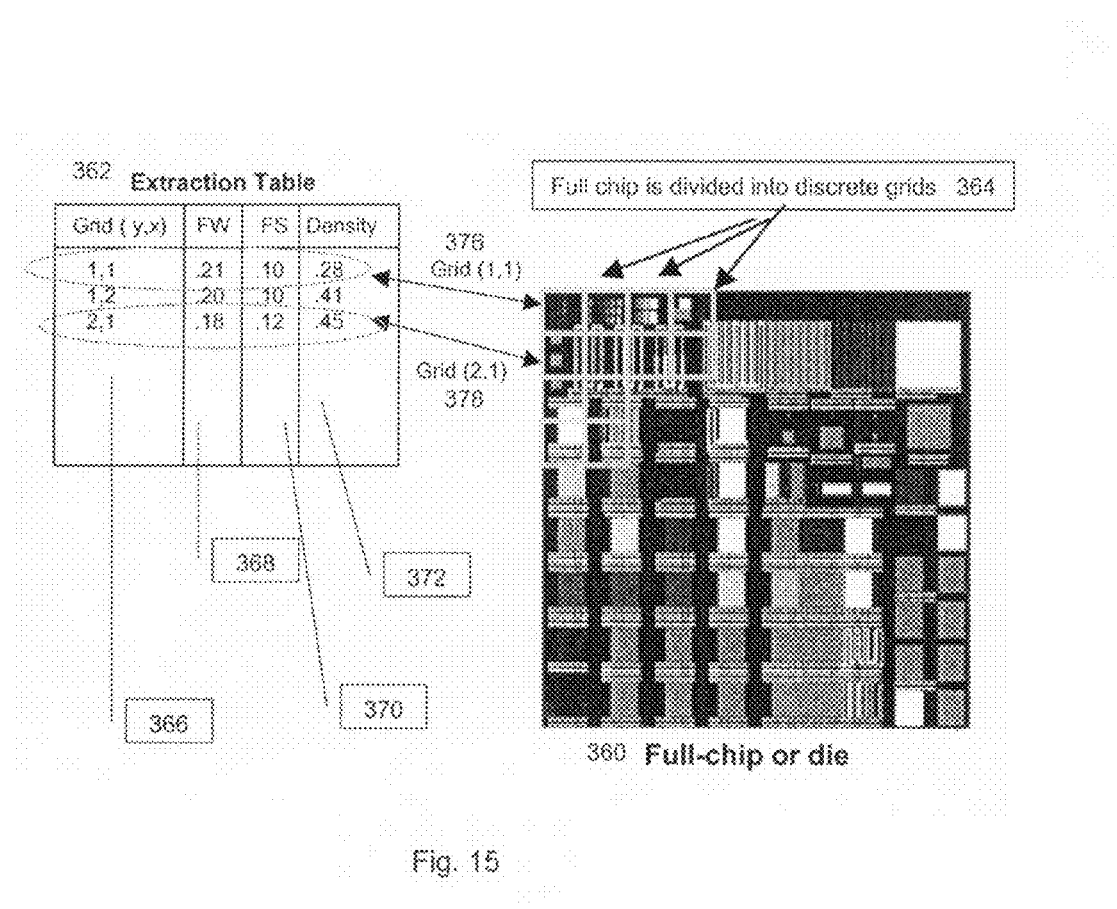
FIG. 15 illustrates the relationship between spatial regions across the chip and the creation of a layout extraction table.

FIG. 15 provides an illustration of how an extraction table 362 (for all the grids across the full-chip or die) is generated using the process described in FIGS. 14A, 14B and 14C. The chip or die 360 is segmented into discrete grids 364 and the extraction procedure, described in FIG. 13, is used to compute the width 47 space 48, and density 49 for each grid element 46. For each discrete grid on the die 364 there exists a feature in the extraction table for the grid coordinates 366 with the relevant pattern dependent characteristics, for example density, feature width (FW), and feature space (FS). The figure also shows an example of two grids with (x, y) coordinates (1,1) 376 and (2,1) 378 and how they may appear in the extraction table. FIG. 13 indicates how these characteristics, feature width (FW) 368, feature space (FS) 370, and density 372 values, may be placed in an extraction table 362. In many cases, the max, min, and mean of the features within each grid are stored in the table as well.

c. Pattern Dependent Process Models

A process model or a series of models (e.g., a model of a flow) can be used to predict the manufactured variation in physical and electrical parameters of an actual IC device from an IC design. By characterizing the process variation relative to IC strictures using the model, variations in topography across the chip may be predicted and used to estimate printed feature size variation during lithography or physical feature dimensions that result from use of lithography and etch processing.

Figure 16:
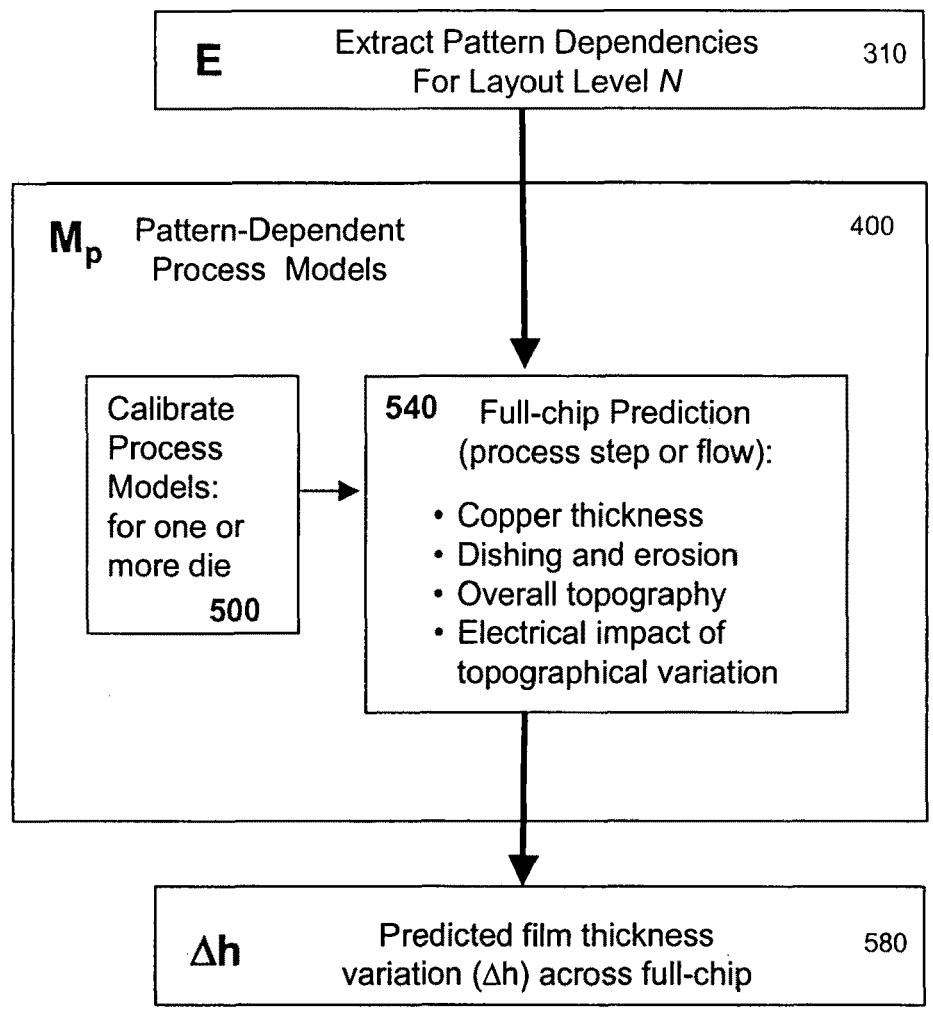
FIG. 16 describes a process model component.

As described in FIG. 16, pattern-dependent process models and model flows 540 are used to map extracted IC patterns and characteristics 310 to chip-level topographic variation across the chip 580. Each process tool generally has unique characteristics and thus a model typically needs to be calibrated to a particular recipe and tool 500. As such, the pattern-dependent model component 400 includes the calibration step 500 and the feed forward prediction step 540. Full-chip or partial chip predictions may include copper thickness, dishing, erosion or electrical impact of topographical variation. The following paragraphs describe the calibration step 500.

Figure 17A:
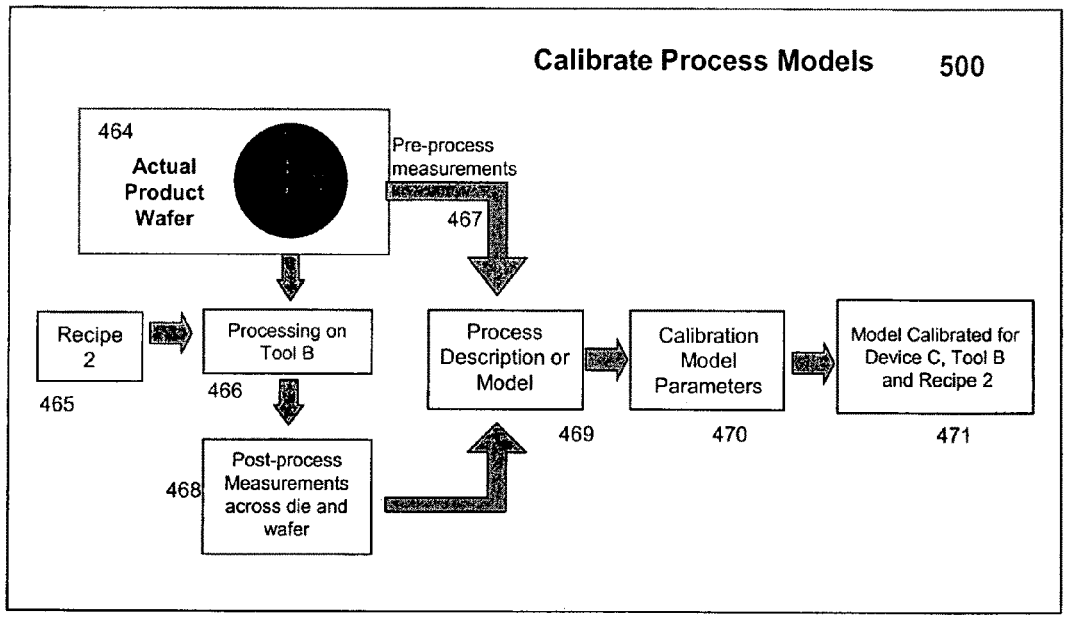
FIG. 17A illustrates the use of product wafers in calibrating a tool for a particular recipe.

It is common practice to physically process integrated circuits in accordance with a given IC design to determine the impact of processing on physical and electrical parameters and to develop or calibrate process models specific to a particular tool or recipe, as shown in FIG. 17A. In the calibration process 500 shown in FIG. 17A, the actual product wafer 464 is processed using a recipe 465 on a particular tool 466. Pre-process wafer measurements 467 and post-process wafer measurements 468 are used to fit model parameters 469. A semi-empirical model is used to characterize pattern dependencies in the given process. The calibration model parameters or fitting parameters 470 may be extracted using any number of computational methods such as regression, non-linear optimization or learning algorithms (e.g. neural networks). The result is a model that is calibrated to the particular tool for a given recipe 471. In other words, it is a model that, for the particular tool and recipe, is useful in predicting the characteristics of finished ICs that are processed according to a particular chip design.

Figure 17B:
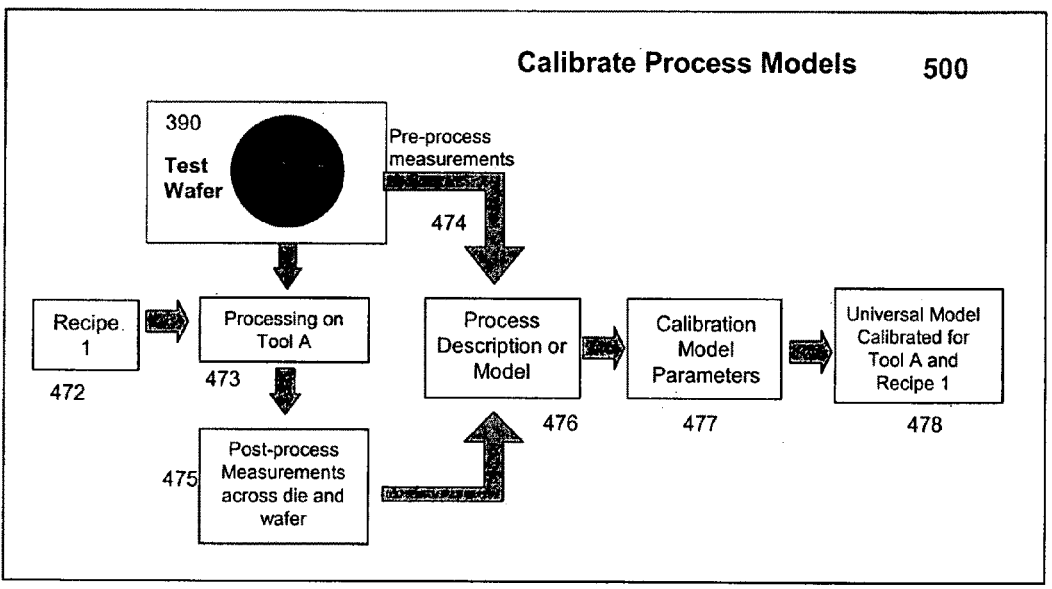
FIG. 17B illustrates the use of test wafers in calibrating a tool for a particular recipe.

Certain IC characteristics, such as feature density, width, and spacing are directly related to variation in topography for plating, deposition, and CMP processes. Test wafers that vary these features throughout some range across the die can be used to build a mapping from design parameters (e.g. width, space, density) to manufacturing variation (e.g. film thickness, total copper loss, dishing and erosion) for a given tool and recipe. Test wafers are an attractive alternative for assessing process impact than actual designed wafers because they are generally less expensive to manufacture and one test wafer design can be used to characterize any number of processes or recipes for a wide range of IC designs. As shown in FIG. 17B, a test wafer 390 can be also be used to generate a calibrated process model or multiple process models or a process flow. The calibration model parameters may be computed similarly to the method shown in FIG. 17A. One difference is that the pre-process measurement, 474, may be conducted by the test wafer manufacturer and retrieved in an electronic form, such as via the internet, email, disc or CD, or in paper form. Another difference is that the resulting calibration 478 normally spans a much larger range of feature width, spacing, and density, and thus is more applicable to a broad range of devices that could be fabricated on the tool using the recipe. Since a test wafer is normally designed to span a large design space, the calibration process described in FIG. 17B is recommended.

Figure 18:
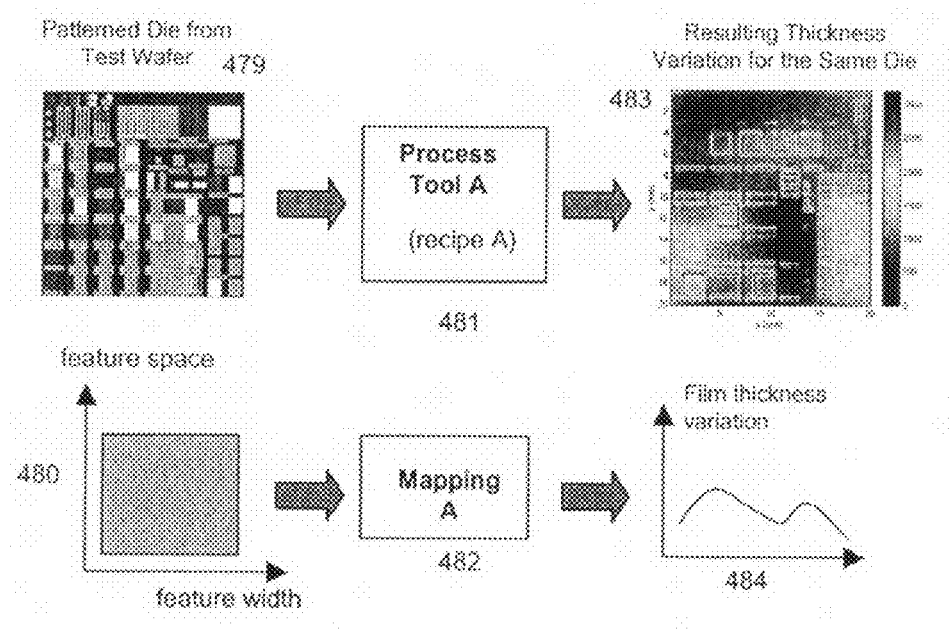
FIG. 18 illustrates how a calibration is used to map layout features to film thickness variation.

More details regarding the use of test wafers in calibrating a process are provided in FIG. 18. A test wafer die 479 is patterned with a range of line width and line space values 480. The test wafer is processed (e.g., by CMP, ECD, or deposition) on a particular tool using a given recipe 481 and the resulting variation in a parameter is measured across the chip 483 using a metrology tool (e.g. film thickness, 484). This mapping 482, dictated by the calibration model parameters, may be considered a model that maps a wide range of line width and line space values to a particular film thickness variation for this tool and recipe.

Figure 19A:
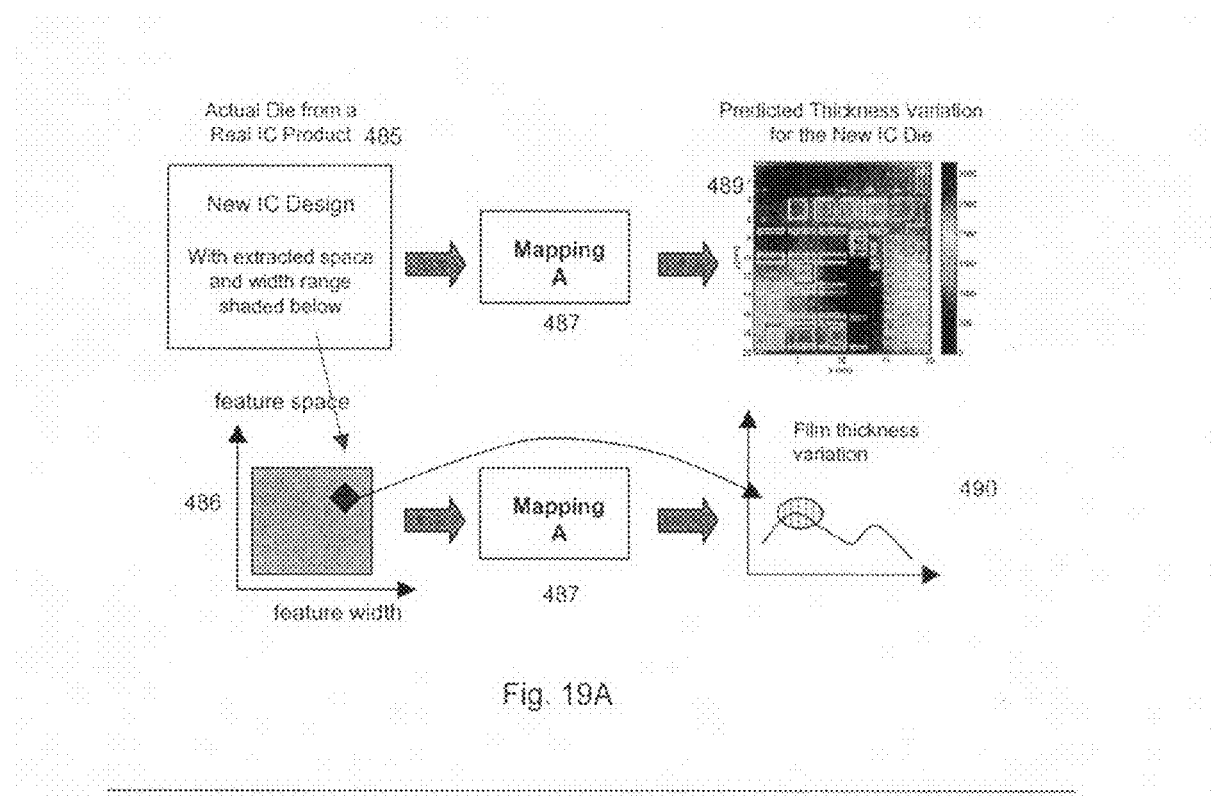
FIG. 19A illustrates the use of a calibration mapping to predict film thickness variation for an IC design.

These mappings are useful for predicting process variation for new IC designs, as shown in FIG. 19A. Feature widths and spaces that fall within the range 486 spanned by the test die and wafer are extracted 485 from a new IC layout. The extracted feature widths and spaces for spatial locations across the chip 486 are input into the mapping 487 and an accurate prediction of film thickness variation across the chip 489 and 490 can be acquired for a given tool and a given recipe before processing of the new IC design.

Figure 19B:
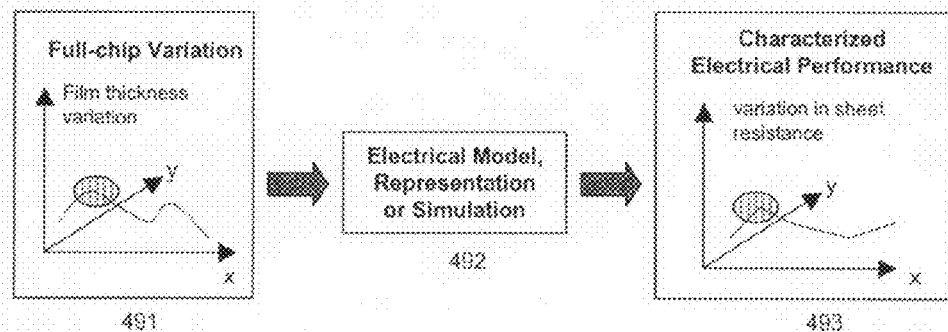
FIG. 19B illustrates how wafer-state parameters, such as film thickness variation, can be used to predict electrical parameters.

As shown in FIG. 19B, the predicted process variation 491 (which may include variation due to lithography) can be fed into electrical models or simulations 492 to assess the impact of processing on the electrical performance of the chip 493. Some of the electrical parameters that may be computed using the models include variation in sheet resistance, line resistance, capacitance, interconnect RC delay, voltage drop, drive current loss, dielectric constant, signal integrity, IR drop or cross-talk noise. These predictions can be used to determine the impact of feature dimension variation on electrical performance for the full-chip or critical networks (also called critical nets).

The following paragraphs and figure descriptions provide a detailed flow of the use of process and electrical models to characterize variation, as implemented for lithography.

Figure 20:
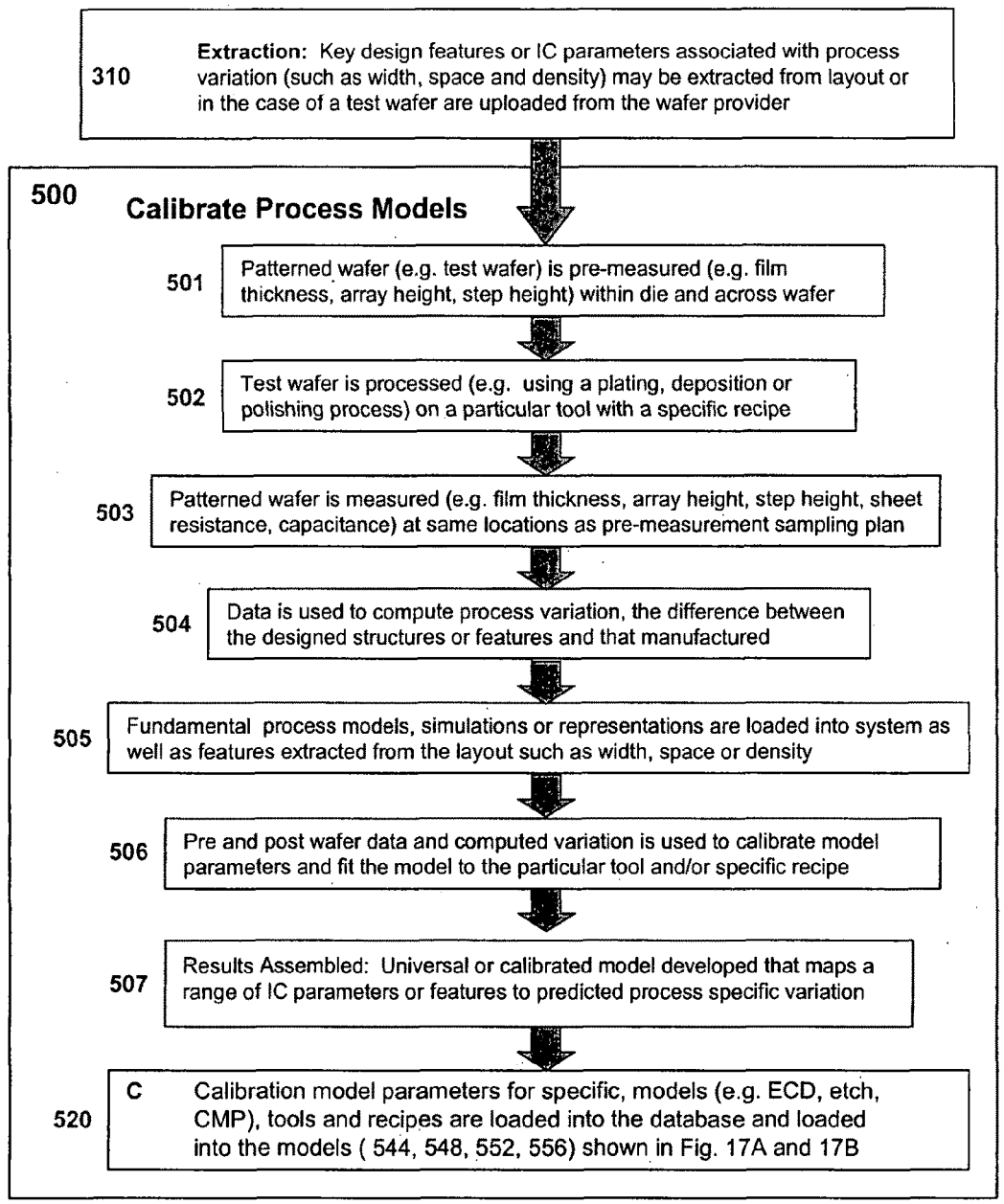
FIG. 20 illustrates steps in a calibration process.

FIG. 20 describes the steps involved in calibrating a process model to a particular tool or recipe. Layout extraction 310 parameters are computed, or in the case of test wafers, uploaded from the wafer provider. The second step 501 pre-measures the wafer using metrology equipment. These measurements may include film thickness and profilometry scans to acquire array and step heights. The test wafer is processed 502 using the particular process or process flow that is to be characterized. Such processes or flows may include plating, deposition, and/or polishing steps. It is particularly useful to calibrate on individual processes and also to calibrate on sections of the flow as a way to capture any coupling of variation between subsequent process steps in a flow. It is also recommended to calibrate the model for different recipe parameters such as time. The processed wafers are measured 503, at the same locations as the pre-measurements; such measurements may include film thickness, profilometry, or electrical characteristics; and the variation for the given process may be characterized 504. Process models or representations are uploaded in 505 and the pre and post measurements as well as computed variation may be used to calibrate or fit the model or representation to a particular tool and/or recipe or recipes. These models may be formulated and uploaded by a user or selected from a library of models on a modeling computer system. The pre- and post-processing measurements and computed process variation are used to fit the model or simulation parameters for the given tool and recipe 506. The result 507 is a process model calibrated to a particular tool and recipe or recipes. The result may also include a series of calibrated process models that can be used to simulate a process flow. The calibration model parameters for specific models (e.g. ECD, etch, and CMP), tools, recipes and flows are loaded into the database and into the models during feed-forward prediction 520.

Figure 21A:
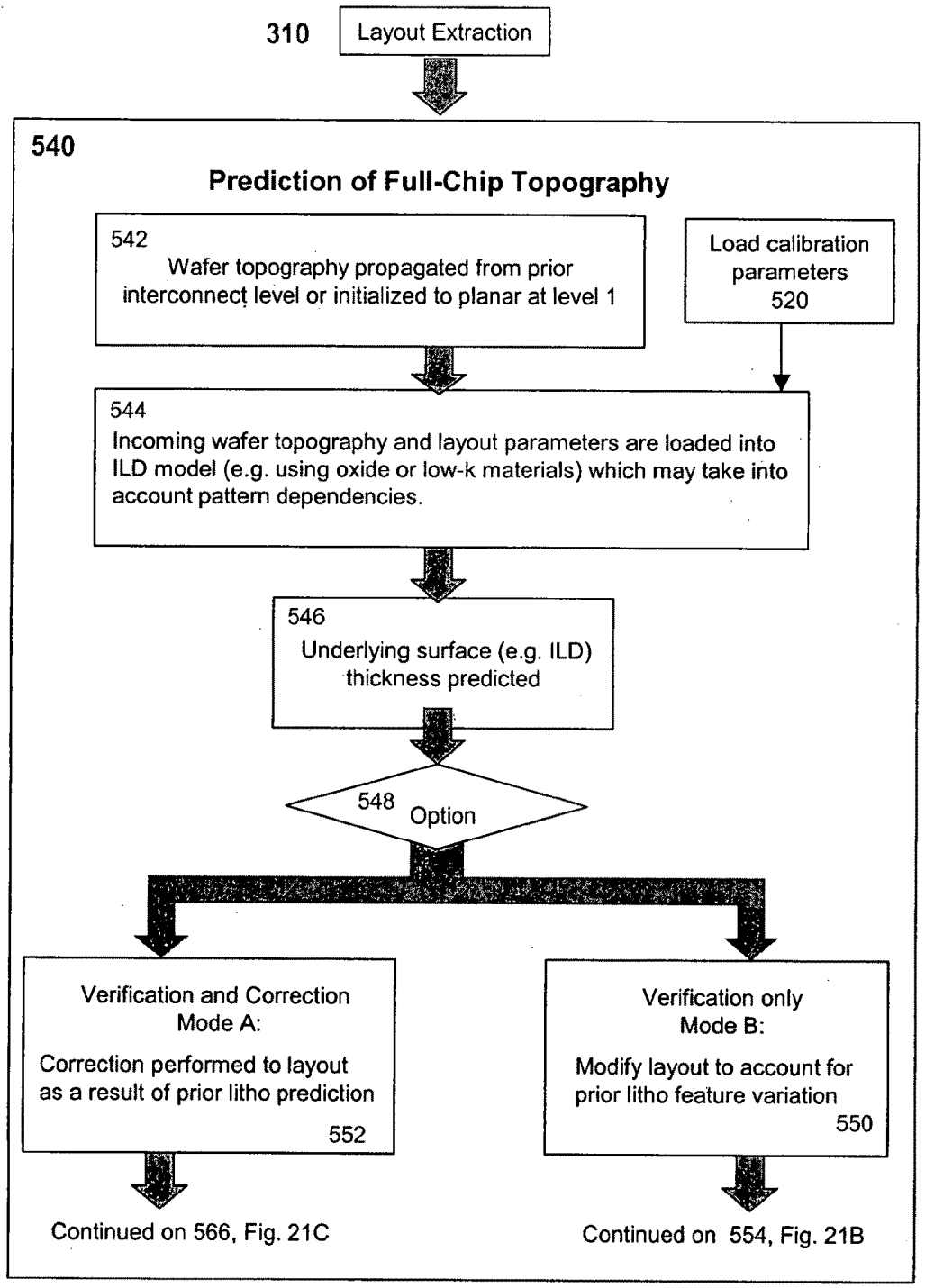
FIG. 21A illustrates steps in a prediction of full-chip topography.
Figure 21B:
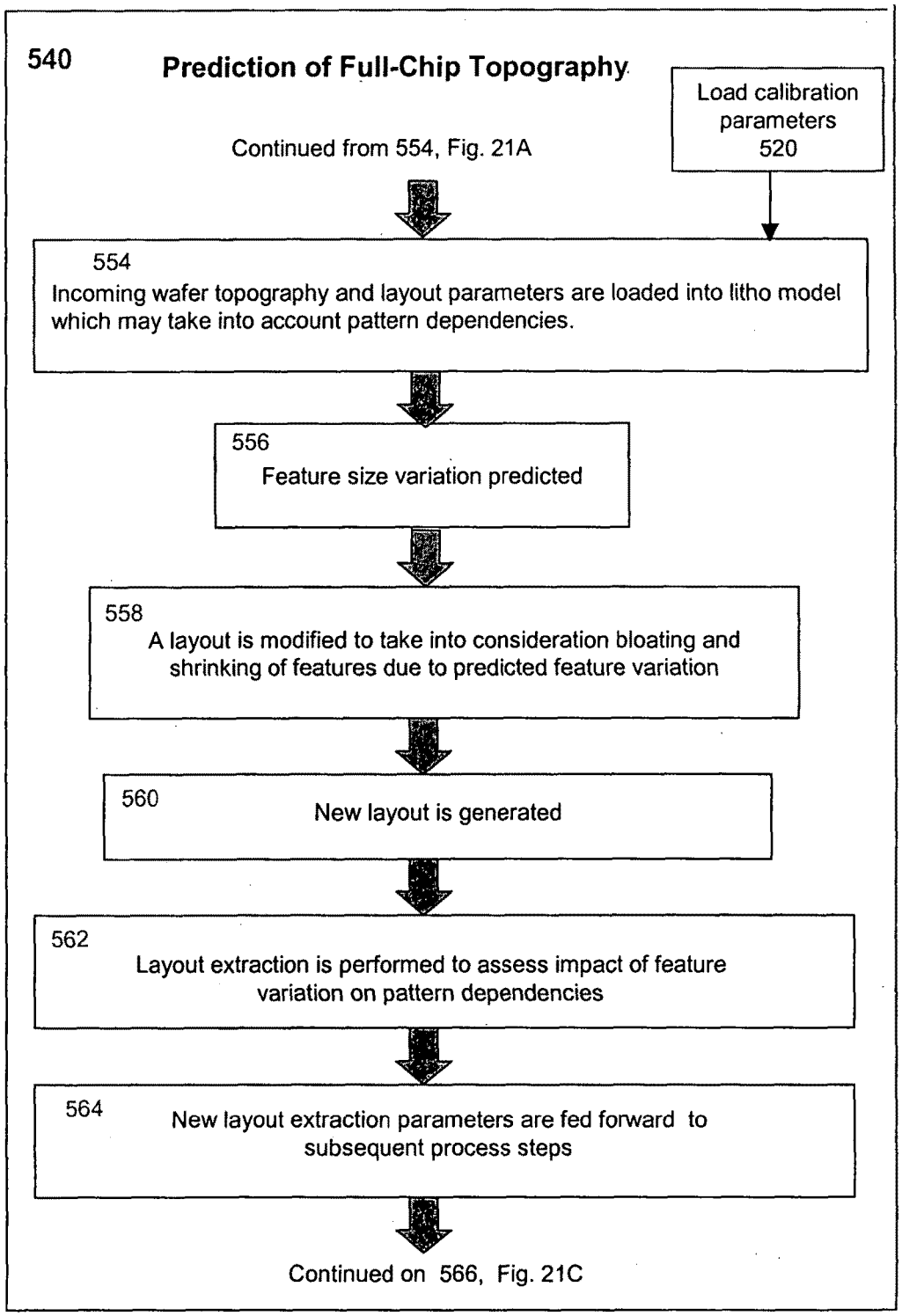
FIG. 21B illustrates a continuation of the steps in prediction of chip topography.

The steps that constitute the feed-forward prediction component 540 are described in FIG. 21A. A damascene process flow for predicting pre-lithography wafer topography is used to illustrate how a prediction may work but any process flow or single process step may be substituted. To simplify the process flow descriptions, pre- and post-processing wafer treatments that do not significantly affect wafer topography are ignored. Also to simplify the example to a generic damascene flow, the term interconnect level is used as a global reference to include both metal and via levels. Any additional oxide deposition or etch steps to form vias are not shown. The damascene flows illustrated can be easily extended to dual-damascene and other damascene process flows.

The extraction 310 is loaded into the prediction component 540. The prediction component then retrieves the incoming wafer topography 542. For interconnect levels greater than 1, this is the last process step from the prior interconnect level. For the first interconnect level, either the incoming wafer topography can be predicted using pattern dependent modeling of component creation or initialized to planar.

Both the incoming topography and extracted parameters are loaded into an ILD process model to predict the resulting wafer surface 544. ILD deposition models may include the use of oxide ($SiO_2$) or low-k material. It is recommended to include pattern-dependencies to acquire full-chip prediction, particularly when oxide CMP is inserted to planarized the ILD layer. As such, pattern-dependent oxide deposition and oxide CMP models may be used and may require the loading of model calibration parameters 520. The use of the prediction component in this manner may also facilitate the introduction of low-k materials into a damascene process flow. The result of this step is a prediction of the final ILD thickness 546.

Figure 21C:
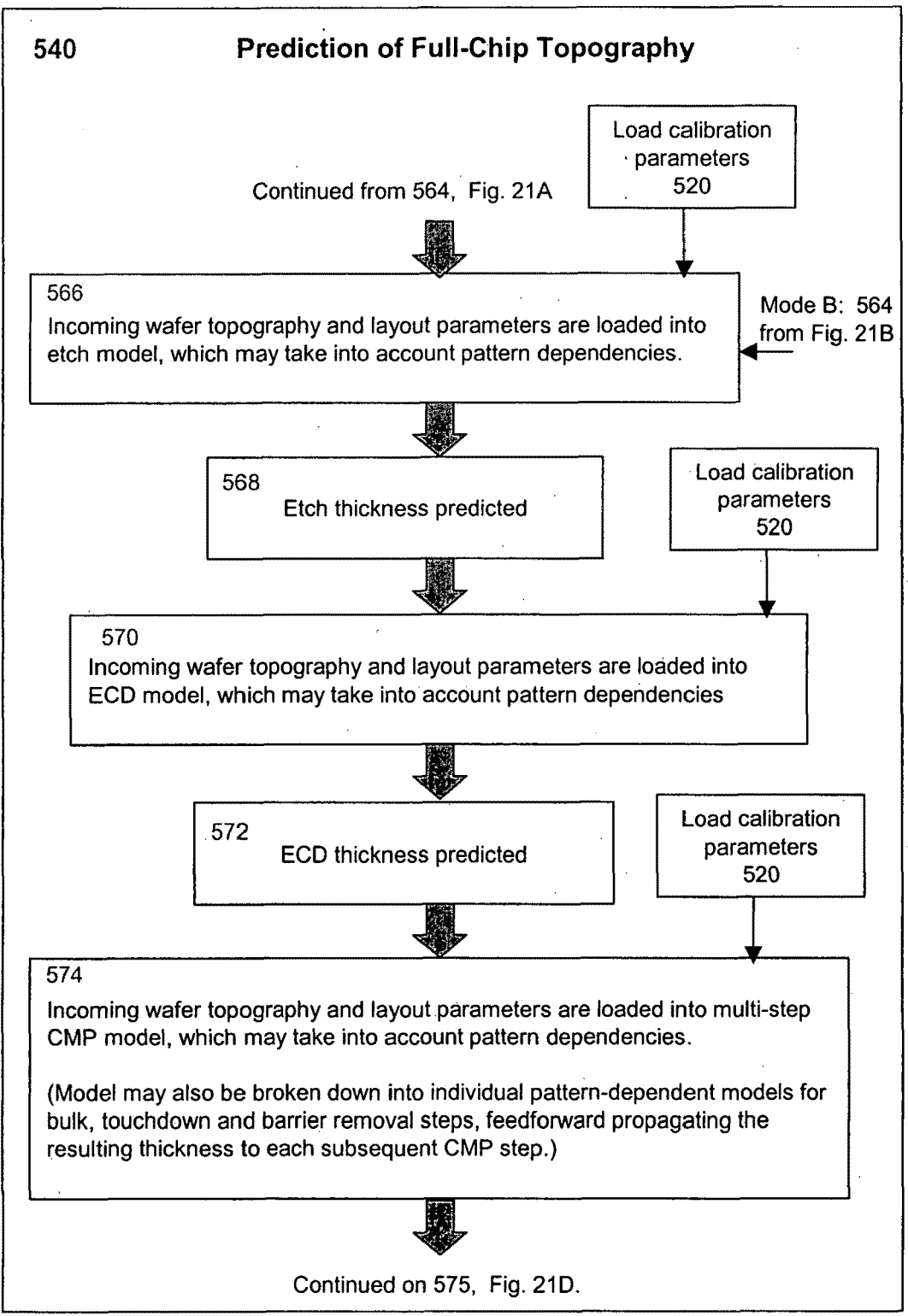
FIG. 21C illustrates a continuation of the steps in prediction of chip topography.
Figure 21D:
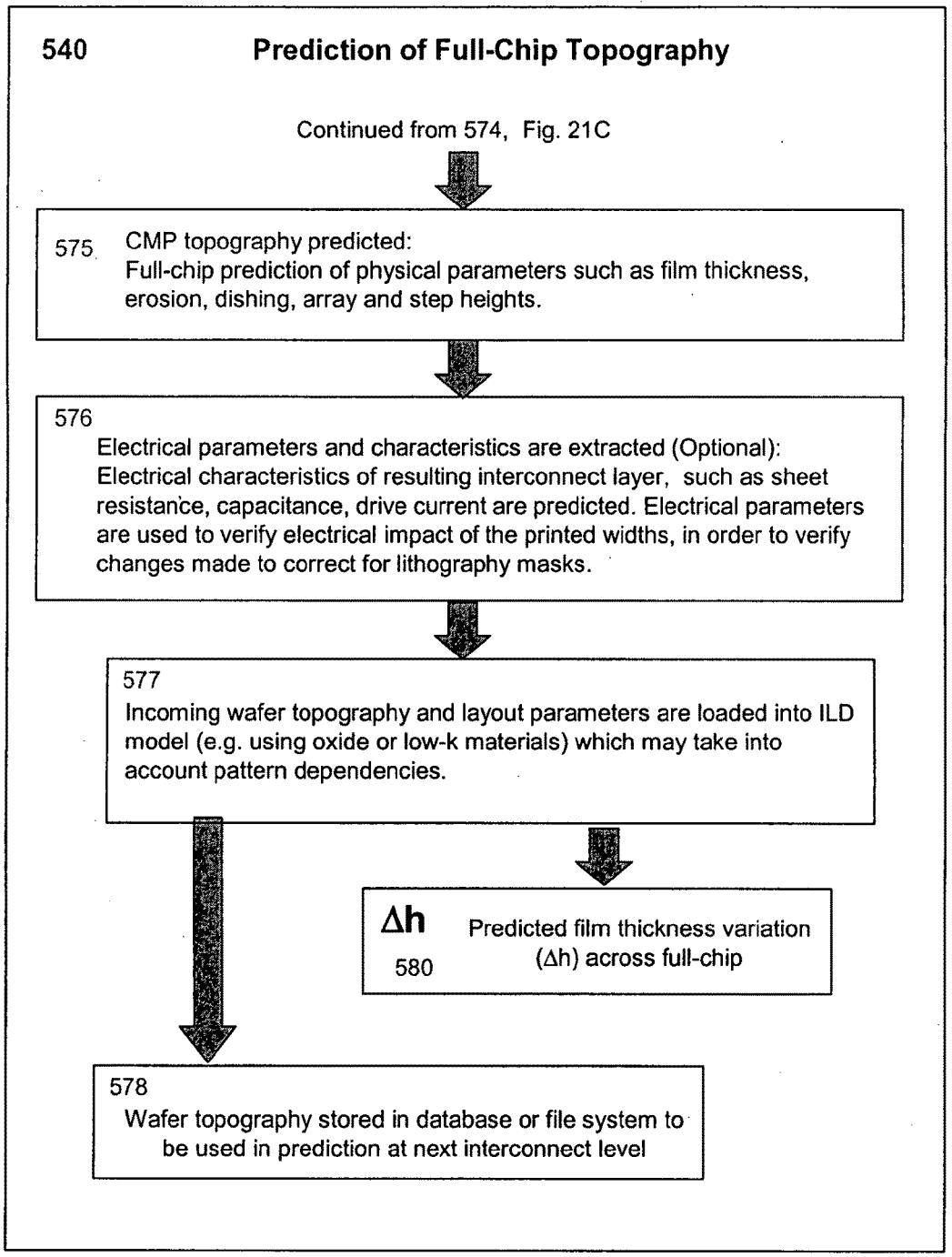
FIG. 21D illustrates a continuation of the steps in prediction of chip topography

Depending on whether the prediction is part of mode A (FIG. 11) or mode B (FIG. 12) the flow has an option 548. In mode A 552, any feature dimension variation outside of the specification for level 1 has been used to modify the design such that the printed feature dimension for level 1 matches that of the design. So for mode A, the ILD thickness 546 can be fed directly into the etch model 566 on FIG. 21C.

In mode B 550, the feature size variation that results from the lithography step needs to be used to update the layout extraction to the proper feature variation that downstream processes will receive. In this mode, the incoming wafer topography and layout parameters are loaded into the lithography model 554. It is recommended to include pattern-dependencies in the lithography model to acquire full-chip prediction and as such, model calibration parameters may be required and loaded 520. The feature size variation 556 is predicted and used to adjust layout features, shrink or bloat features, to accurately represent the result of lithography 558. The layout is generated 560 and used to generate a new extraction 562 that more accurately represents the effects of litho-based feature dimension variation. The new extraction 564 is fed forward to the etch process' step 566. For an N-level interconnect process flow prediction in model B, this step will be repeated for each lithography step so that the full impact of feature dimension variation may be observed at level N.

The ILD thickness from the prior step 566 and the layout parameters are loaded into an etch model. It is recommended to include pattern-dependencies in the etch model to acquire full-chip prediction and as such, model calibration parameters may be required and loaded 520. The etch model predicts final wafer topography 568, which, along with the layout parameters, is loaded into an ECD model 570. It is recommended to include pattern-dependencies in the ECD model 570 to acquire full-chip prediction and as such, model calibration parameters may be required and loaded 520. The result of this step is a full-chip prediction of wafer topography after plating 572. Some processes may also use an electrical chemical mechanical deposition (ECMD) step instead and the use of pattern dependent models is recommended.

The incoming wafer topography resulting from ECD and extraction parameters are loaded into the CMP process model or models 574. CMP in a damascene process may be performed over a number of process steps. A typical example is when a bulk CMP step is used to remove most of the copper, a touchdown or endpoint polish is then done to slowly clear all the copper from the field areas without significant dishing and erosion of features and finally a barrier polish is performed to remove the barrier material. It is recommended to include pattern-dependencies in the CMP model to acquire full-chip prediction and as such, model calibration parameters may be required and loaded 520. The final wafer topography that results from the CMP step or flow is generated 575. Some of the wafer topography characteristics may include thickness, surface profile, dishing and erosion.

An optional step may be to include electrical extraction or performance analysis for the current, completed interconnects level 576. Electrical characteristics that may be predicted from the full-chip CMP prediction include sheet resistance, capacitance, drive current, and, when multiple interconnect levels are considered, timing closure analysis. This step may be useful when verification is done to analyze the impact of lithography-based feature dimension variation on IC performance. Often feature dimension tolerances or specifications may not provide the level of resolution necessary to properly gauge the impact of feature dimension variation and this might be one way to gain a better characterization.

While the CMP step is the last physical process step in the prior interconnect level (e.g. level 1), the ILD deposition for the current interconnect level (e.g. level 2) needs to be predicted to acquire the wafer surface topography used in lithography prediction for the current interconnect level (e.g. level 2). Wafer topography and extracted parameters are loaded into the ILD process model to predict the resulting wafer surface or thickness 580. ILD deposition models may include the use of oxide ($SiO_2$) or low-k material. It is recommended to include pattern-dependencies to acquire full-chip prediction, particularly when oxide CMP is inserted to planarize the ILD layer. As such, pattern-dependent oxide deposition and oxide CMP models may be used and may require the loading of model calibration parameters 520. The use of the prediction component in this manner may also facilitate the introduction of low-k materials into a damascene process flow. The result of this step is a prediction of the wafer surface before photoresist is added and lithography is performed 580. The wafer surface topography is saved in a database or file system for use in prediction in subsequent interconnect levels 578. Although it is not necessary to feed wafer topography forward between interconnect levels, it is recommended, particularly in cases where an oxide CMP step is not performed after ILD deposition.

Although photoresist deposition is not explicitly shown in this flow, in cases where pattern dependencies affect planarity of photoresist, then pattern-dependent photoresist models may be incorporated between ILD deposition and lithography models (or incorporated directly into the lithography models using test-wafers and lumping the photoresist and lithography effects into one model).

d. Prediction of Feature Dimension Variation Using Lithography Models

The lithography modeling and prediction component could be considered part of the process modeling component. However the process modeling component 400 inputs pre-process wafer topography and predicts post-process wafer topography at each step in the flow. Where as the lithography component inputs incoming wafer topography, along with the design or pattern to be imaged, and predicts feature dimension variation. As such they are treated as separate components (section c. and section d.) in this description.

Figure 22A:
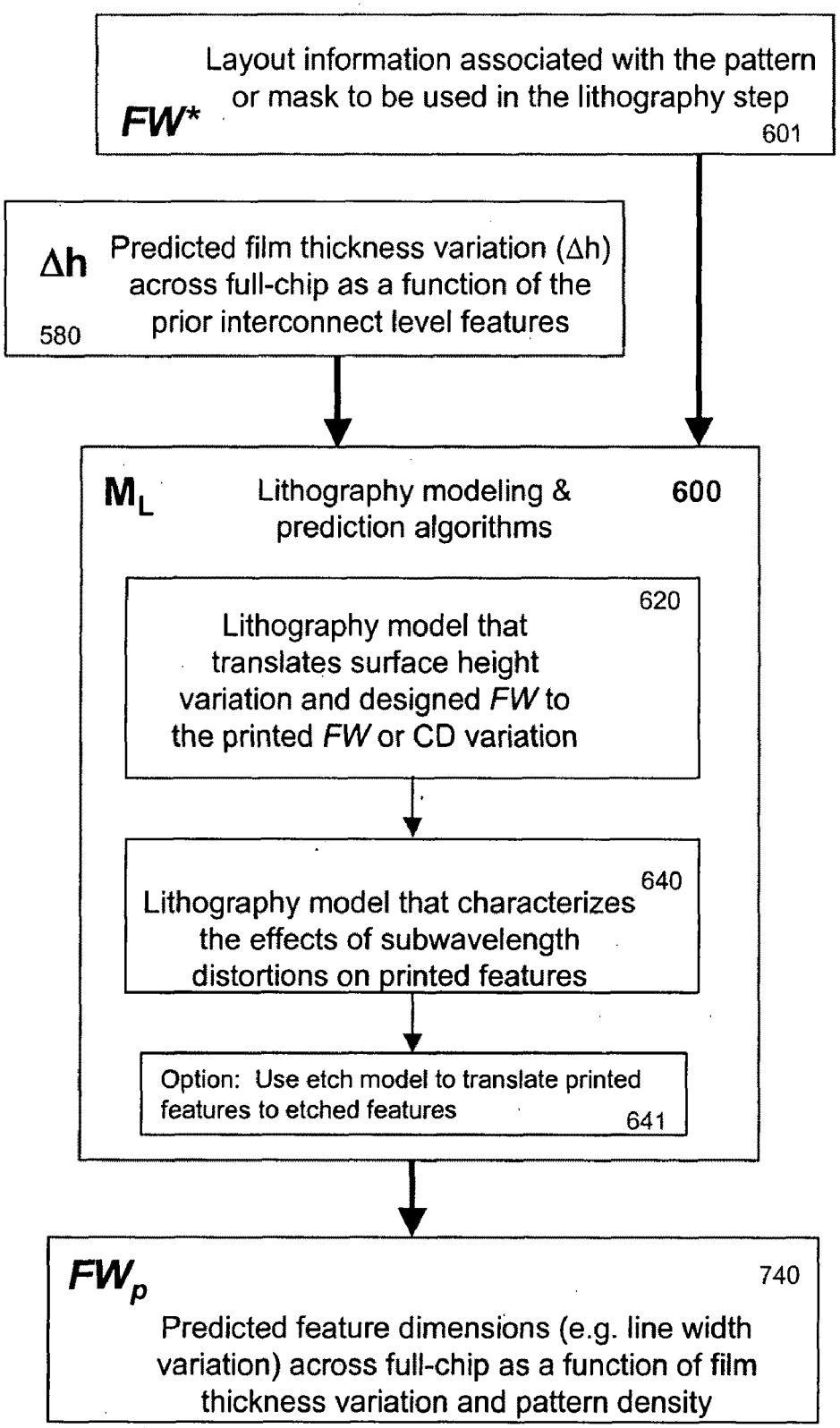
FIG. 22A illustrates an overview of a prediction of feature dimensions (e.g. line widths) resulting from lithography process steps or flows.

As illustrated in FIG. 22A, the predicted wafer topography variation ($\Delta h$) across the chip 580 (e.g., the topography resulting from processing levels 1 through N) and the current layout information 601, design or extraction, (e.g., the design from level N+1) are input into lithography modeling component 600 which is used to map the predicted wafer topography and desired (or designed) feature width (FW*) to the lithography printed feature dimension (for example, feature width ($FW_p$)) variation across the chip 740. The lithography process flow 600 may also characterize pattern dependencies 640 in lithography due to sub-wavelength distortions using data from test wafers or optical mathematical relationships. This mapping may be computed within the system or the results from optical proximity correction (OPC) may be computed, loaded into the system and used. The result is that predicted variation in printed feature dimension would address width variation due to topography and distortion, shown respectively in FIGS. 8 and 9.

Figure 22B:
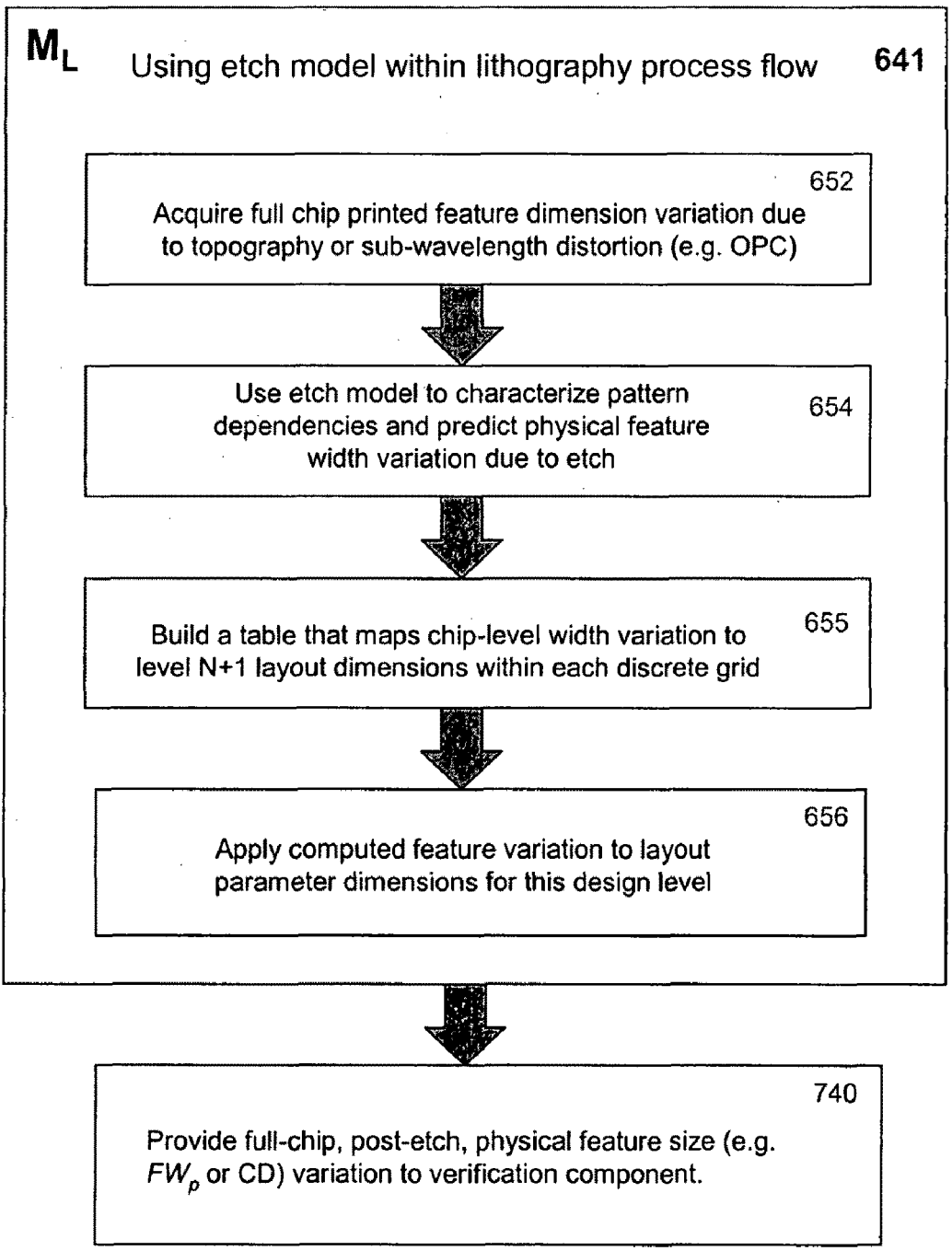
FIG. 22B illustrates a mapping provided by a etch prediction component

To capture pattern dependent width variation due to etch processing or to map topographical variation to etched features, an etch model may be used 641 to map printed features to the physically etched features. As shown in FIG. 22B, component 641 acquires 651 the printed feature variation that results from topographical 620 and distortion 640. An etch model is used to characterize pattern dependencies and map full-chip printed feature variation to physical or etched feature variation. The etch model prediction may also include etch characteristics such as trench depth, sidewall angle and trench width. A table is constructed that maps 655 printed variation from each discrete grid from layout extraction to physical feature variation. The variation may also be applied 656 to the layout features within each grid to adjust the full-chip design to the printed and physical variation, depending on whether the prediction resolution needs to be at the grid or discrete feature level. (When 600 is used in conjunction with verification component 810, the grid level feature variation is applied to the discrete layout features and step 656 may be skipped). By using components 620, 640 and 641 within the lithography flow model 600, the primary contributors to feature width variation may be characterized and predicted 740. The optional etch component 641 may be used with either of the two approaches described in the following paragraphs.

Figure 23:
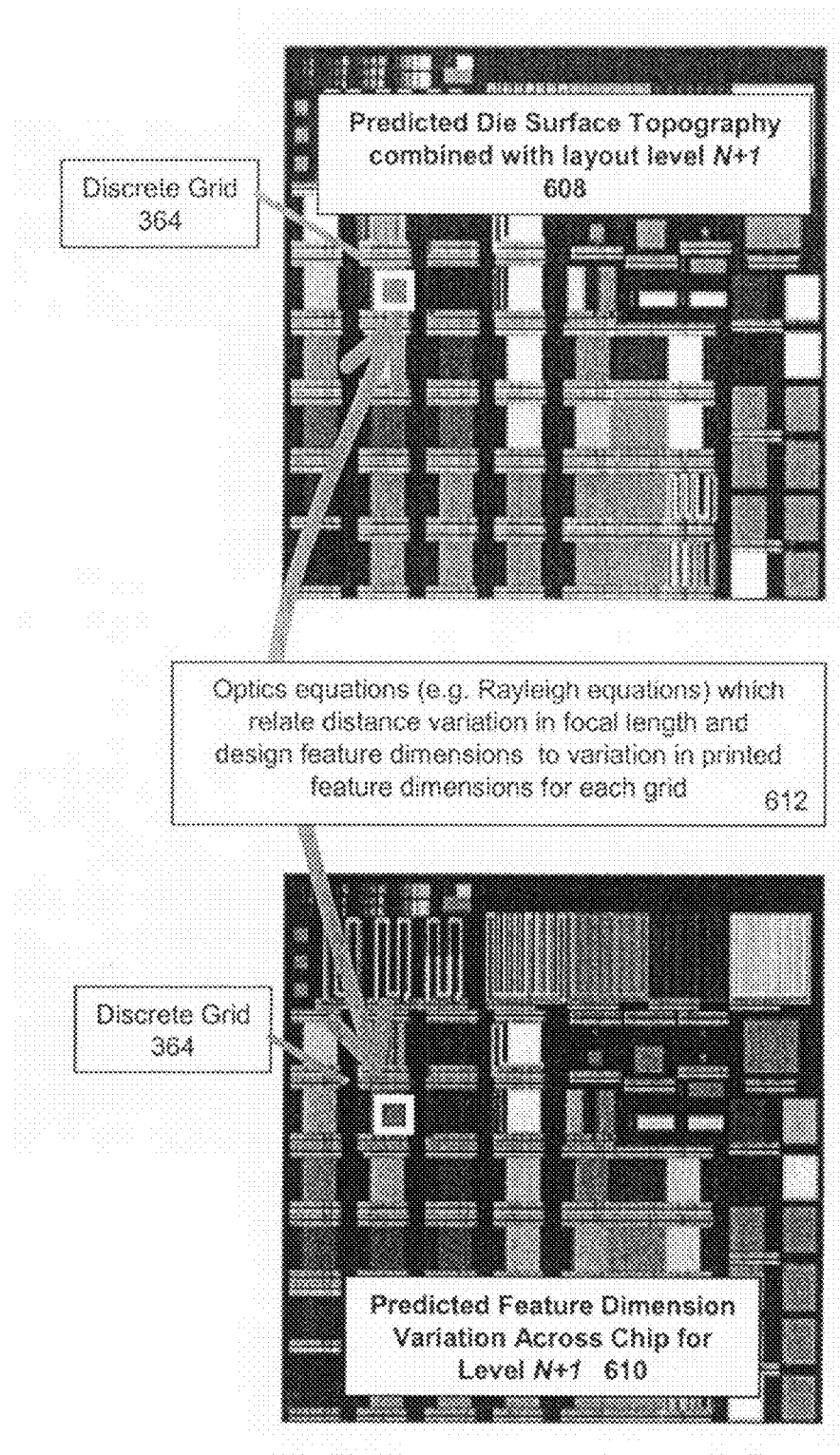
FIG. 23 illustrates a mapping provided by a lithography prediction component

A graphical illustration that depicts the current layout information projected onto the predicted surface topography for a die 608 is shown in FIG. 23. The die is discretized to the level chosen in step 312 of layout extraction, which controls the resolution of the thickness and feature dimension variation prediction. The lithography modeling component 600 maps 612 the designed width and die surface height at that grid location to corresponding feature variation (for example, in FW or CD) at the same grid location 364. The mapping does this for all grid locations across the die, resulting in a full die map of feature dimension variation.

Two ways for computing feature dimension variation from chip topography are described. The first approach, shown in FIGS. 24 and 25, uses conventional optical proximity correction type tools to determine the effects of feature density and optical interference during the actual imaging. The second approach, shown in FIGS. 26 and 27, uses test wafers and calibration methods to characterize both topographical and pattern interference effects due to sub-wavelength distortion.

Figure 24:
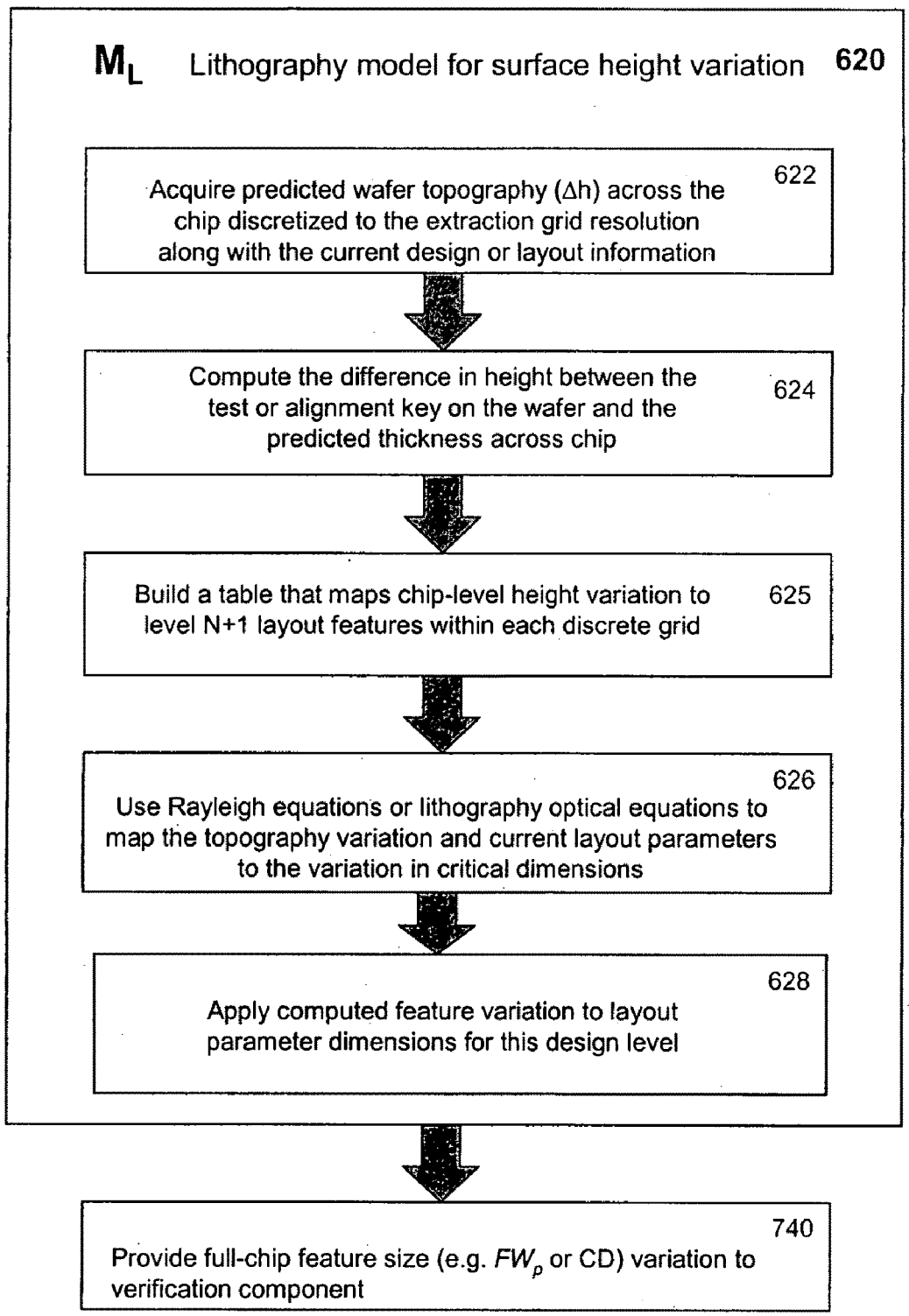
FIG. 24 illustrates steps in generating a feature dimension variation prediction with regard to variation in chip topography

FIG. 24 describes the steps for mapping chip surface height or topography variation and current design features to variation in the lithography printed or imaged feature dimensions of those features 620. The predicted full-chip topography ($\Delta h$), consisting of each discrete element across the die, is loaded 622 into the component 620 along with the current design or extraction 601. The difference between chip topography and a common reference, for example a test or alignment key near the edge of the die, is computed 624. Since the imaging system focal length may be adjusted to an alignment or test key, this would allow for rapid computation of features within and outside the depth-of-focus. A table is assembled that maps chip-level height variation to layout features (e.g., metal level N+1) within each discrete grid. There are a number of optical mathematical expressions for relating focal distance to feature resolution that may be used to map 626 chip surface topography and design features. Similarly, there are tools for mapping layout extraction parameters to the associated feature dimension variation for each feature, grid, or an aggregate metric (e.g. maximum or mean) for the entire die. A common relationship may be derived from the well-known Rayleigh equations for optics, using $k_1$ and $k_2$ constants appropriately derived or provided for a particular lithography tool. The variation in feature dimension can be applied to the layout features within the grid resolution of the chip surface prediction to generate a full-chip prediction of printed feature dimension (e.g. FW or CD) 628. The full-chip prediction of printed feature dimensions (e.g. line widths) is provided 740 to the verification component 800.

Figure 25:
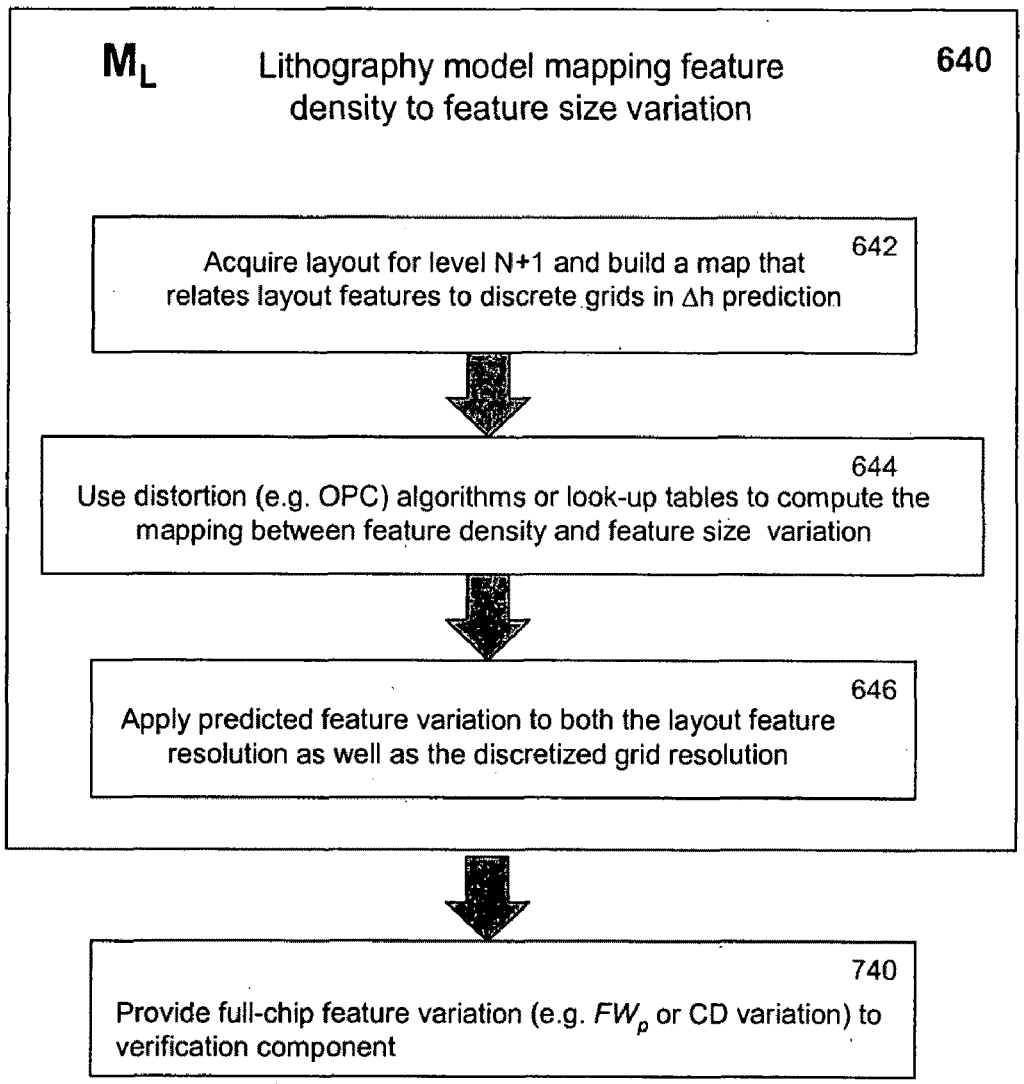
FIG. 25 illustrates steps in generating a feature dimension variation prediction with regard to variation in chip feature density

FIG. 25 describes the steps for mapping pattern feature densities to variation in lithography printed or imaged feature dimensions 640. The layout for the current design level is loaded and a table is assembled that maps layout features to discrete grids in chip surface topography prediction $\Delta h$. Conventional optical proximity algorithms, many of which are commercially available in EDA tools, are used to map feature density to feature dimension variation 644. The computed feature dimension variation is at the layout feature resolution that is provided at both the layout resolution and extraction resolution 646. The resulting computation of feature dimension or feature width variation is then provided 740 to the verification component 800.

Figure 26A:
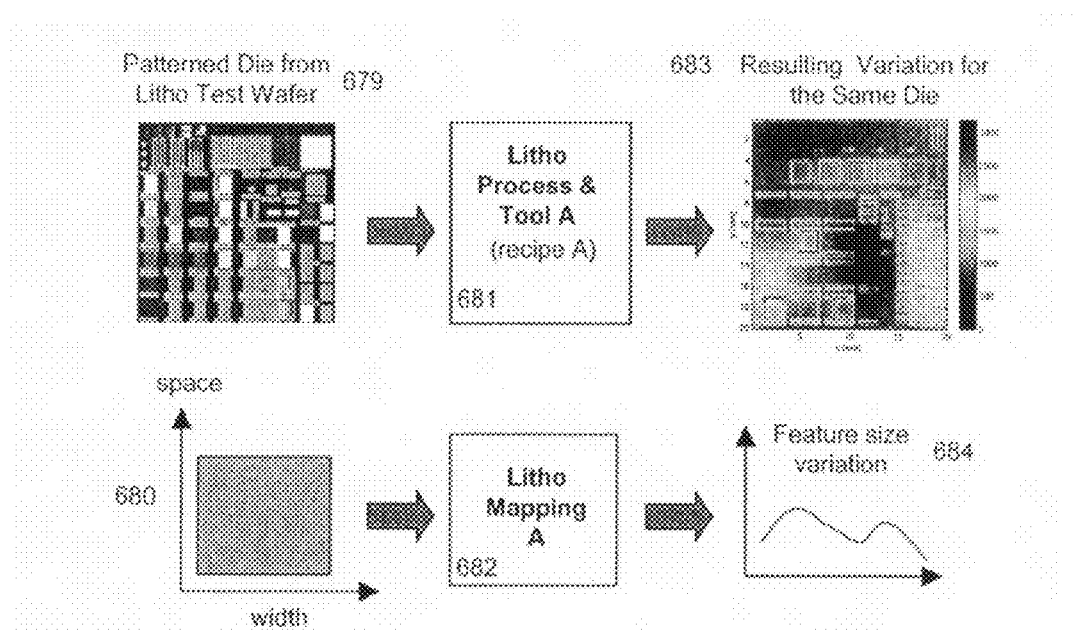
FIG. 26A illustrates the use of test wafers to calibrate a lithography model to a particular tool and recipe.
Figure 26B:
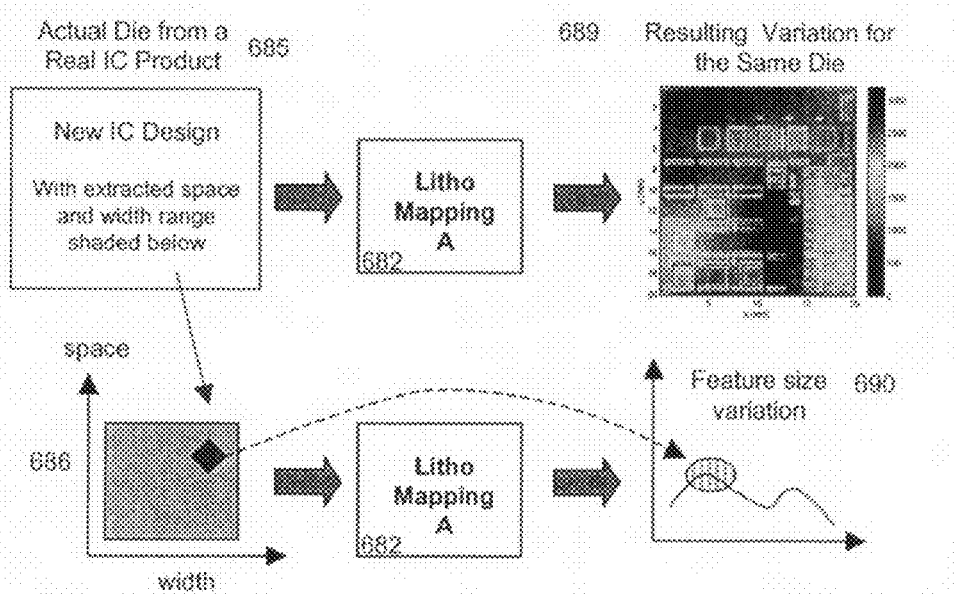
FIG. 26B illustrates the use of calibrated lithography models to predict feature dimension variation.
Figure 27:
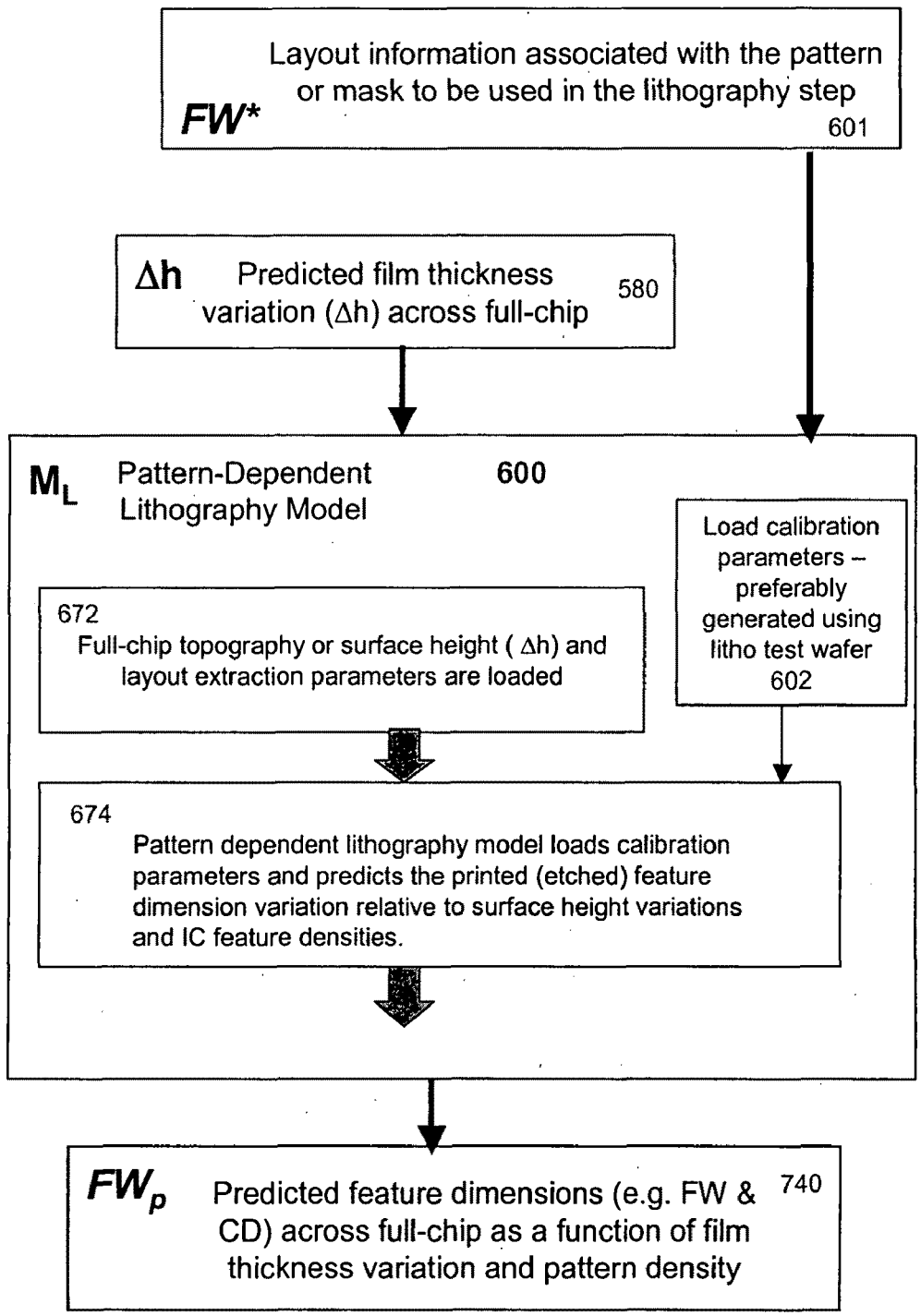
FIG. 27 illustrates steps in using calibrated lithography models to predict feature dimension variation.

The second approach to implementing the lithography modeling and prediction component 600 is illustrated in FIGS. 26 and 27. The second approach uses methods described in section c. to generate a calibrated lithography model for relating surface height, designed CD, and feature width FW, and pattern interference effects to feature dimension variation (e.g. CD and FW). The model is calibrated using the steps described in section c. and illustrated in the flow diagram of FIG. 20.

The use of test wafers for calibrating a lithography model for a particular tool and settings are illustrated in FIG. 26A. A lithography test wafer die 679 is patterned with a range of width and space values 680 (density can be computed given both FW and FS) that may include one or more levels of structures. The structures on these levels may be chosen to represent multi-layer effects of variations in line widths and lines, and via chains and other structures, to capture pattern dependencies associated with design levels of interest (e.g. interconnect levels). Further details and examples of test wafer structures that may be used are provided in section f. The test wafer is processed on a lithography tool using a given recipe 681 and then a subsequent etch process is performed to remove material according to critical dimensions printed during lithography. The resulting variation in feature dimensions (e.g. CD or FW is measured across the chip 683 using a metrology tool 684 (e.g., an SEM, a physical surface profiling tool, or an optical feature profiling tool). The measured parameters are used to calibrate a lithography model that provides the mapping 682 between the two spaces 680 and 684. This mapping, dictated by the calibration model parameters, may be considered a model that maps a wide range of feature and surface topography values 680 to a particular feature size variation 684 for this tool and recipe.

These mappings or calibrated models may be used for predicting feature size variation for new IC designs, as shown in FIG. 26B. The width, space (and density) of features that fall within the range 686 spanned by the test die are extracted 685 from a new IC layout. The extracted features 685 for spatial locations across the chip 486 are input into the mapping 682 and an accurate prediction of feature size variation across the chip 689 and 690 can be acquired for a given tool and a given recipe before processing of the new IC design.

The predicted process variation may also be fed into electrical models or simulations to assess the impact of processing on the electrical performance of the chip, similarly to what is shown in FIG. 19B. Some of the electrical parameters that may be computed using the models include variation in sheet resistance, resistance, capacitance, interconnect RC delay, voltage drop, drive current loss, dielectric constant, timing closure, signal integrity, IR drop or cross-talk noise. These predictions can be used to determine the impact of feature size variation on electrical performance.

FIG. 27 describes the steps for computing predicted feature dimension variation using pattern-dependent lithography models. This approach may also use lithography test wafers, examples of which are provided in section f., to calibrate the model to, for example, a particular lithography tool, features, or a stack of levels below the current design level, and photoresist type. The predicted (or in some cases, measured) chip level surface height variation $\Delta h$ from the prior process step or steps (e.g. ILD deposition, oxide CMP, or photoresist spin-on) is loaded 580. The layout information associated with the current design level, which may consist of layouts, extractions, or a combination of them, is also loaded from file system or database 601. The calibration model parameters are loaded into the model for prediction 602. A pattern-dependent lithography model is used to predict feature size variation for the given design layout 674 and provides 740 it to the verification component 800.

e. Verification and Correction of Lithographic Feature Dimension Variation

The predicted feature dimensions are then compared to the design specifications to verify that none of the printed (or etched) features would exceed the specifications and tolerances for the design. Those sites or features that do exceed the tolerances are identified and their coordinates stored. As described in FIG. 10, the feature width variations may also be used to modify a design file, which can be fed into an electrical simulation to examine the electrical impact on performance. The feature width variation may also be combined with topographical variation for full interconnect level electrical characterization as well. Within the context of the methods described here, electrical impact also includes full-chip prediction of sheet resistance, total copper loss, capacitance, drive current and timing closure parameters. In the verification mode, modification to the design file of the feature width variation is primarily for simulation purposes and to simply reflect the variation induced by manufacturing. Such design files would not be used for mask creation. To correct for the predicted feature width variation, the following mask correction approach may be performed.

The user may also choose to have the system correct the designed features used in making the masks so that the actual printed dimensions would equal the desired or designed values. The corrected design is then used during tape-out to construct masks such that the actual lithography printed dimensions and features yield those originally designed and desired. The following paragraphs and figures describe the verification and correction components.

Figure 28:
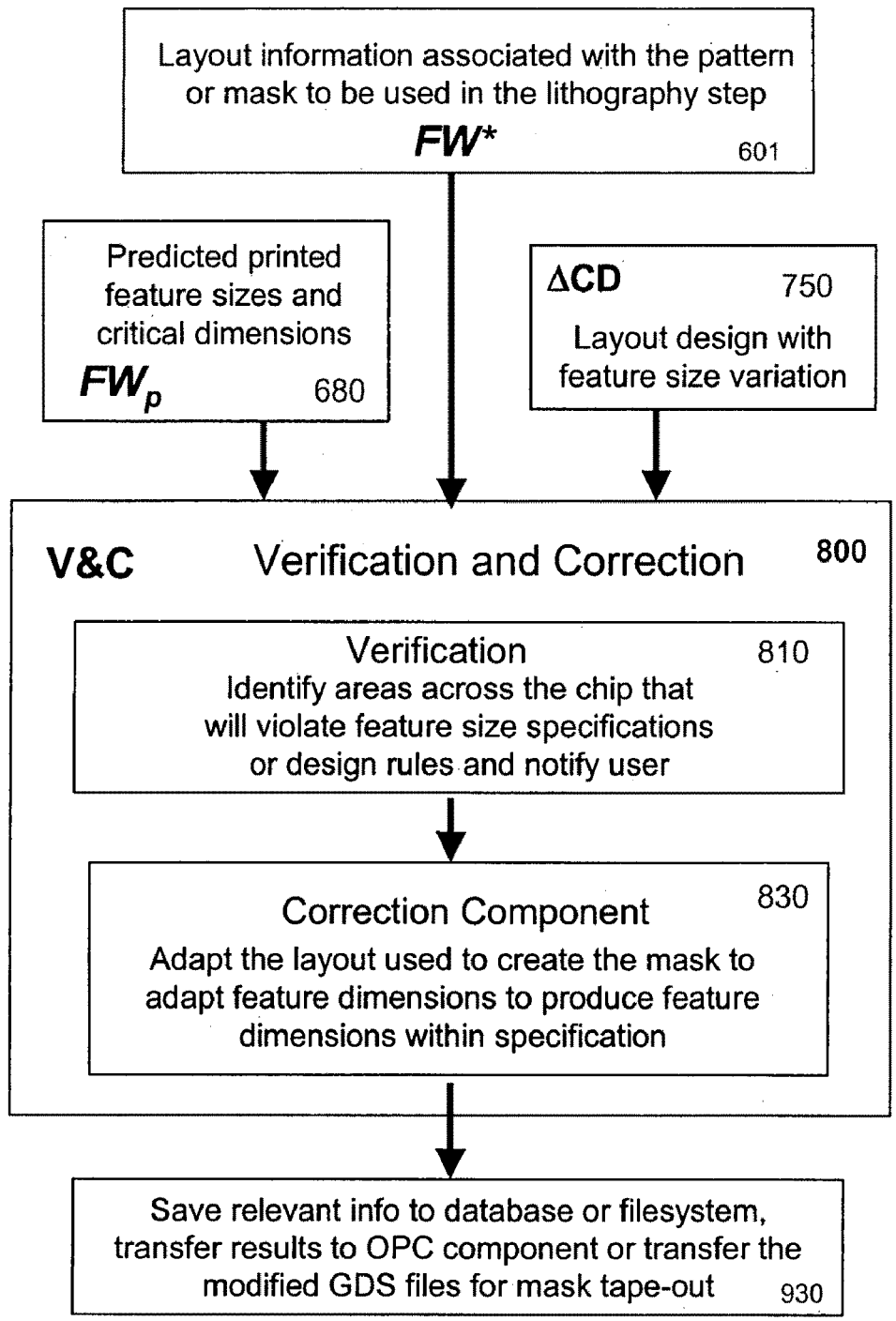
FIG. 28 illustrates an overview of a verification and correction component.

A flow diagram of how the verification and correction component fits into the overall concept is shown in FIG. 28. Layout information, which may include design and extraction data 601, predicted critical dimensions, and feature sizes 680, are loaded into the verification and correction component 800. The critical dimension and feature size specifications are also loaded 750 and optionally, electrical specifications may be loaded for comparison with simulated electrical performance of the printed circuit dimensions. Verification performs a comparison between predicted and specified dimensions and identifies those features that exceed design tolerances (e.g., feature size variations or electrical performance). The verification component may be used alone or in conjunction with the correction component 830 to modify the layout (e.g., GDS file) to produce the desired printed circuit dimensions. Depending on whether either or both verification and correction components are used, the results may be saved to a file system or database for further viewing and analysis by the user 930. When correction 830 is used, the resulting layout may be further tested for sub-wavelength optical distortion and optical proximity correction or directly sent in the form of a GDS file to the mask tape-out process, the first step of mask creation 930.

The verification component may be implemented in three ways depending upon how the user has specified the grid resolution of layout extraction 312, which also defines the resolution of the topography prediction. As described in section a., a finer grid resolution during extraction generally provides a more accurate representation of the minimum feature sizes on the chip. However there is a significant increase in the computational time and resources necessary to shrink grid size to finer features. It is left to the user to determine the correct tradeoff; however the following paragraphs provide two approaches to verification that address grid resolution larger (shown in FIG. 29A) than the feature dimensions and smaller (shown in FIG. 29B) than the feature dimensions. It is unlikely that one could choose a single grid resolution that would accommodate all IC features. However in the case that hierarchical grid resolution is tailored to underlying feature size, a method is also shown in FIG. 29C for verification when the grid resolution matches the feature resolution or it is computationally necessary to use the grid resolution.

In all cases, feature width variation may be imported into electrical simulation or extraction tools to characterize the electrical impact as well as the physical impact. It may also be beneficial to verify the electrical performance of a complete interconnect level and as such, one may combine topographical variation from subsequent ECD or CMP steps and import both variation calculations into electrical extraction tools. Such electrical characterization could be performed at the full-chip level or for some critical sub-portion of the circuit.

Figure 29B:
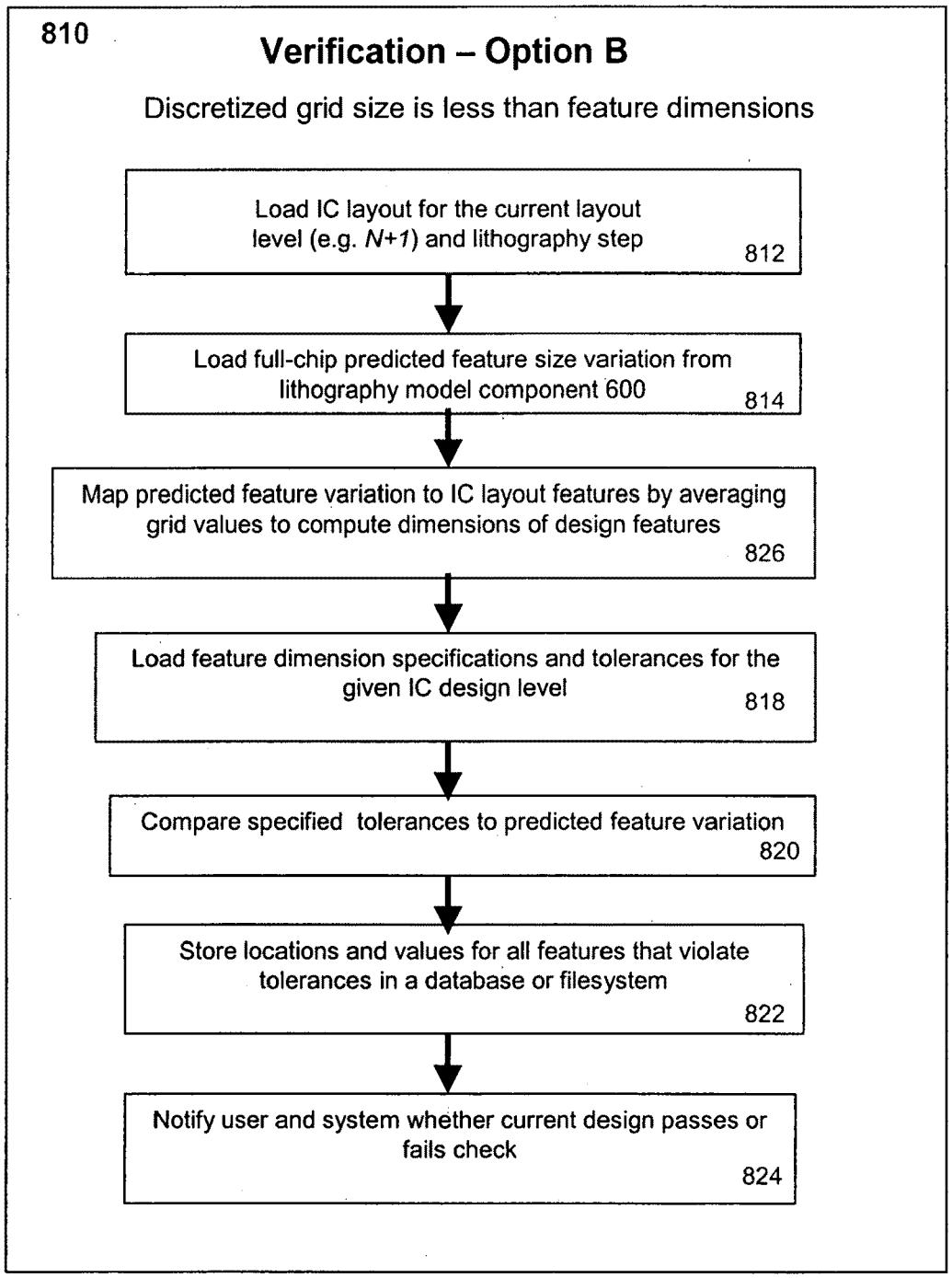
FIG. 29B illustrates steps in verification option B.
Figure 29C:
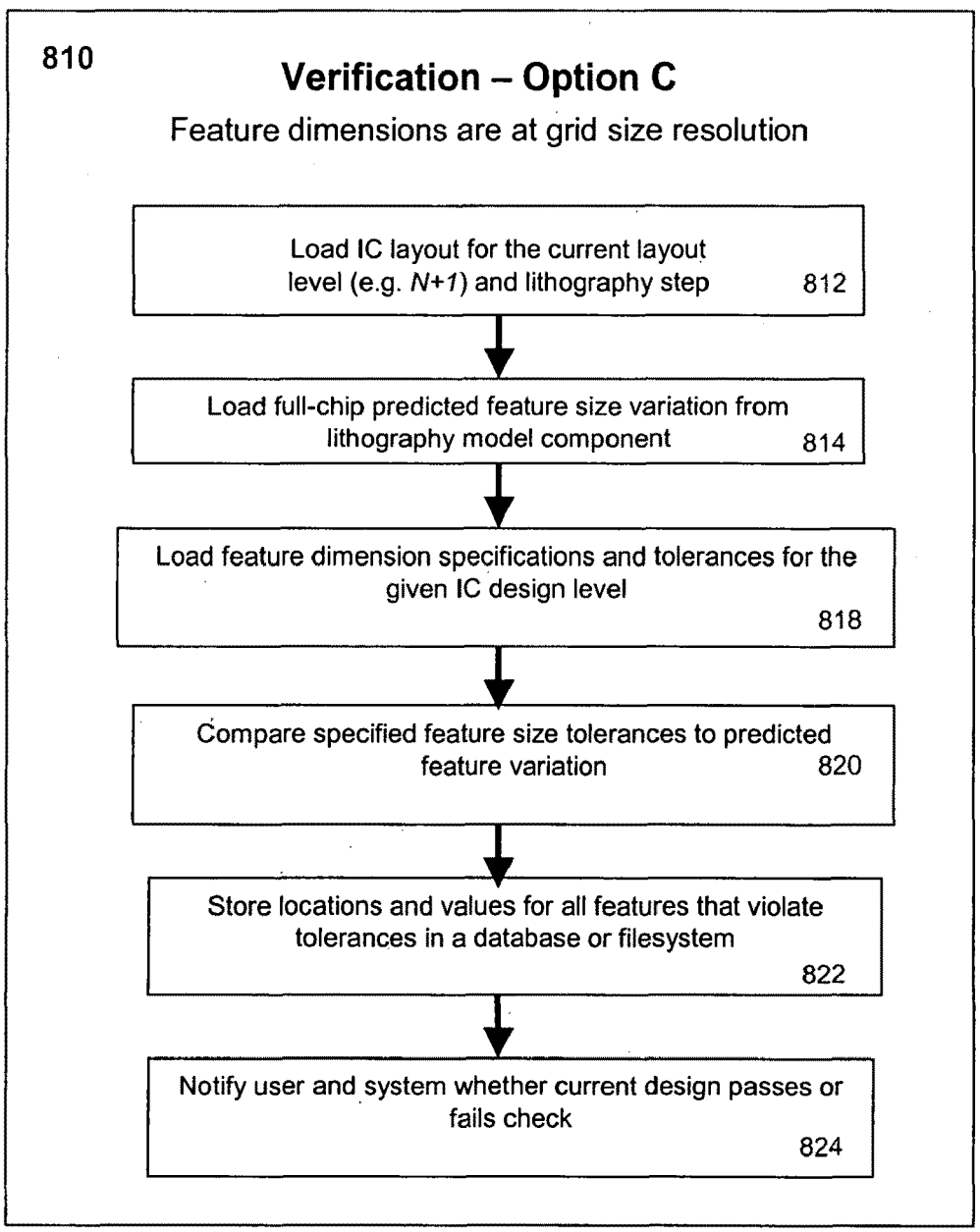
FIG. 29C illustrates steps in verification option C.
Figure 29D:
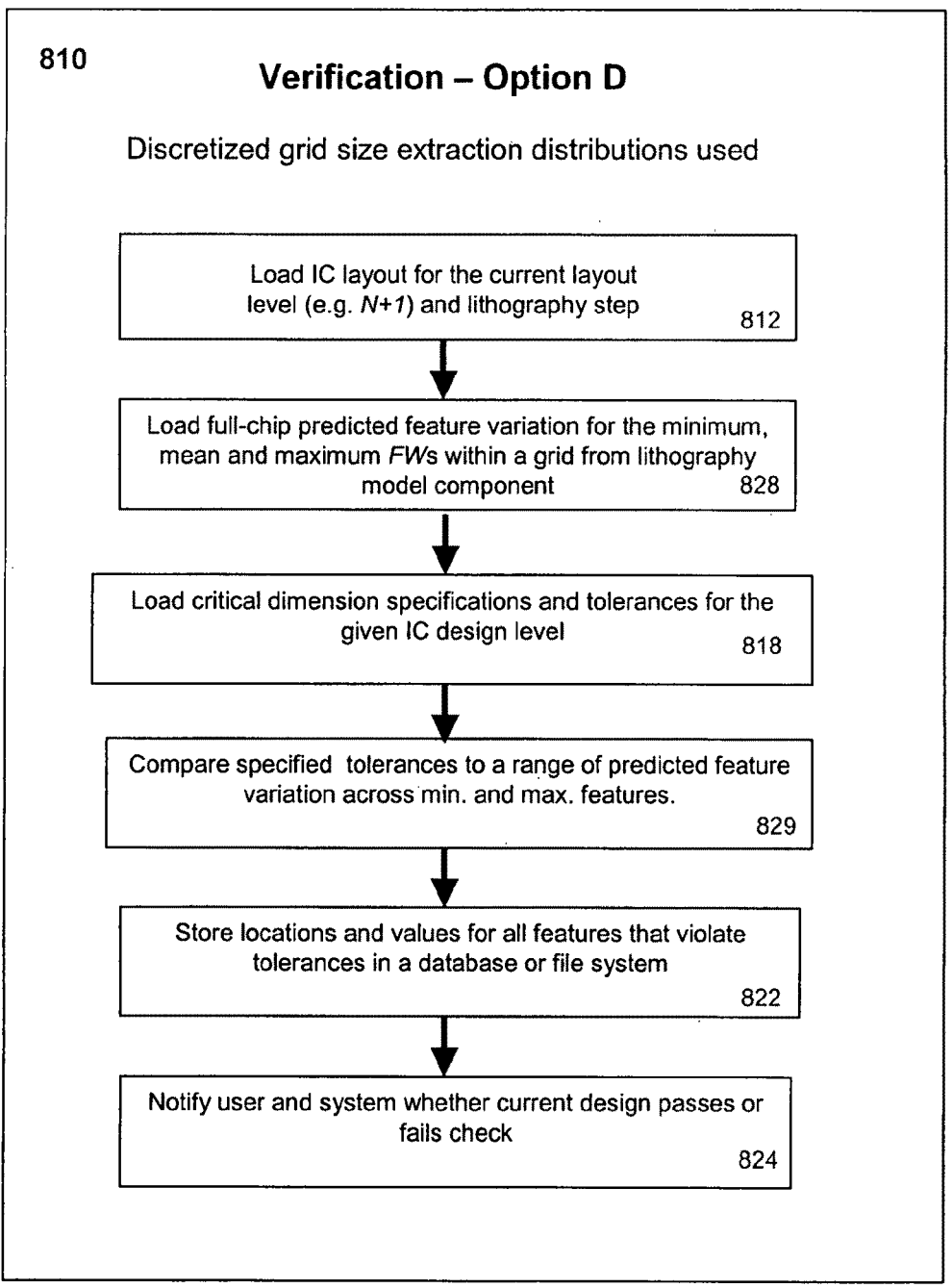
FIG. 29D illustrates steps in verification option D.

Another approach is described in FIG. 29D that uses a statistical description of each grid (e.g. maximum, minimum, and mean feature size, or density) to determine if any features or the chip will violate tolerances. While computationally much faster, this approach may provide less accuracy than the approaches in FIGS. 29A, 29B and 29C in terms of modifying the individual features within the discrete grids. In this approach, a general heuristic is used to change features relative the distribution for that grid (e.g., shrink the minimum features within a grid by 10%).

Verification for discrete grid sizes greater than the minimum IC dimensions is described in FIG. 29A. In the first step, the design layout for the current layout level (e.g., interconnect level N+1) and the lithography step are loaded 812. The full-chip predicted feature dimension variation 680 from lithography is also loaded 814. The predicted variation for each grid is apportioned to the features within the grid according to the (possibly probabilistic) distribution of feature dimensions within the grid 816. For interconnect levels, much of this apportionment may be the shrinking and bloating of lines. This step 816 is done to provide a common basis for comparison between the layout feature and predicted dimensions. The design specifications and tolerances for the chip or given IC level are loaded into the system 818. A comparison is made between the mapped variation from step 816 and the specifications 820 and those values that exceed the given tolerance are stored 822. The user is then notified whether the current design has any areas that exceed the tolerance and, if not, the design is certified as passing the verification check.

Verification for discrete grid sizes less than the minimum IC dimensions is described for Option A in FIG. 29B. The only difference between FIGS. 29A and 29B is the third step 826 where, in FIG. 29B, the values for discrete grids are averaged over a feature dimension to compute a predicted value at the same resolution as the layout. This is done to provide a common basis for comparison between the layout feature and predicted dimensions.

Verification for discrete grid sizes that are equal to the minimum IC dimensions is described for Option C in FIG. 29C. The only difference between FIG. 29C and FIGS. 29A and 29B is the removal of any need to transform the predicted values to the same resolution as the layout and as such, there is no need for any step 816 or step 826. Additionally this approach can be used with a general heuristic that checks for violations at the extraction resolution, computes corrections (in 830 of FIG. 30) and applies them to all features within the grid (e.g., shrink all widths within the grid by 10%).

Another option, Option D, which is described in FIG. 29D, is computationally simpler than the other described methods but may provide a less accurate assessment of feature dimensions. Rather than transform the grid resolution to the layout resolution, the minimum, maximum, and mean widths or feature sizes are used to generate a distribution of predicted feature variation for each grid 828. The feature size design specifications and tolerances are compared 829 with the distribution of feature dimension variation computed in 828 and the corrections (in 830 of FIG. 30) are applied using a heuristic (e.g., bloat the minimum line widths by 10%). Otherwise, the steps for Options C and D are very similar.

Figure 30:
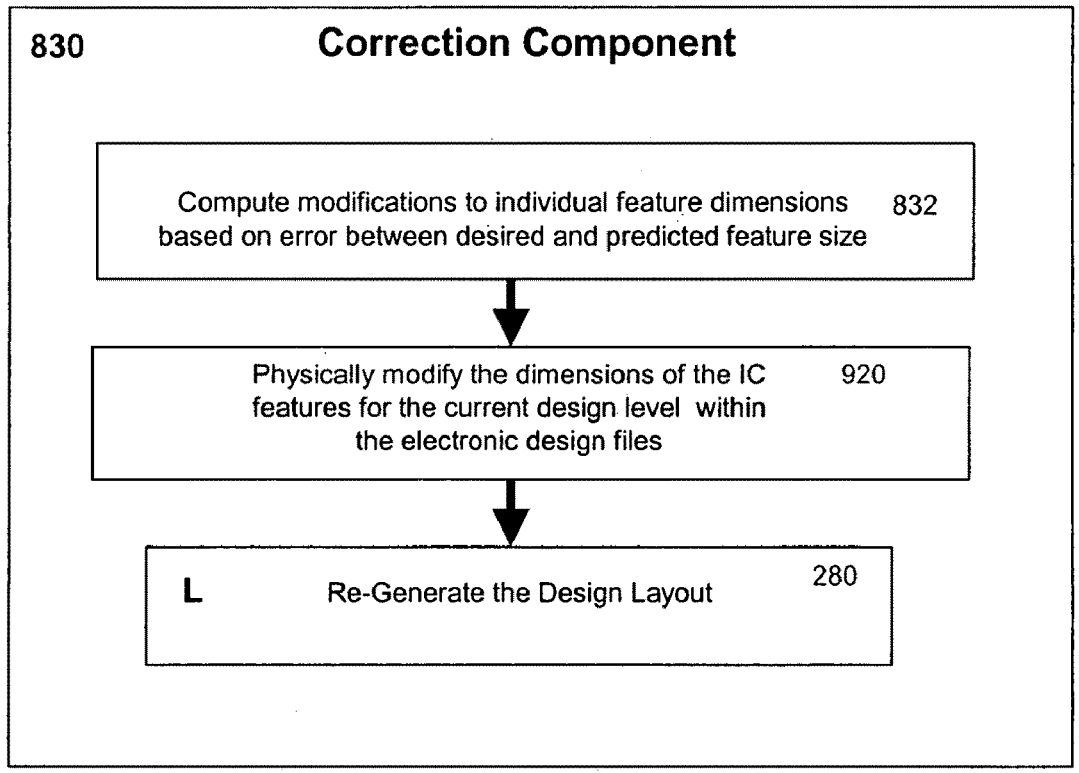
FIG. 30 illustrates an overview of a correction component.

Verification results may be provided to the correction component 830, as illustrated in FIG. 30. In this component, modifications are computed for individual feature dimensions that exceed the design tolerances 832 and are used to physically modify feature dimensions in the electronic design layout to produce the desired printed or etched feature dimensions 920. In certain cases, dummy fill or other geometries may need to be repositioned. The design layout is then re-generated 280 and if dummy fill is modified significantly, a new extraction performed.

Figure 31:
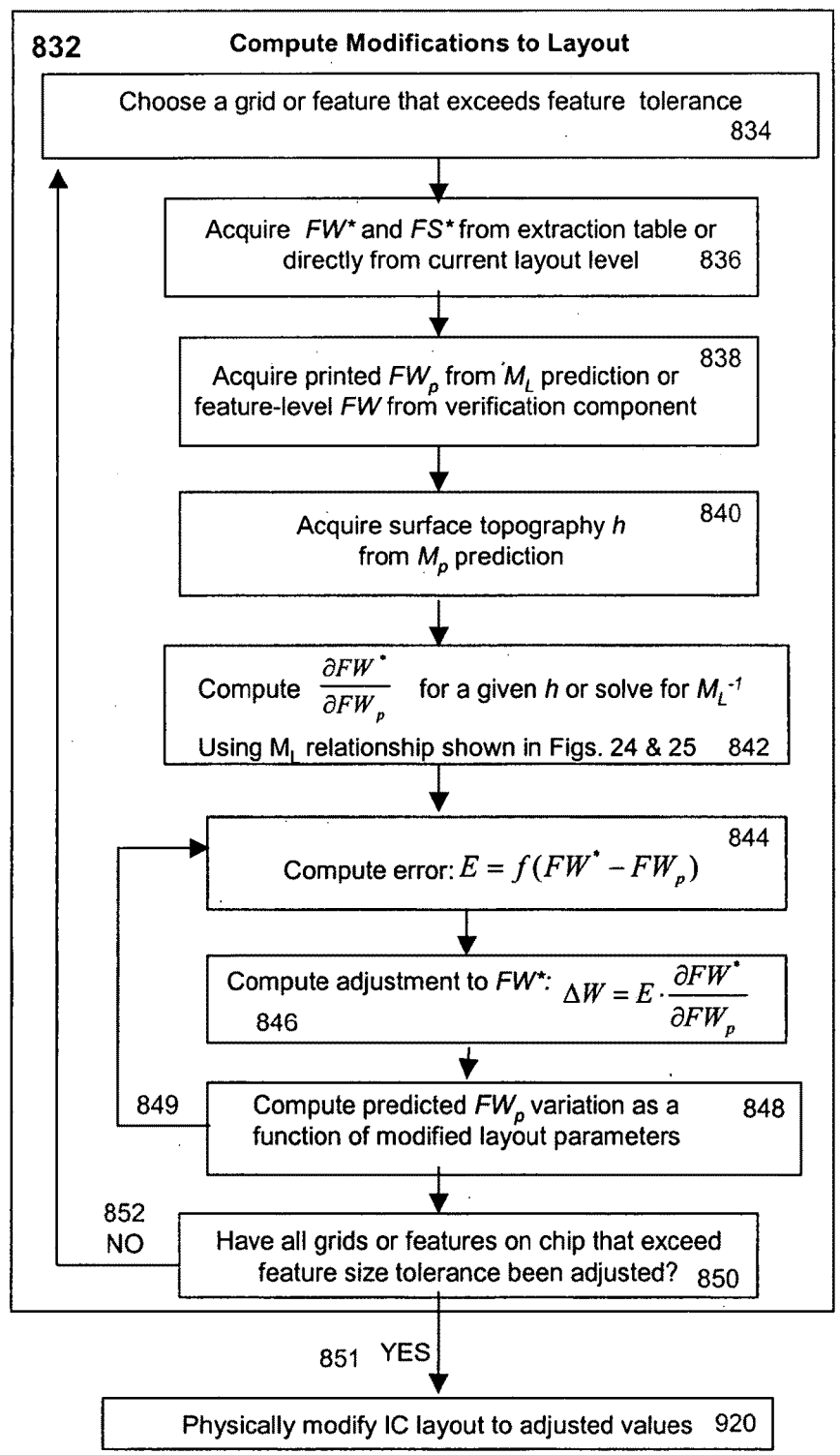
FIG. 31 illustrates steps to compute modifications to a layout.
Figure 32:
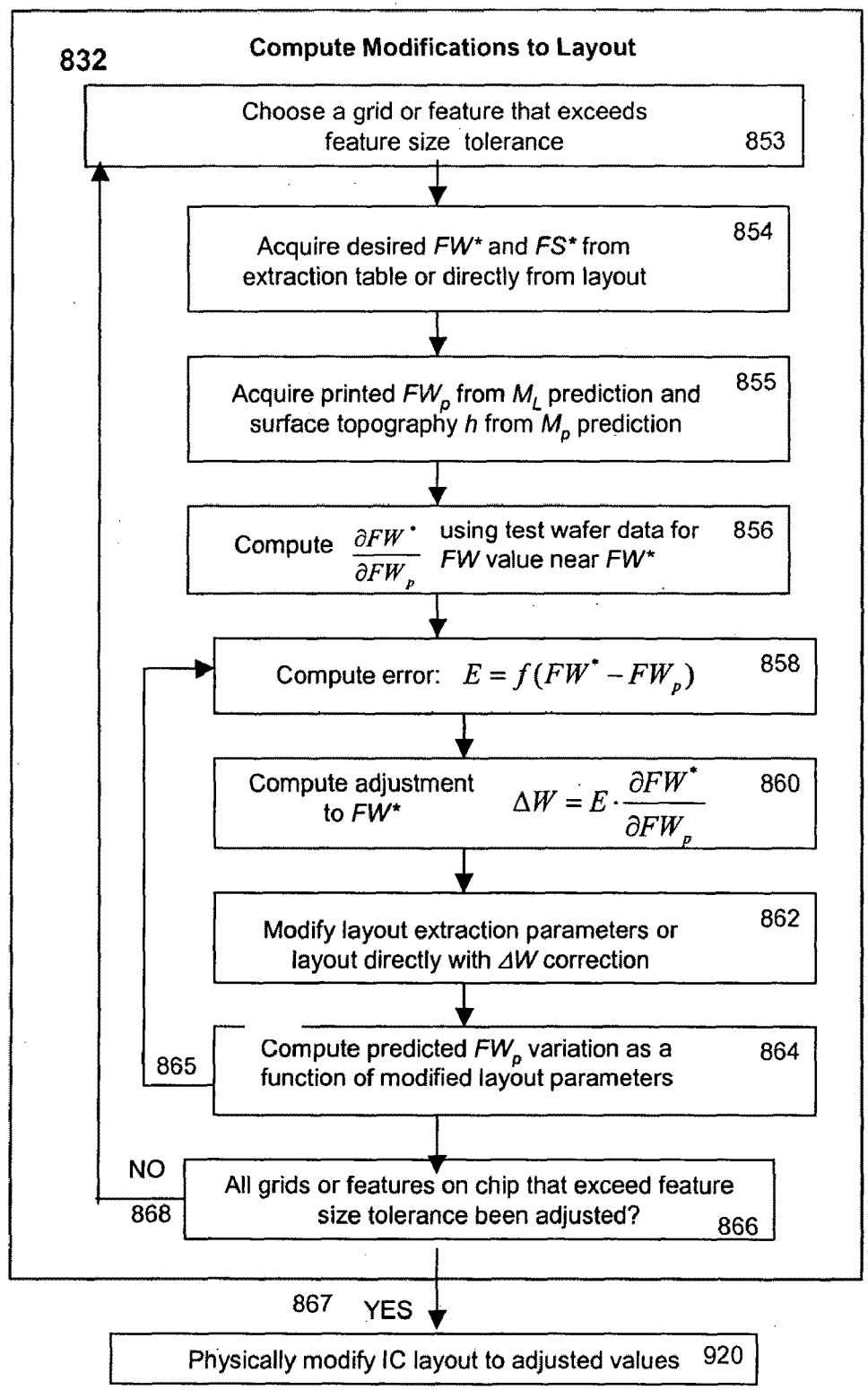
FIG. 32 illustrates the steps to compute modifications to a layout using test wafer data.

Two approaches for computing modifications to the layout are described in FIGS. 31 and 32. In the following descriptions, feature dimensions related to feature width (FW), feature space (FS) and critical dimension (CD) are used as an example of how a feature dimension is adjusted or computed but another feature dimension may be considered as well. The first approach, shown in FIG. 31, uses the inverse, pseudo-inverse, or partial derivatives of the $M_L$ component 600 to map errors in printed feature width $FW_p$ to the desired width FW* in the layout. This approach begins with the first grid location or feature that exceeds tolerance 834. The desired FW*, FS* or other critical dimensions 601 may be acquired from the extraction table or directly from the current layout level 836. Either the predicted lithography-based printed dimensions $FW_p$ from the $M_L$ prediction, or the feature-level predicted variation computed in steps 816 or 826 is acquired 838 from the verification component. The surface topography h is also acquired from the $M_p$ prediction 840 for use in the mapping of the desired and printed line width spaces. The computations described in FIG. 33B are used to compute the partial derivative or gradient $$\frac{\partial FW^*}{\partial FW_p}$$

for the given topography h. Another approach is to invert the $M_L$ transformation 600 described in FIGS. 22, 24 and 25, to yield:

$$FW^* = f(FW_p)|_h$$

where f is the explicit or approximate inverse of $M_L$. The $M_L$ transformation 600 may be optical equations (e.g. derived from Rayleigh relationships) applied to a particular lithography tool or a pattern-dependent model developed using a lithography test wafer. The error between the desired and printed dimension is computed 844 as: $E = f(FW^* - FW_p)$. An adjustment to the feature is computed as:

$$\Delta W = E \cdot \frac{\partial FW^*}{\partial FW_p}$$

where $\Delta W$ is the adjustment to a feature width or dimension 846 and may be done using the procedure illustrated in 33B. In an interconnect level, $\Delta W$ may be a shrinking or bloating of an array of lines. The predicted $FW_p$ variation is recomputed for the modified width 848 and the system iterates on steps 844, 846 and 848 until the error is within design tolerance. A check is made to see if all grids or features that exceed tolerance have been adjusted, and if not the process continues 852. If so 851, then the layout is physically modified 920.

Figure 33B:
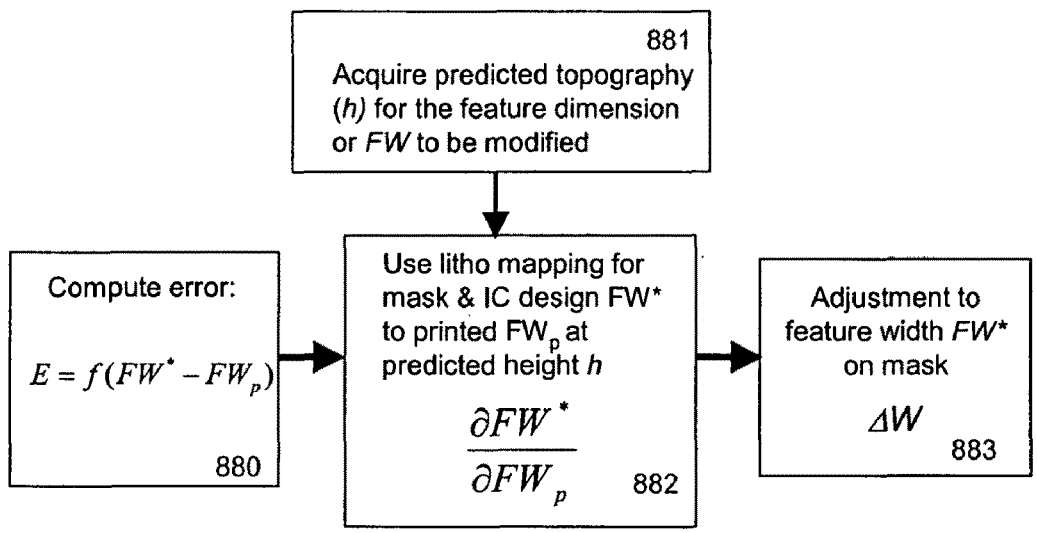
FIG. 33B illustrates a use of errors in predicted versus desired dimensions to modify features in a layout to improve printed feature dimensions.
Figure 34A:
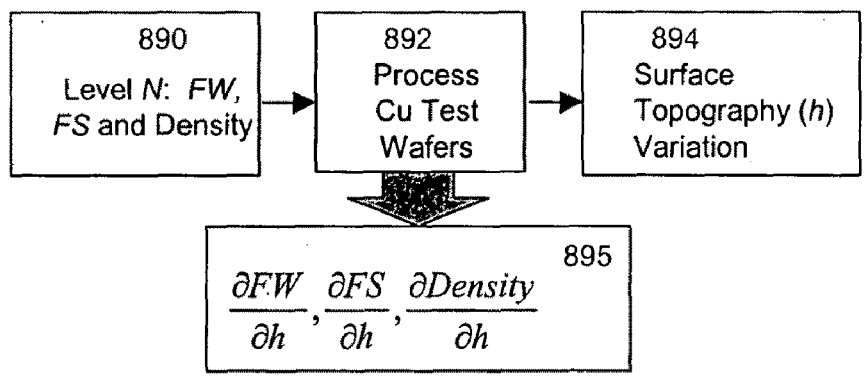
FIG. 34A illustrates a process for computing relationships among feature width, feature space, density or height.
Figure 34B:
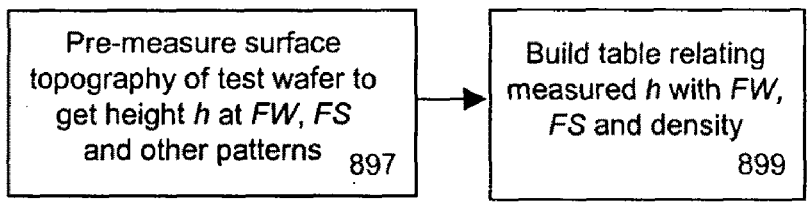
FIG. 34B illustrates how surface topography is related to design parameters, such as feature width, feature space and density before input into a lithography model.
Figure 34C:
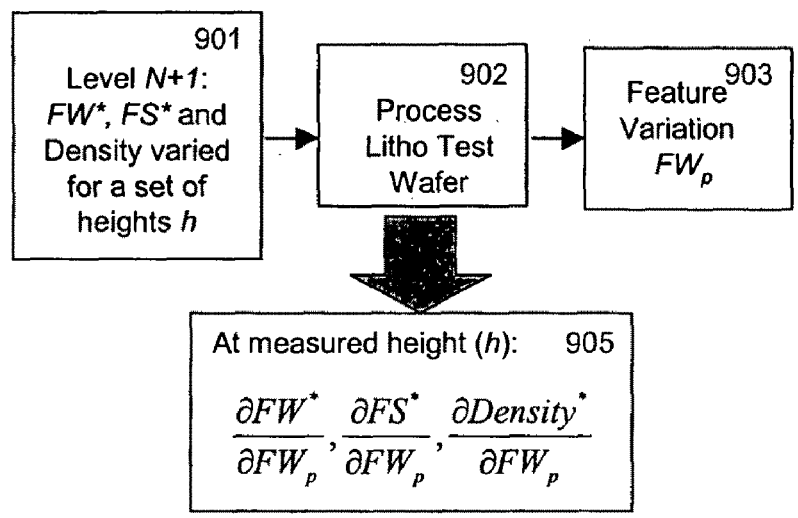
FIG. 34C illustrates how test wafers may be used to compute mathematical relationships between feature width, feature space, and density for a given height or thickness.

The second approach, shown in FIG. 32, uses data obtained using a lithography test wafer to map errors in printed feature width $FW_p$ to the desired feature width $FW^*$ in the layout. This approach begins with the first grid location or feature that exceeds tolerance 853. The desired $FW^*$, $FS^*$, or other feature dimensions 601 may be acquired from the extraction table or directly from the current layout level 854. Either the predicted lithography-based printed dimensions $FW_p$ from the $M_L$ prediction or the feature-level predicted variation computed in steps 816 or 826 are acquired from the verification component 855. The surface topography h is also acquired from the $M_p$ prediction 840 for use in the mapping of the desired and printed line width spaces. The computations, also described in FIGS. 33B and 34C, may be used to compute the partial derivative or gradient $$\frac{\partial FW^*}{\partial FW_p}$$

for the given topography h. Another approach is to invert the $M_L$ transformation 600 developed using the calibrated model to yield:

$$FW^* = f(FW_p)|_h$$

where f is the explicit or approximate inverse of $M_L$. The error between the desired and printed dimension or line width is computed 858 as: $E = f(FW^* - FW_p)$. An adjustment to the feature is computed as:

$$\Delta W = E \cdot \frac{\partial FW^*}{\partial FW_p}$$

where $\Delta W$ is the adjustment to a feature width or dimension 860. In an interconnect level, $\Delta W$ may be a shrinking or bloating of an array of lines. The predicted $FW_p$ variation is recomputed for the modified feature width 862 and the system iterates 865 on steps 858, 860, 862 and 864 until the error is within design tolerance. A check is made to see if all grids or features that exceed tolerance have been adjusted, and if not the process continues 868. If so 867, then the layout is physically modified 920.

Figure 33A:
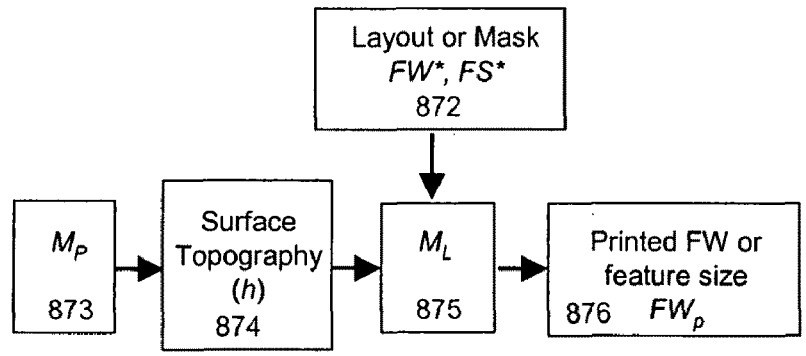
FIG. 33A illustrates a relationship between process model predictions of surface topography and a prediction of feature dimension using a lithography model component.

The feed-forward mapping from desired feature widths or dimensions $FW^*$ to printed feature widths or dimensions $LW_p$ is shown in FIG. 33A. The process models 873 predict chip surface topography h 874, which is then fed into the lithography model $M_L$ 875 along with the desired dimensions 872 from the design $FW^*$, $FS^*$, or $CD^*$. The lithography model 875 maps the desired width and associated chip topography to the actual printed $FW_p$ that occurs as a result of the lithography process 876. This mapping can be used to mathematically relate desired circuit dimensions to lithography printed dimensions for a given chip topography.

When such a mapping is not mathematically invertible or may be complex and nonlinear, a partial derivative can be used to provide a linear approximation of the inverse close to the feature dimensions of interest. This mechanism for relating variation in printed dimensions back to the desired dimensions is illustrated in FIG. 33B. The error, which may be some function of the variation between desired and printed dimensions, is computed 880. The predicted chip topography h is also used 881. There are several ways to compute the gradient or partial derivative of the desired dimensions with respect to the printed dimensions. One approach may be to use data from a processed and measured lithography test wafer, described in FIG. 34C and described in greater detail in section f. Another approach may be to feed feature width values near the desired $FW^*$ into the $M_L$ component and store the resulting printed width variation $FW_p$. From this table of values, the partial derivatives can be computed as the change in $FW^*$ with respect to $FW_p$ using procedures found in many calculus and applied mathematics textbooks. Another approach, which may be applicable if $M_L$ includes a series of equations, is to linearize the equations about the line width or feature size of interest. Linearization methods are provided in most major applied mathematics and multi-variable controls textbooks.

Figure 35:
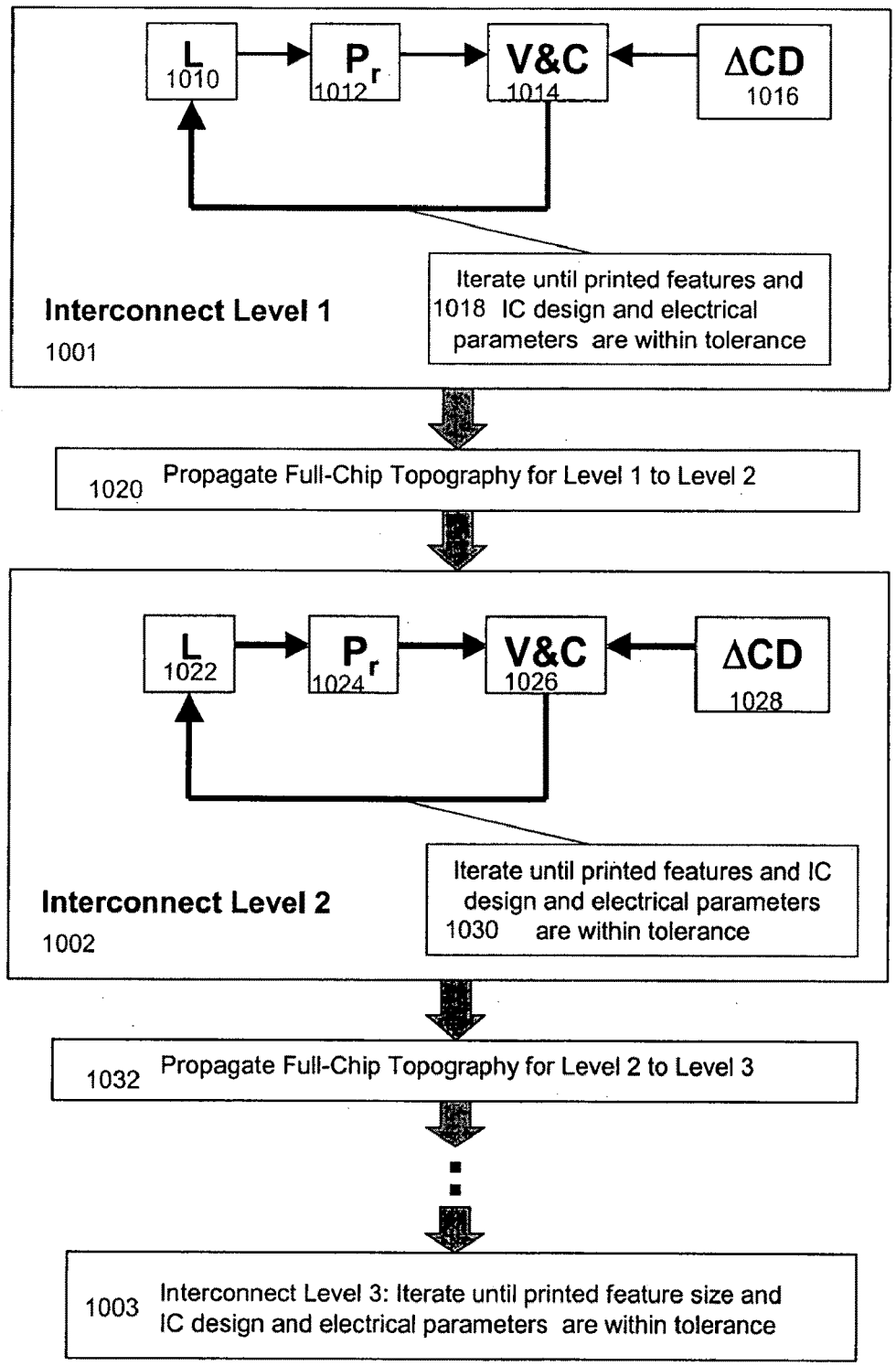
FIG. 35 illustrates how a process may be used iteratively to do multi-layer verification and correction.

The verification and correction components are the final steps in computing the electronic design to be used in mask creation for each design level (e.g., interconnect level). A summary is shown in FIG. 35, illustrating how the components described in sections a. through e. are combined and used in an iterative fashion on each subsequent design level. For the first interconnect level 1001, the layout 1010 is used with a prediction component 1012 to generate chip-level topography which is used along with the feature dimensions at the current design level to verify and correct any variation 1014 to the desired feature size tolerances 1016. This process is repeated 1018 until all printed or etched feature dimensions, design, and electrical parameters (for that level) are within design and feature size tolerances.

The full-chip topography for interconnect level 1 is propagated to level 2 1020. For the second interconnect level 1002, the layout 1022 is used with a prediction component 1024 to generate chip-level topography which is used along with the critical dimensions at the current design level (in this case, level 2) to verify and correct any variation 1026 to the desired feature size tolerances 1028. This process is repeated 1030 until all printed or etched dimensions, design, and electrical parameters are within tolerance. The full-chip topography for interconnect level 2 is then propagated to level 3 1032 and the process continues until the final interconnect level is reached.

f. Creation and Use of Lithography Test Wafers

As described in the calibration procedures in section b., test wafers use a variety of test structures to map the relationship between circuit features and pattern dependencies within one or more process steps. The methods we describe include the creation and use of test wafers to capture pattern dependencies for lithography tools, photoresist materials, and deposition or a subsequent etch. A lithography test wafer may include test structures that characterize feature density and incoming topography (both single and multi-level effects) with regard to the printed critical dimensions. The test wafer simulates the variety of topography that an incoming wafer with a patterned circuit may have and does so by creating a controlled experiment where structures are varied to span a space of potential circuit patterns.

Figures 36A, 36B:
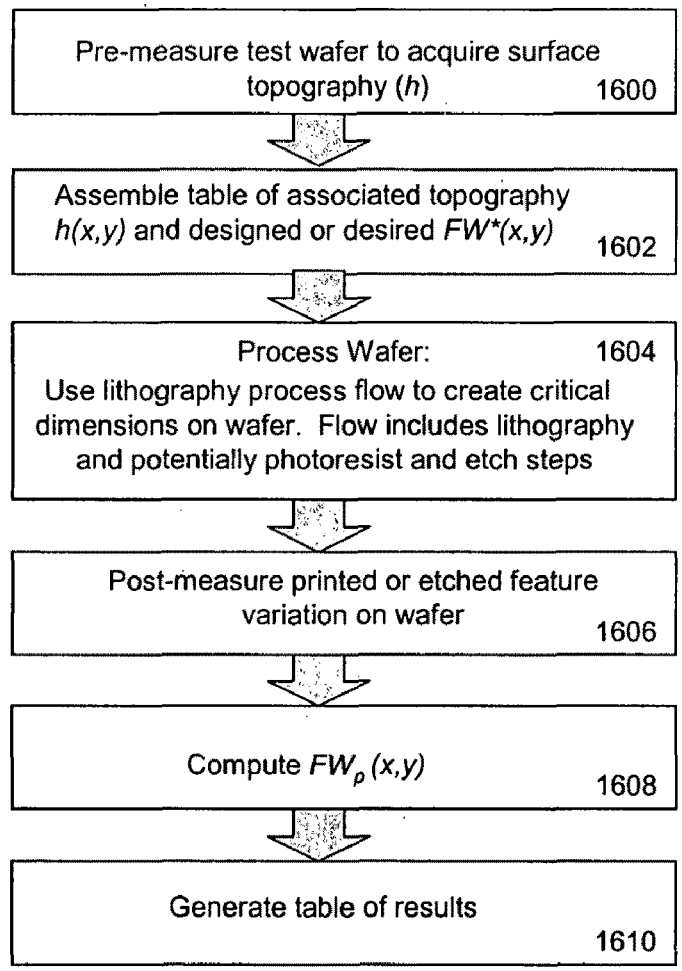
FIG. 36A illustrates steps in using a lithography test wafer.
FIG. 36B shows an example of a table relating test wafer parameters.

FIG. 36A illustrates how a test wafer may be used to characterize pattern dependencies in a lithography process. The pre-processed test wafer topography is measured according to a measurement recipe that includes x and y site locations 1600. (Additional information concerning measurement recipes may be found in U.S. patent application Ser. No. 10/200,660, filed Jul. 22, 2002.) The measured data is assembled in a table that relates underlying circuit patterns (e.g. feature widths FW* and feature spaces FS) and the surface topography h (e.g. thickness) 1602 for each x and y site location. The wafer is processed using the actual lithography process flow that is to be used with the final production ICs. The lithography process flow may include multiple steps such as photoresist deposition, lithographic imaging, and a subsequent etch step. After processing the resulting width variation, in the form of printed or etched feature dimensions (e.g., widths $FW_p$ and spaces), are measured 1606 and calculated 1608 at the x and y site locations.

A table of results are generated 1610 that may be used for calibrating a pattern dependent lithography model, correcting design features to yield desired printed or etched dimensions, or evaluating best practices (e.g., tool and process recipes) and consumables (e.g., photoresist materials) for a particular process flow, lithography and etch tool. An example of such a table is shown in FIG. 36B, where the (x, y) site locations are stored in columns 1620 and 1622, the designed or desired line widths for (x, y) in column 1624, the measured surface topography for (x, y) in column 1626, the printed or etched dimensions for (x, y) in column 1628 and the difference between desired and printed (etched) features in column 1630.

"Printed" and "etched" are terms often used interchangeably in this description. The reason is that it is often difficult to measure the printed line width right after lithography imaging, so an etch step is performed so that the features may be easier measured. Also etch may contribute to the overall width variation, as well as variation in the trench depth and sidewall, as a result of pattern dependencies. As stated throughout this description it may be beneficial when predicting total feature width or size variation to consider lithography and etch together (as a flow) to address both printed and etched variation. The improvement of within-die etch uniformity and the availability of certain sensors and measurement approaches may eliminate the need to perform the etch step and provide direct measurements of printed features. This approach and these wafers may be used in both cases.

Figure 37A:
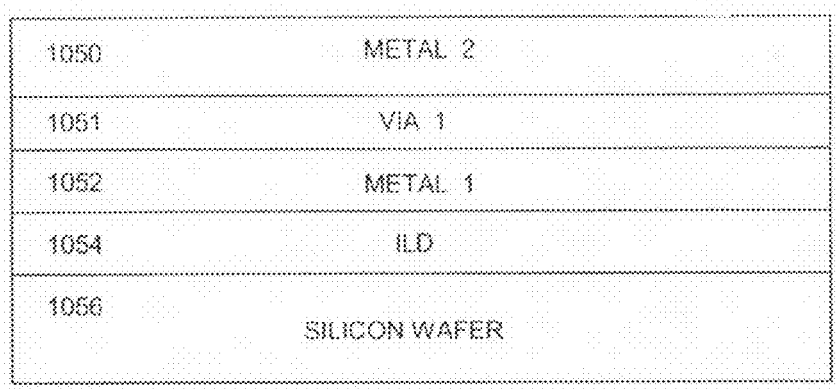
FIG. 37A shows a stack for a lithography test wafer.

A test wafer to capture pattern dependencies in lithography processes is shown in the following figures. FIG. 37A shows a multi-level test wafer stack that begins with a silicon wafer 1056, followed by an ILD layer (egg. oxide or low-k) 1054, a metal 1 layer 1052, a via 1 level 1051, and a metal 2 layer 1050. The test wafer stack is used to relate topographical variation with regard to underlying patterns.

Figure 37B:
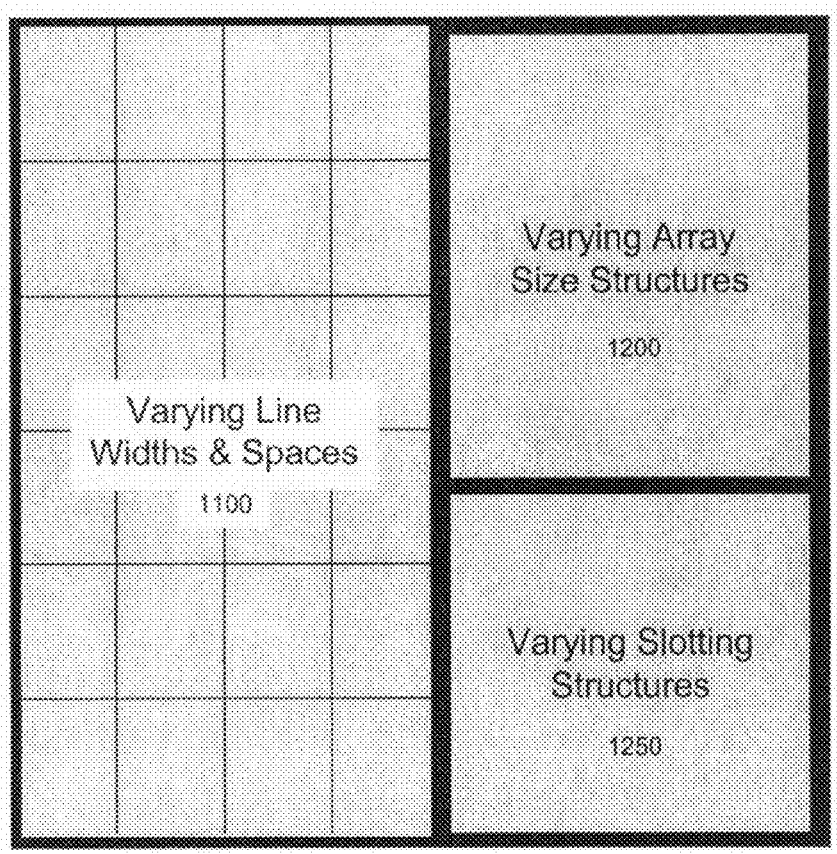
FIG. 37B shows metal level 1 of a lithography test wafer.

An example of a layout for metal level 1 is illustrated in FIG. 37B. A section of varying line widths and spaces is used in metal level 1 1100 to capture width and space dependencies in interconnect levels. A section of varying array sizes are used in metal level 1 1200 to capture pattern interactions between arrays and vias. A section of varying slotting structures are used in metal level 1 1250 to capture multi-layer pattern interactions between slotting structures, lines, and vias.

Figure 37C:
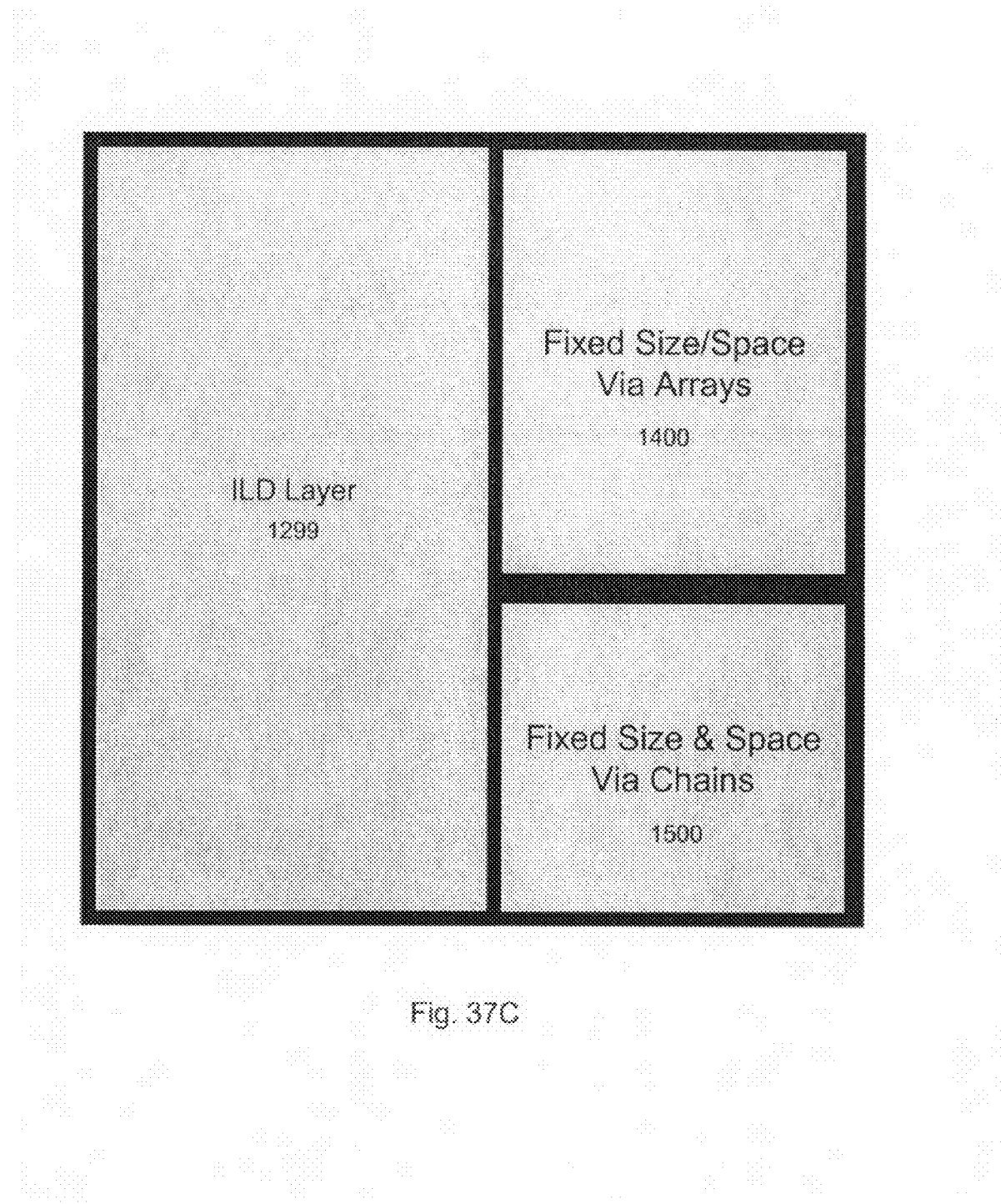
FIG. 37C shows via level 1 of a lithography test wafer.

An example of a layout for via level 1 is illustrated in FIG. 37C. A section of fixed size and space via arrays are used 1400 to capture pattern interactions between via arrays and varying array structures in metal level 1. A section of fixed size and space via chains are used 1500 to capture pattern interactions between via chains and varying slotting structures in metal level 1. The via level area between varying line widths and spaces region is an ILD section with no structures to capture interactions between lines in metal levels 1299.

Figure 37D:
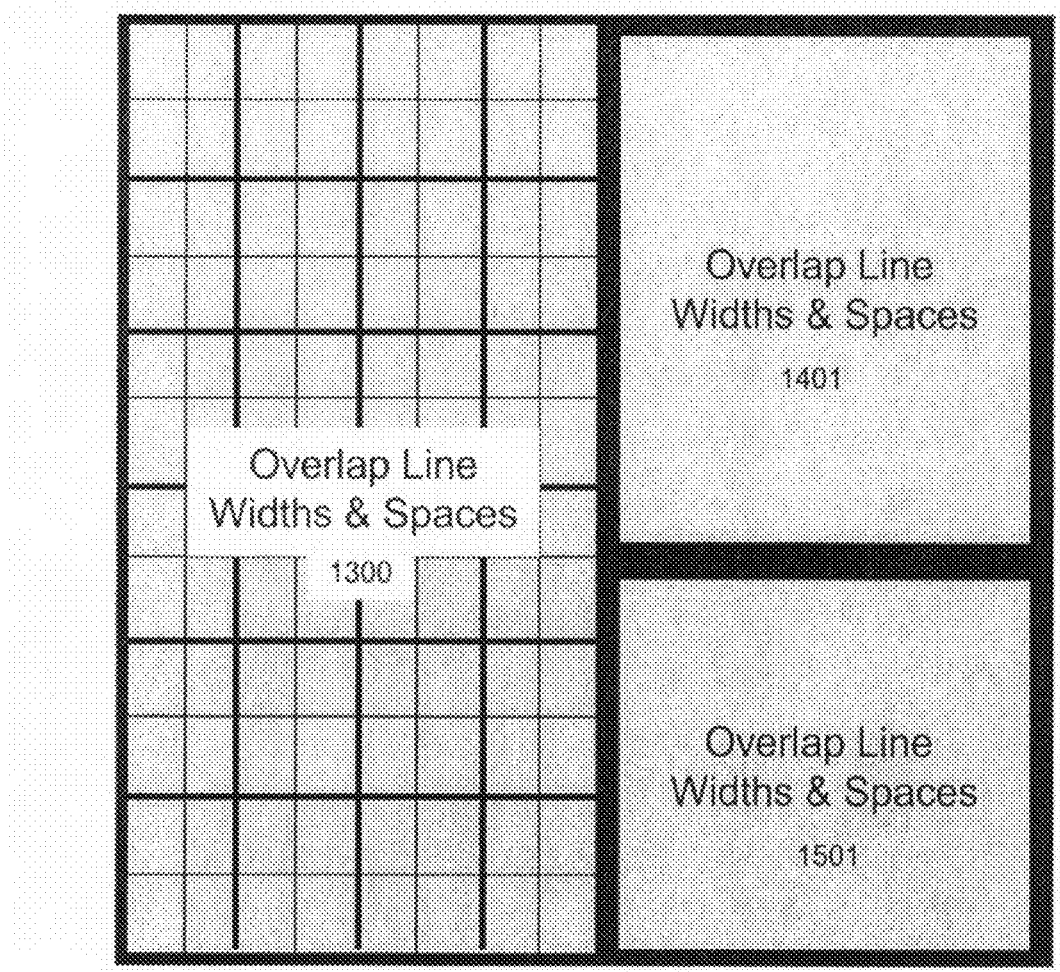
FIG. 37D shows the metal level 2 of a lithography test wafer.

An example of a layout for metal level 2 is illustrated in FIG. 37D. A section of overlap line width and space structures are used in metal level 2 1300 to capture width and space dependencies between interconnect levels. Another section of overlap width and space structures are used in metal level 2 1401 to capture dependencies between via arrays and metal levels. Another section of overlap width and space structures are used in metal level 2 1501 to capture interlayer dependencies among via lines, arrays, and slotting structures.

Figure 38:
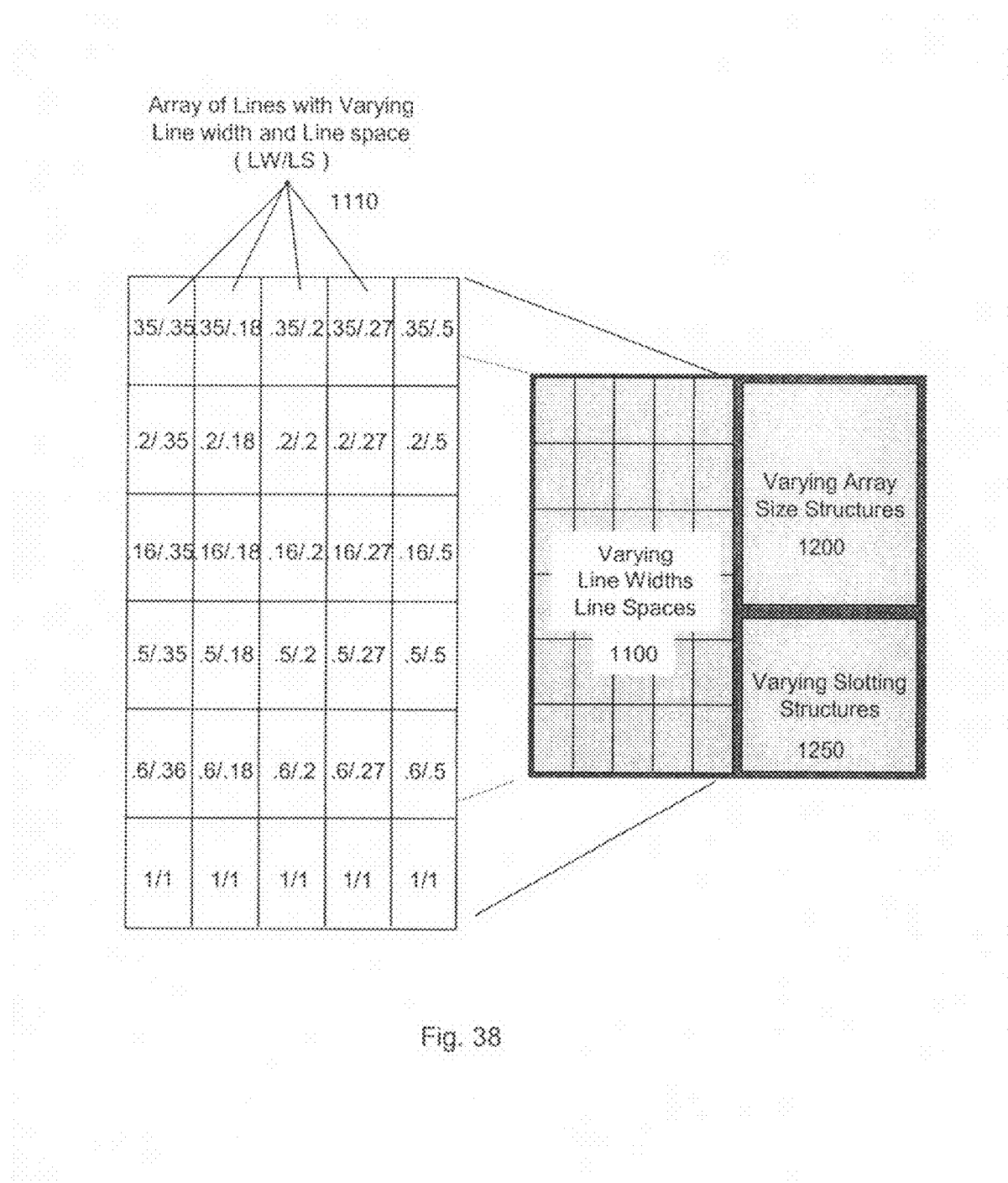
FIG. 38 illustrates a section of varying line widths and line spaces in metal level 1.
Figure 39:
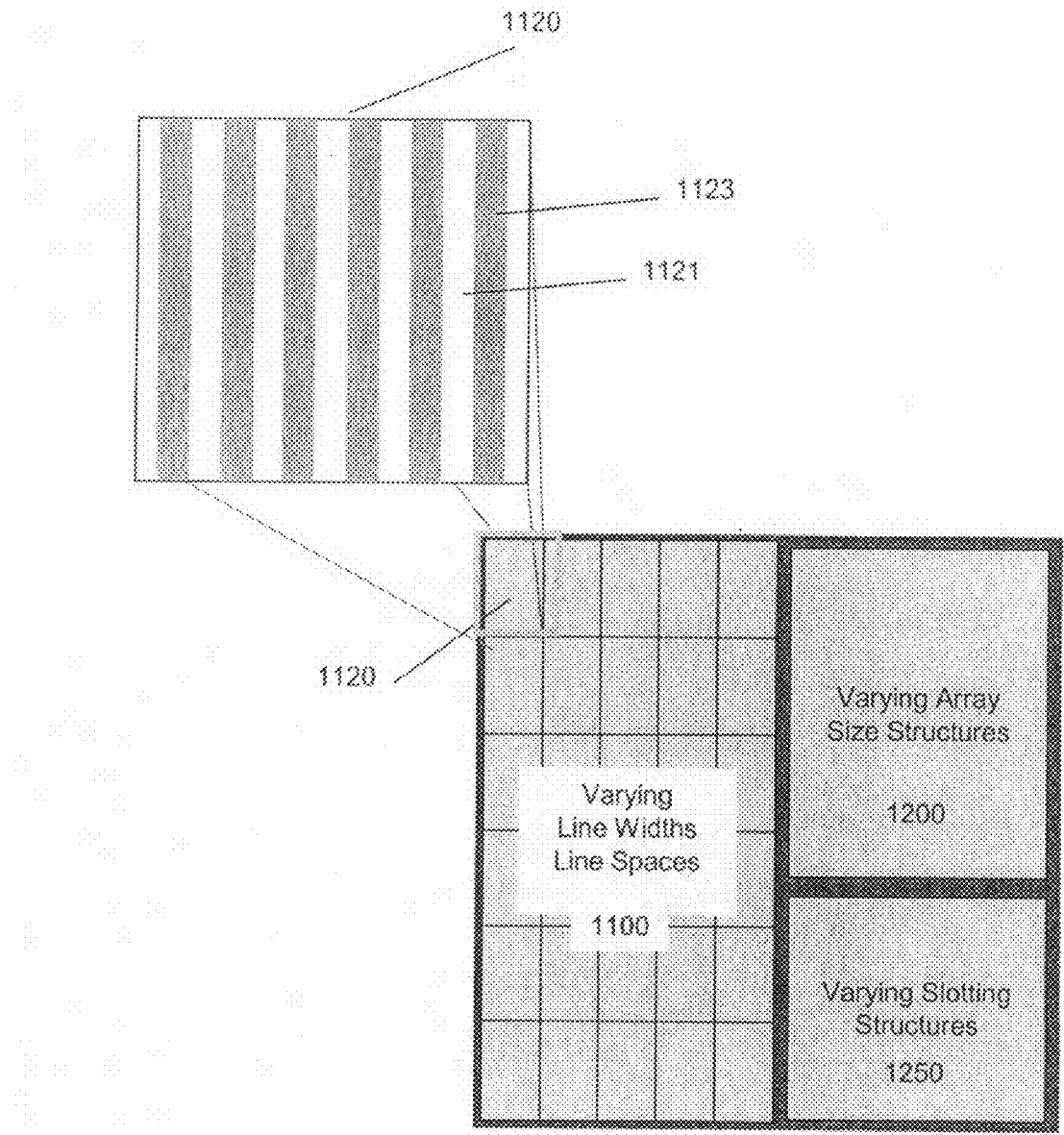
FIG. 39 illustrates a sub-section of fixed line widths and line spaces in metal level 1.

The next few paragraphs and figures will describe the line width and space interaction sections across the metal 1, via 1, and metal 2 layers with structures in areas 1100, 1299 and 1300 respectively. FIG. 38 illustrates varying line widths and spaces 1110 across the larger component 1100 for metal level 1. FIG. 39 illustrates one array structure 1120 (within the 1100 section) with a fixed width of 0.35 micron 1123 and space of 0.35 micron 1121 within each sub-section (such as 1120) in metal level 1.

Figure 40:
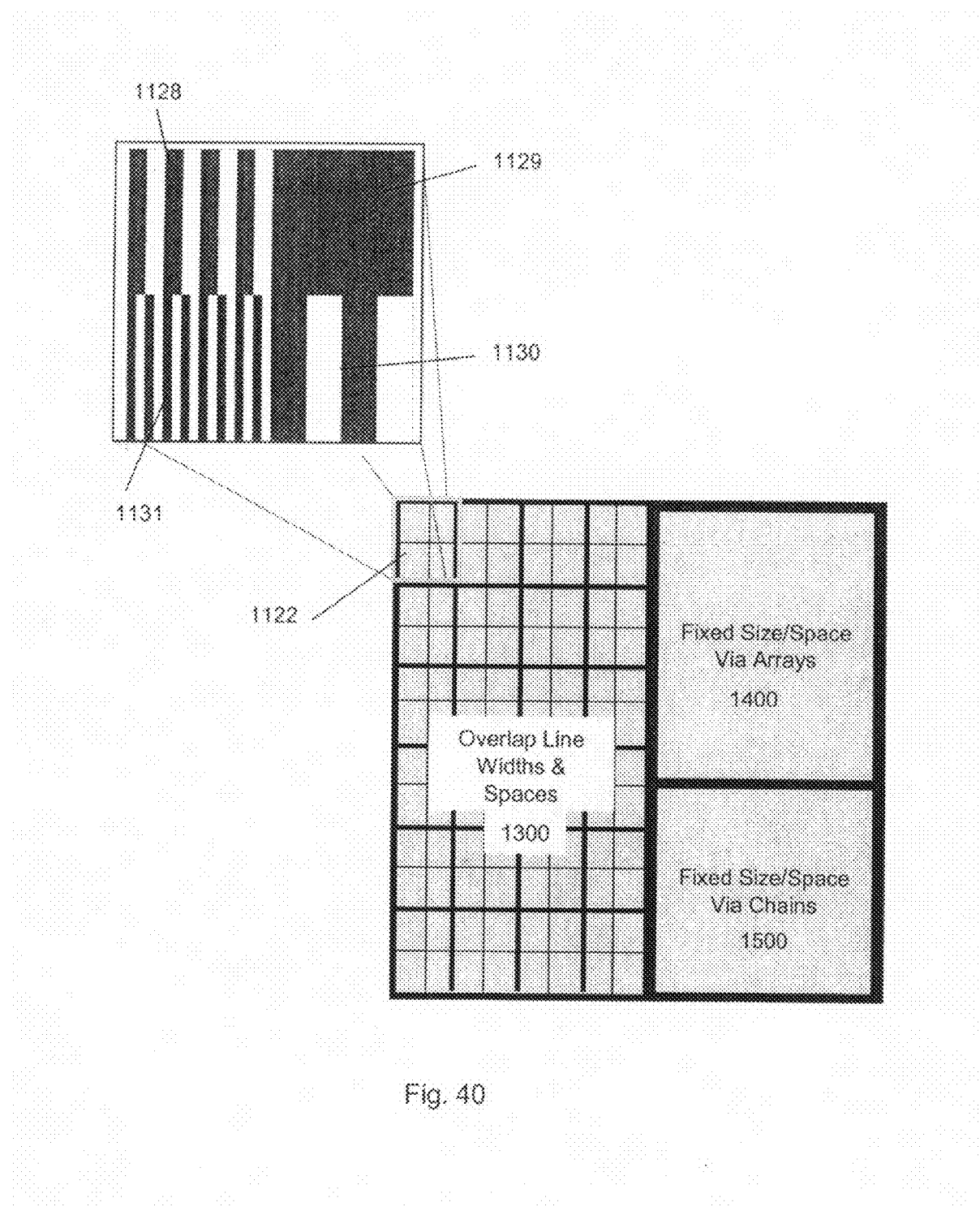
FIG. 40 illustrates a same sub-section with varied line widths and line spaces for metal level 2.

The via level between section 1100 of metal level 1 and section 1300 of metal level 2 is a solid ILD field (e.g. oxide or low-k material), so there are no structures. FIG. 40 illustrates the type of structures in metal level 2 in section 1122 of larger area 1300. The goal is to characterize line width and line space interactions between metal levels, so section 1300 has varying widths and spaces that overlap with the fixed width and space in metal level 1 component 1120. This overlap allows for combinations of width and space values to better span the space of all potential width and space combinations used in a production circuit. In this example, there are four overlap structures (1128, 1129, 1130, 1131) within component 1122, which also lies within the larger section 1300. One area has a line width of 0.25 micron and line space of 0.25 micron 1128. Another area has a line width of 2 microns and line space of zero microns 1129. Another area has a line width of 0.13 micron and line space of 0.13 micron 1 131. Another area has a line width of 0.50 micron and line space of 0.50 micron 1130.

Figure 41A:
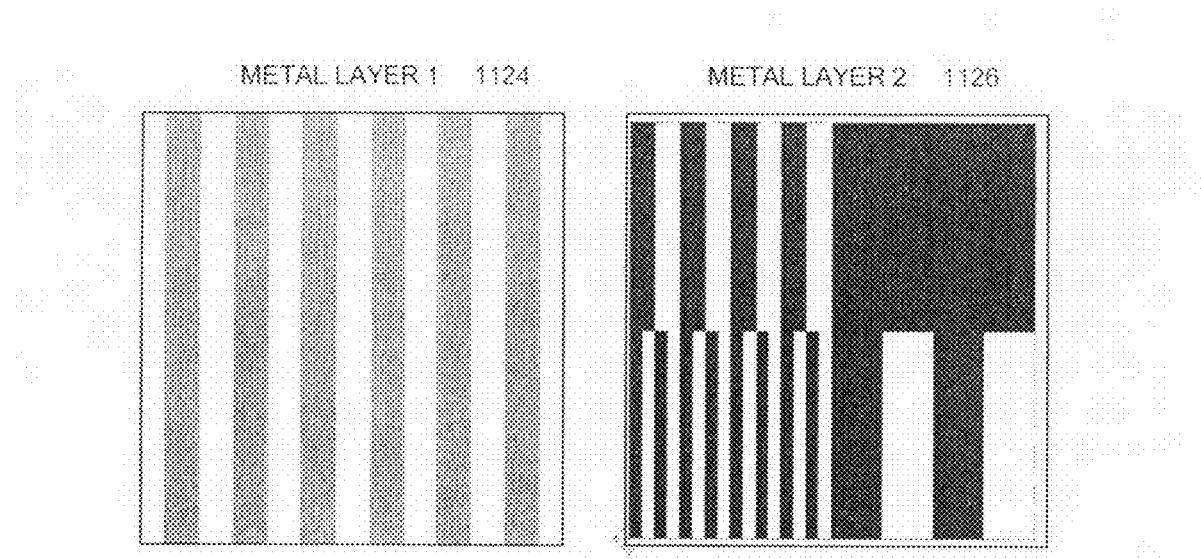
FIG. 41A illustrates patterns in metal level 1 and metal level 2.
Figure 41B:
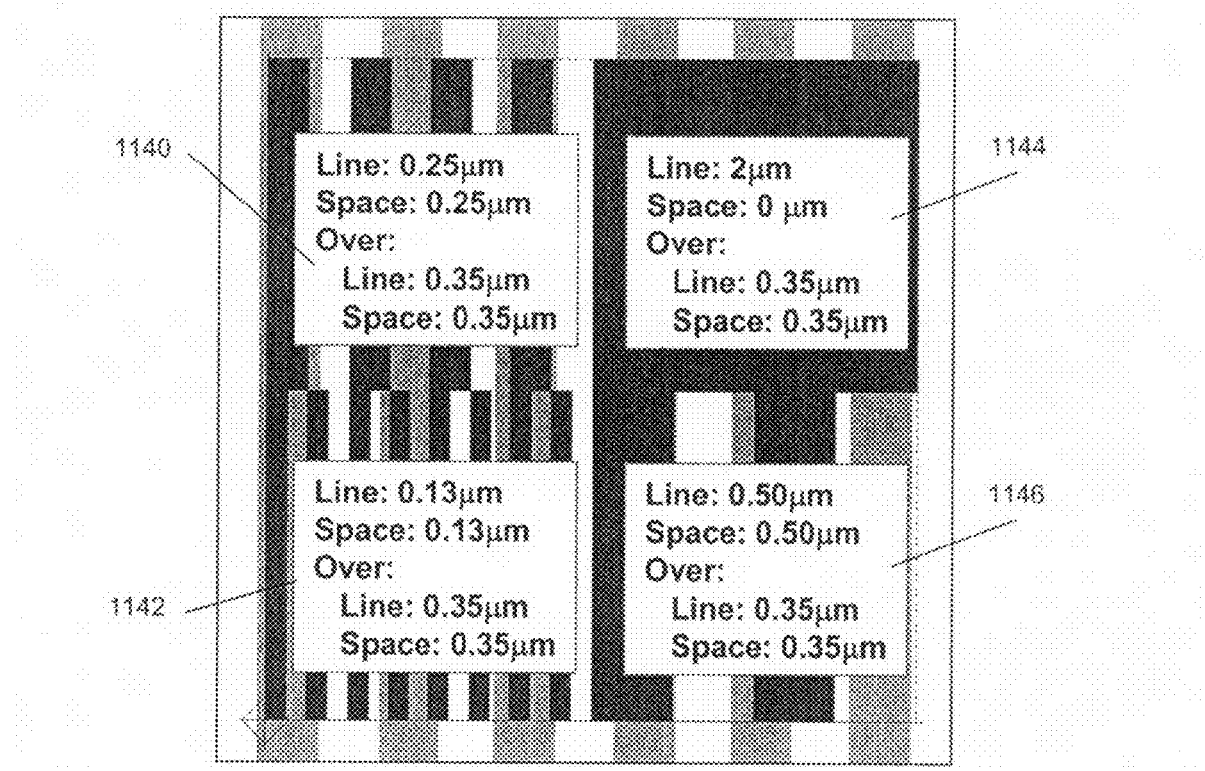
FIG. 41B illustrates metal level 2 superimposed on metal level 1.

FIGS. 41A and 41B illustrate the overlap of the two metal levels. FIG. 41A shows the structure 1124 with a fixed line width and line space in the metal 1 level. FIG. 41A also shows the structure 1126 with varying line widths and spaces in the metal 2 level. FIG. 41B illustrates how the test wafer characterizes the interaction of the two levels by superimposing metal 2 on the metal 1 component. The overlap structures are indicated in 1140, 1142, 1144, and 1146. The via level 1 for area 1299 is a large ILD section which electrically separates the two metal levels and thus is not shown here.

The next set of figures and paragraphs describe the sections of structures that characterize array and via interaction 1200.

Figure 42:
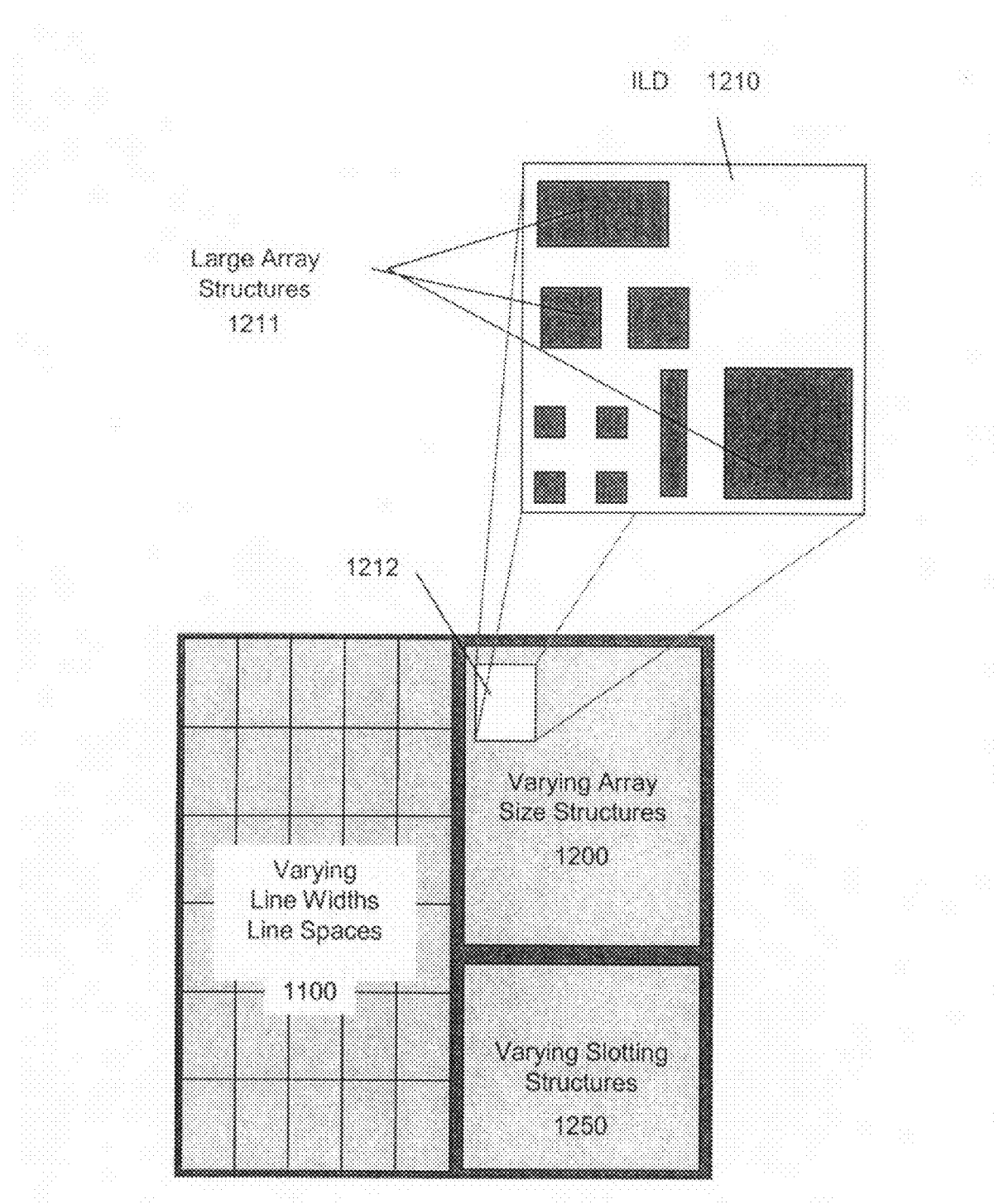
FIG. 42 illustrates varying array structures in metal level 1.
Figure 43:
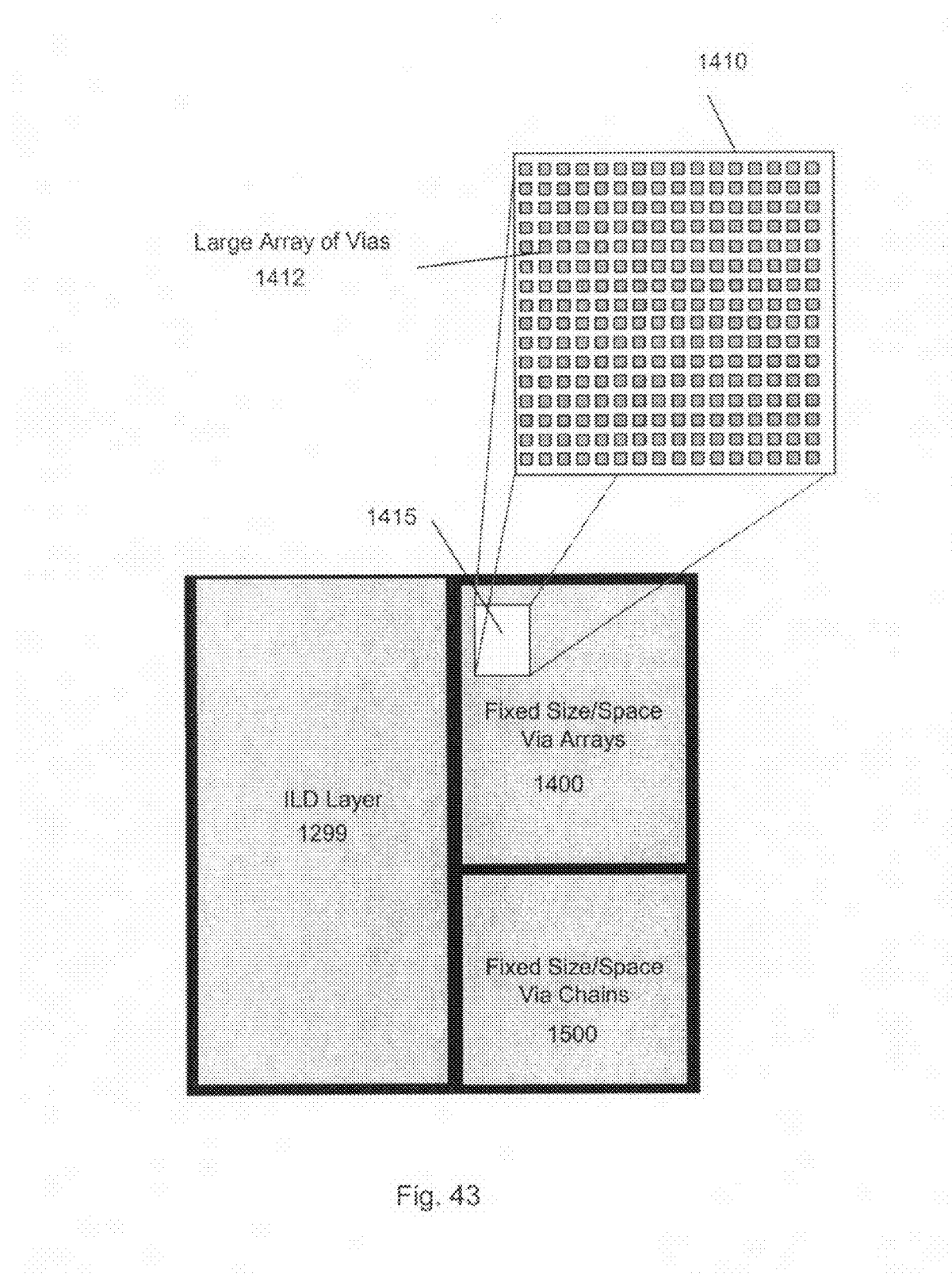
FIG. 43 illustrates a large array of vias in via level 1.

FIG. 42 illustrates a sample layout of structures in section 1200 of metal level 1. The area defined in 1212 is magnified to show the type of large array structures 1211 within an oxide field 1210. FIG. 43 shows, for the area 1415 in via level 1 above 1212 in metal level 1, the type of large arrays of vias 1412, shown as gray squares in the magnified section 1410.

Figure 44A:
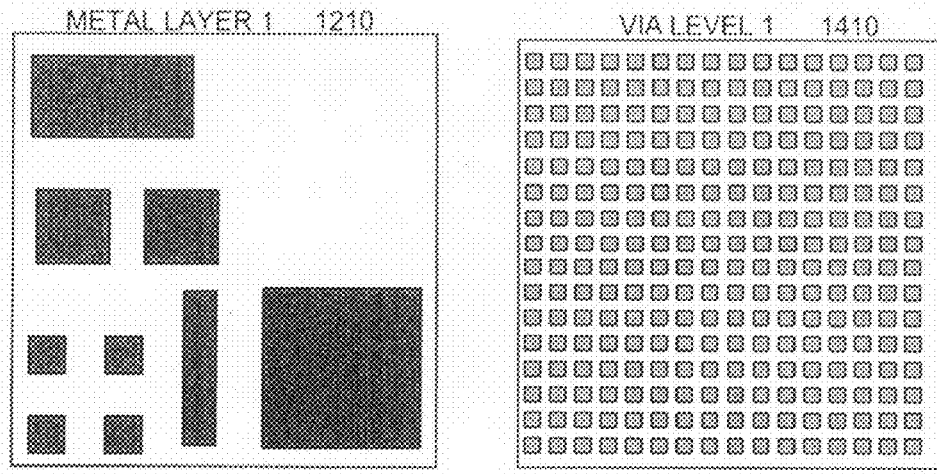
FIG. 44A illustrates patterns in metal level 1 and via level 1.
Figure 44B:
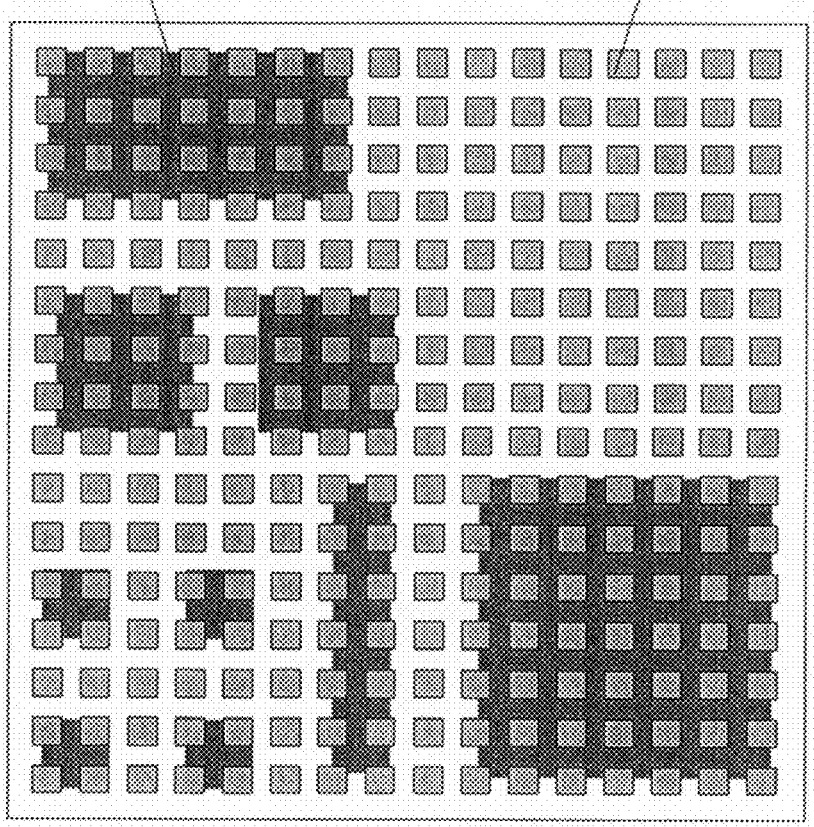
FIG. 44B illustrates via level 1 pattern superimposed on metal level 1 pattern.

FIGS. 44A and 44B illustrate the overlap of the metal and via levels. FIG. 44A shows the large array structures 1210 in the metal 1 level. FIG. 44A also shows via structures in the via 1 level. FIG. 44B illustrates how the test wafer characterizes the interaction of the two levels by superimposing via level 1 on the metal 1 component. The overlap structures are indicated as 1211 and 1412.

Figure 45A:
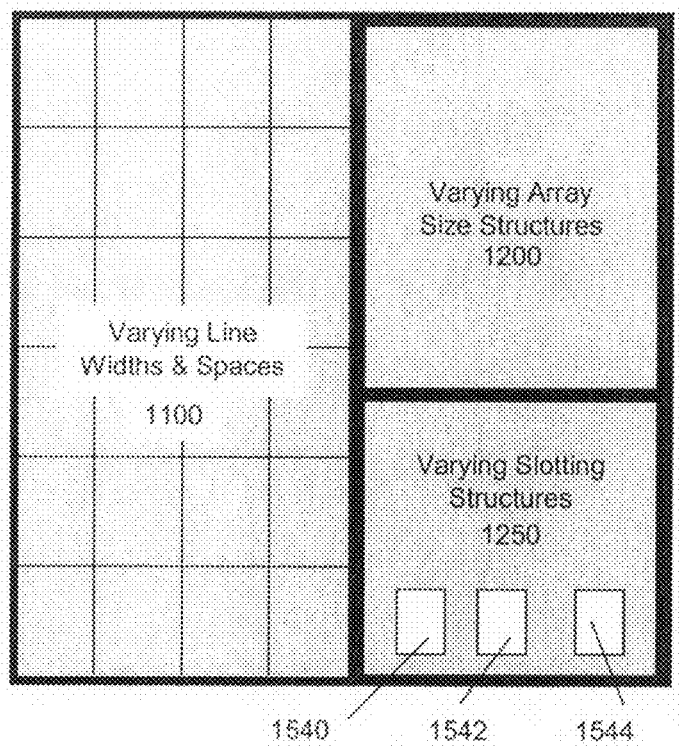
FIG. 45A illustrates three areas of slotting structures in metal level 1.
Figure 45B:
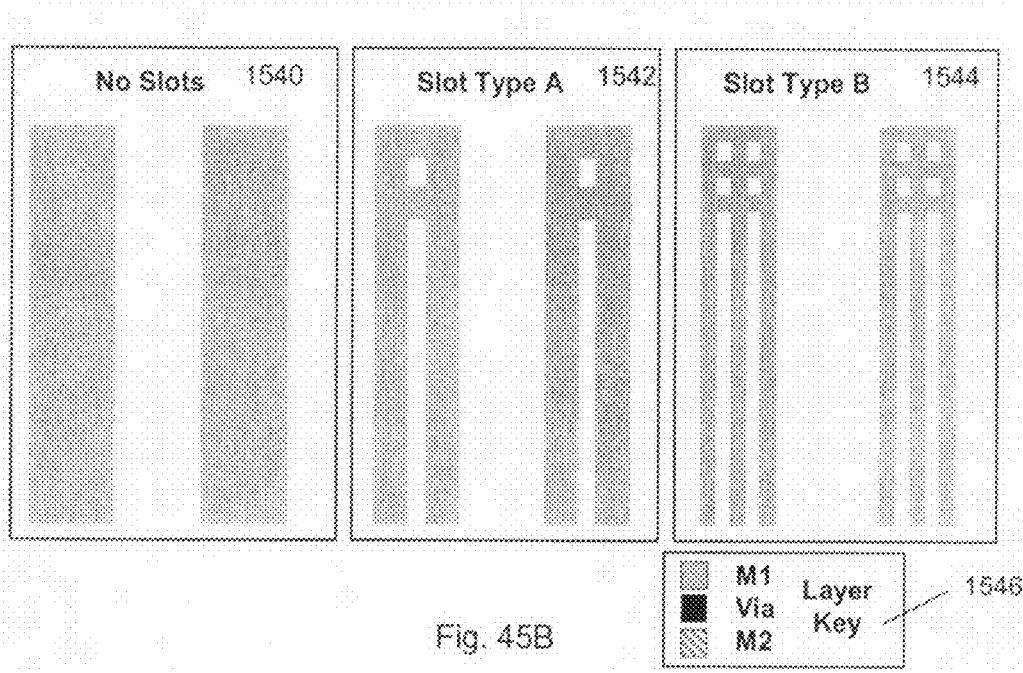
FIG. 45B illustrates slotting patterns for three areas are metal level 1.
Figure 45C:
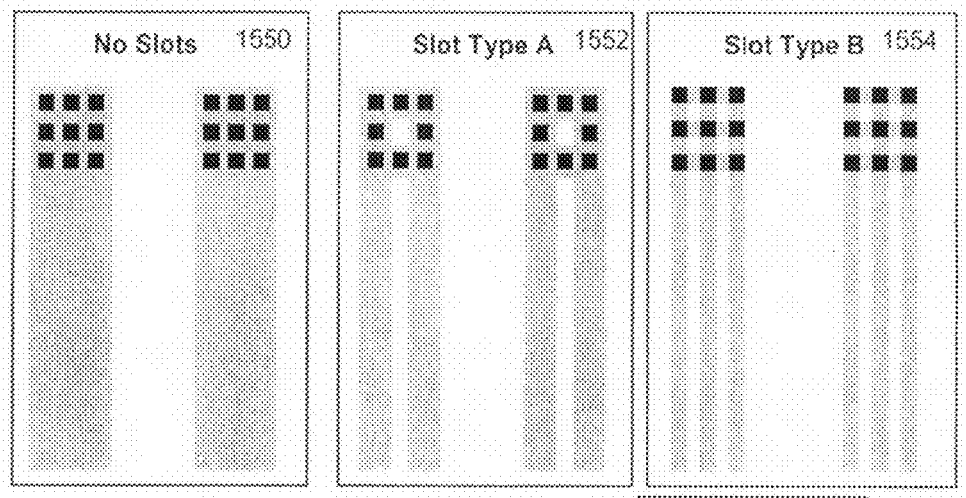
FIG. 45C illustrates a via pattern in the via level 1 superimposed on metal level 1 slotting structures.
Figure 45D:
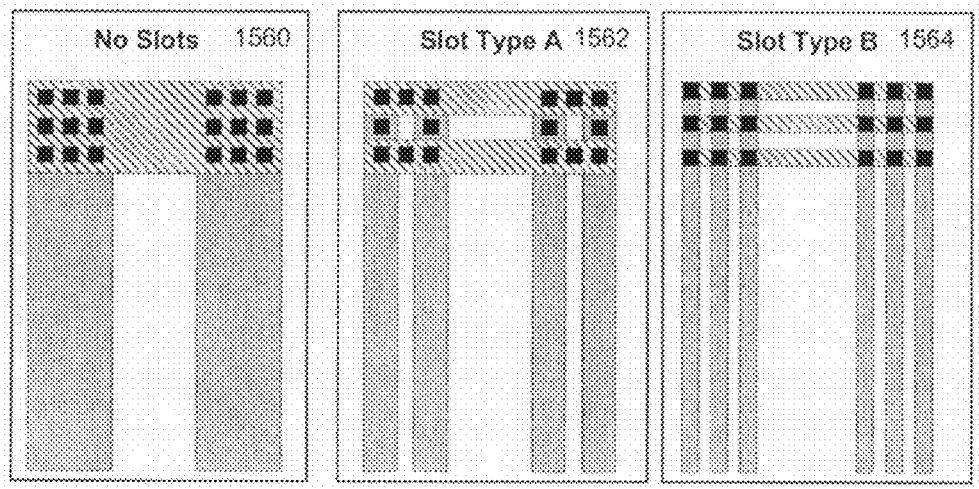
FIG. 45D illustrates a metal level 2 pattern superimposed on via level 1 and metal level 1 patterns.

The next set of figures and paragraphs describe the structures that characterize the interaction between slotting structures, via chains, and overlapping metal lines. FIG. 45A shows the slotting structure area 1250 of metal level 1 with three areas 1540, 1542, and 1544 selected for depicting examples in FIG. 45B. In FIG. 45B, an example of lines with no slotting material are shown 1540. Examples of two different slotting types are shown in 1542 and 1544. A legend for the metal 1 (M1), via 1, and metal 2 (M2) levels for this section is provided 1546. FIG. 45C superimposes via chain structures of via level 1 (shown in 1550, 1552 and 1554) over the slotting structures 1540, 1542 and 1544 shown in FIG. 45B. FIG. 45D superimposes the metal 2 overlap lines that connect to metal level 1 through the via structures for the three types 1560, 1562, and 1564 of slotting structures. A legend is provided in 1566. This completes the description of the three areas of structures in this particular layout example.

The lithography test wafer concept illustrated in the prior figures is not limited to these structures and may include any number of structures that can be used to characterize interaction of feature width, feature spacing, dummy fill, or slotting structures between metal levels and other via and metal levels. While it is not necessary to use the actual process flow preceding the lithography process step to be characterized, it is recommended when it is important to capture the types of incoming process dependent pattern dependencies the lithography process will receive. Actual processing in creating the test wafer may also be useful in characterizing the CMP and ECD processes that precede lithography as well.

g. Applications

There is a wide range of applications for the methods described above. Two ways in which chip-level pattern dependencies, topographical variation, and imaged pattern densities respectively, cause variation in lithographic feature dimensions are shown in FIGS. 8 and 9. The following figures and paragraphs describe solutions using the procedures described in sections a. through f.

Figure 46A:
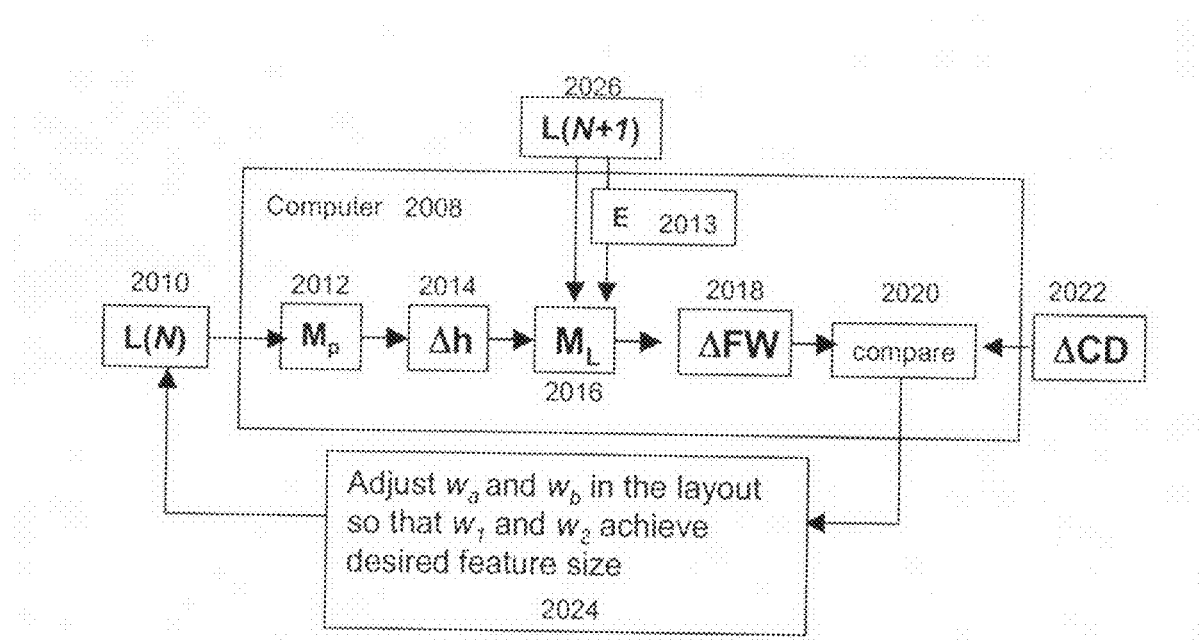
FIG. 46A illustrates an application of a method to address surface topography.
Figure 46B:
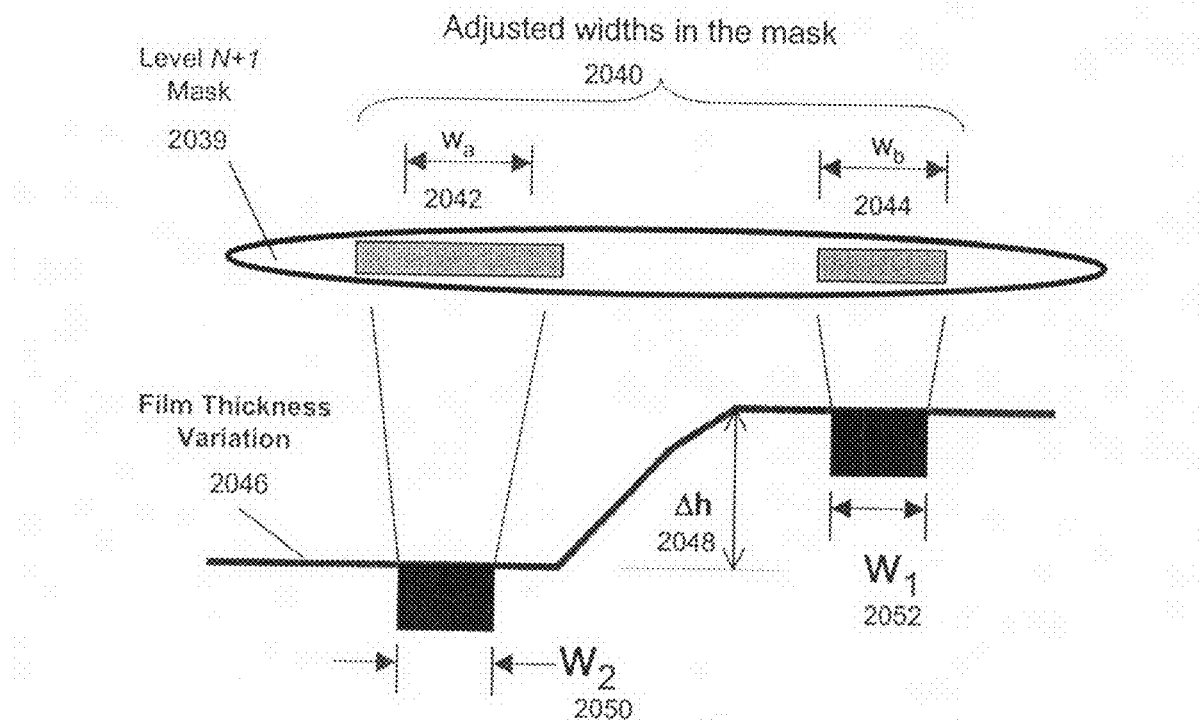
FIG. 46B depicts an impact of a method when surface topography occurs.

The next two figures describe solutions for the problems outlined in FIGS. 8 and 9. FIG. 46A describes how the methods may be applied to address the first problem of chip-level topographical variation. FIG. 46B illustrates the surface topography variation from FIG. 8 with the solution described in FIG. 46A. In this application, the level N layout 2010 is loaded into a computer where the methods described above have been implemented in software 2008. The process model prediction component 2012 performs required extractions and predicts the chip-level surface topography 2014. This variation in topography is also shown in FIG. 46B 2046, as well as the height variation at each grid location 2048. The incoming chip-level topography 2014 and the level N+1 layout 2026 are loaded into the lithography model component 2016, which is used to predict the feature size (e.g. line width) variation 2018. Pattern dependencies may also be extracted from level N+1 layout and used as well 2013. The design tolerances 2022 are loaded into the computer 2008 and compared 2020 to the predicted dimensions. The verification and correction component 2024 adjusts the layout and the process iterates until satisfactory printed feature sizes (e.g. line widths) are achieved. The layout is then used to create the mask for layout level N+1. The results of the solution described in FIG. 46A are shown in FIG. 46B where the level N+1 mask 2039 feature dimensions $w_a$ 2042 and $w_b$ 2044 are adjusted 2040 in the layout such that the printed features $w_2$ 2050 and $w_1$ 2052 are the desired width. This solution allows the lithography process to adjust printed features to within-die film thickness variation 2048.

Figure 47A:
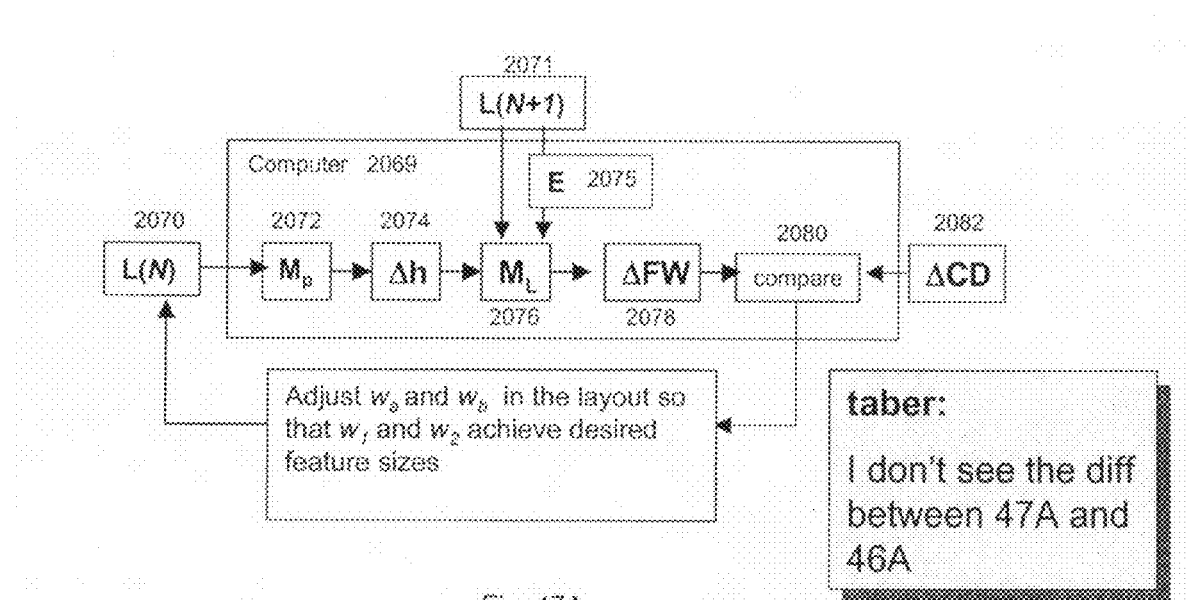
FIG. 47A illustrates an application of a method to address feature density.
Figure 47B:
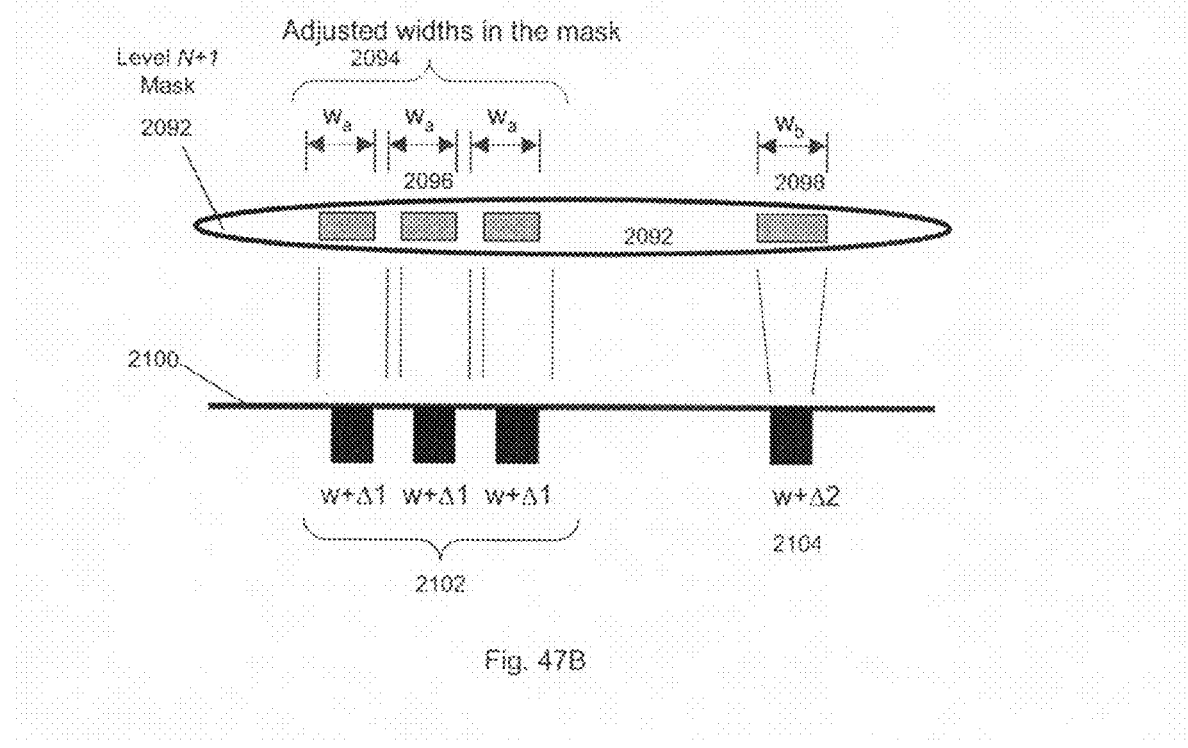
FIG. 47B depicts an impact of a method when feature density occurs.

FIG. 47A describes an application to address the second problem of feature density variations that were described in FIG. 9. FIG. 47B illustrates a variation in feature densities, similar to that shown in FIG. 9, with the methods applied in FIG. 47A. In this application, the level N layout 2070 is loaded into a computer where the methods have been implemented in software 2069. The process model prediction component 2072 performs required extractions and predicts the chip-level surface topography that may or may not be used in conjunction with feature density information. Since optical interference due to feature density may vary with depth of focus, topographical information may be useful.

The level N+1 layout 2071 is loaded into an extraction tool 2075, which extracts pattern density information. The extraction may be performed using the procedure described in section b. of an EDA tool or by using an optical proximity correction tool. The feature density extraction and topographical information 2074 are loaded into a lithography model component 2076, which is used to predict the feature size variation 2078. The design tolerances 2082 are loaded into the computer 2069 and compared 2080 to the predicted dimensions. The verification and correction component 2084 adjusts the layout and the process iterates until acceptable printed feature sizes are acquired. The layout is then used to create the mask for layout level N+1. The results of the solution described in FIG. 47A are shown in FIG. 47B where the level N+1 mask 2092 feature dimensions $w_a$ 2096 and $w_b$ 2098 are adjusted 2084 in the layout such that the printed features $w+\Delta 1$ 2102 and $w+\Delta 2_{2104}$ are the desired width. This solution allows the lithography process to adjust printed features to variation in feature densities, whether the film thickness is planar 2100 or varying 2046 (as shown in FIG. 46).

Figure 48:
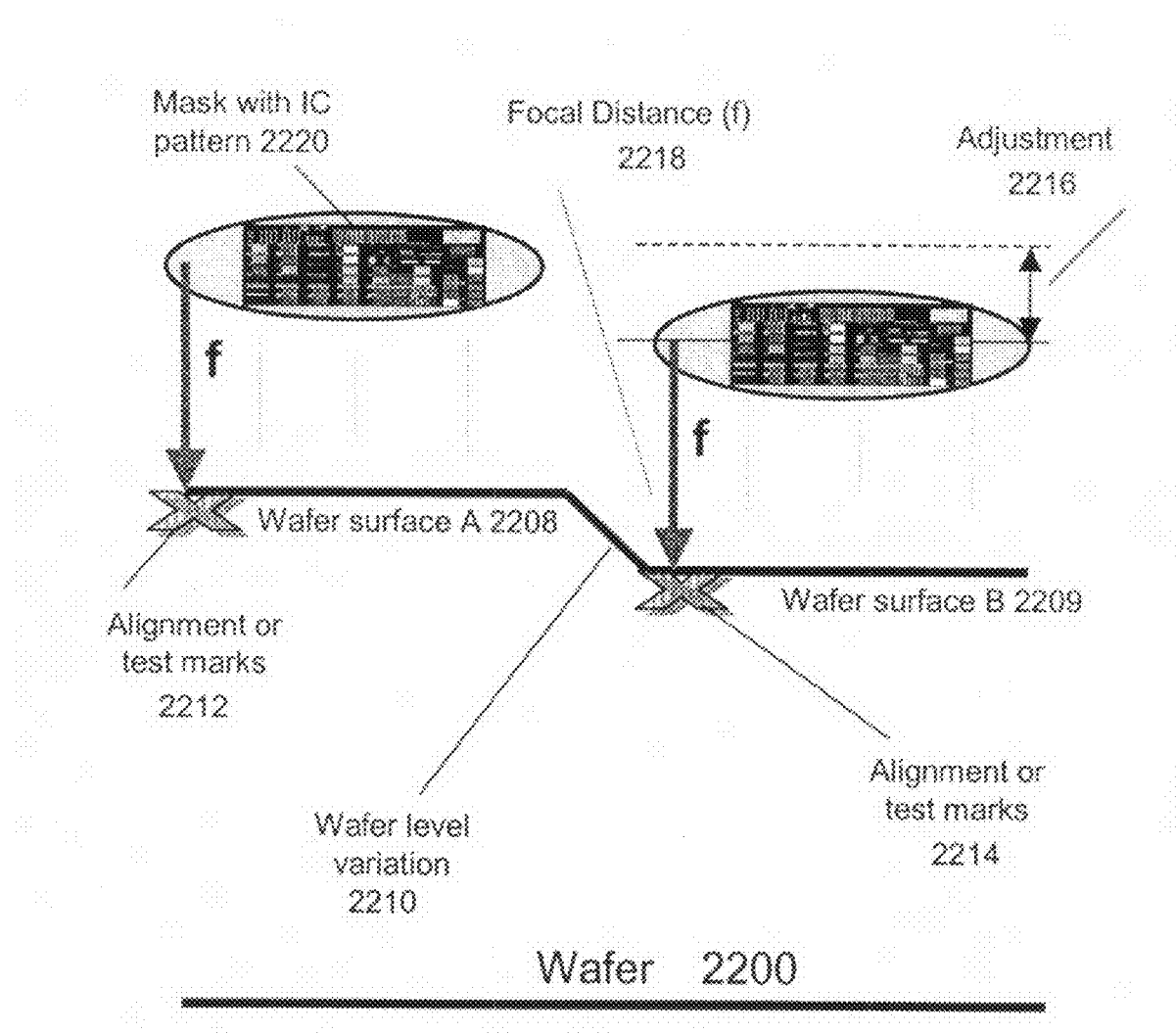
FIG. 48 illustrates an application of a stepper mechanism to address wafer-level surface variation.
Figure 49:
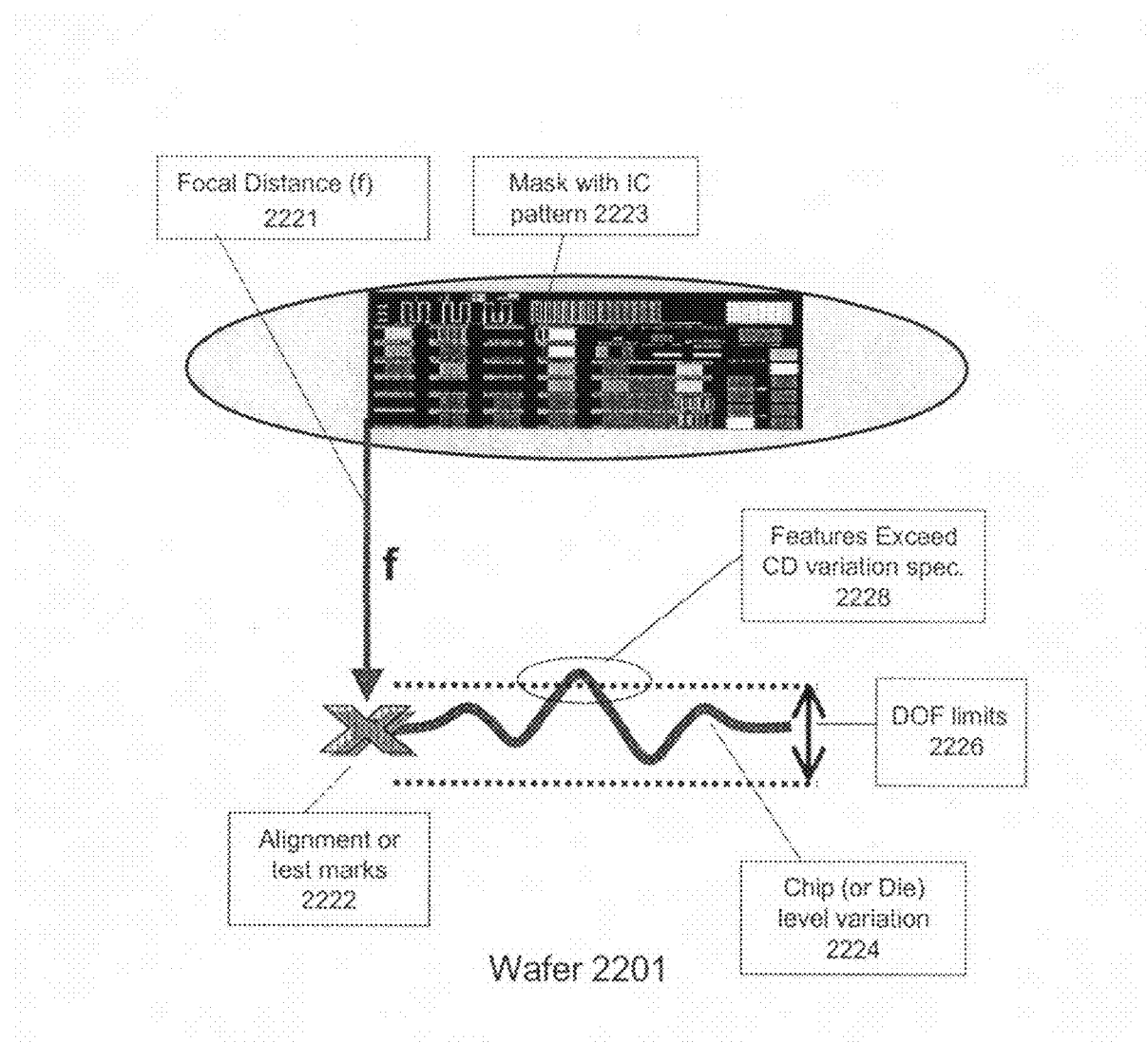
FIG. 49 illustrates a stepper mechanism with a proper focal distance to an alignment key and including imaged areas within the chip that are outside of the depth of focus
Figure 50:
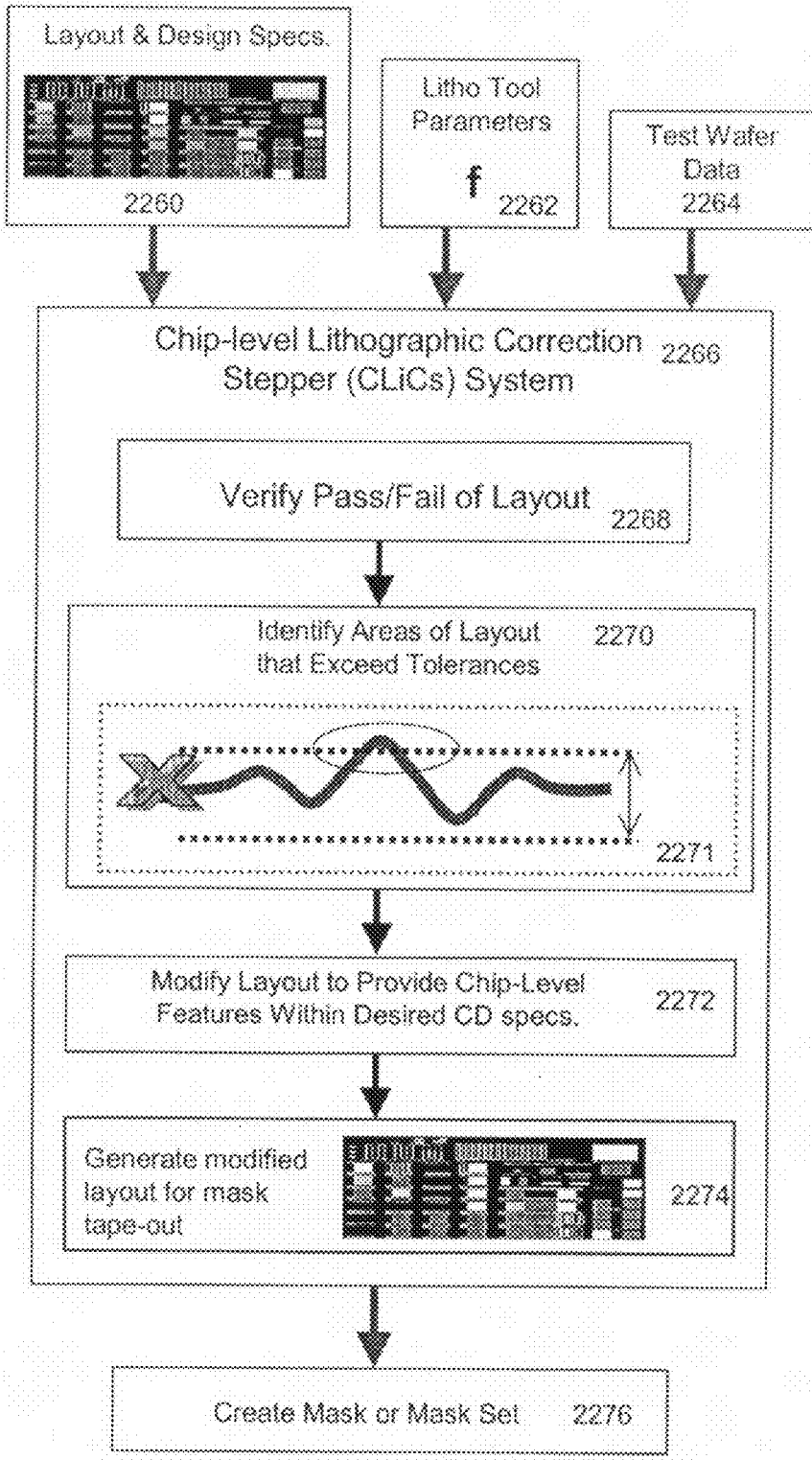
FIG. 50 illustrates an application of a method to a chip-level stepper mechanism.

The method may also provide functionality similar to conventional stepper technology. Whereas stepper technology allows lithographic imaging to adapt to wafer-level non-uniformity (such as bow or warp), the techniques may be used to adjust lithographic imaging to chip-level or within-die variation. A basic illustration of how stepper technology works is illustrated in FIG. 48, which shows a mask with an IC pattern 2220 to be imaged onto the wafer surface at points A 2208 and B 2209 at different heights. Steppers normally print within a defined area or field that may include one or more die. The lithography tool measures the alignment marks 2212 and 2214 for both x and y alignments and tilt. Wafer-level variation 2210 such as warping and bowing is common where the characteristics of wafer surface at point A 2208 may be different than the wafer surface at point B 2209. The tool adapts the mask or reticle 2220 and associated optics to compensate for this variation over longer distances. The focal plane f 2218 may or may not be adjusted to maximize the resolving power. There also exist step and scan tools that expose the die in strips where the pattern is stitched together on each strip. In most of these applications, steppers adjust to wafer topography on length scales of 1 to 50 mm. Within-die or chip-level topography may vary at similar magnitudes as wafer-level; however these length scales are on the order of 0.00008 mm to 25 mm. This situation is illustrated in the case shown in FIG. 49 where the mask or reticle 2223 is adjusted (to wafer surface A 2208 of FIG. 48) to print IC features onto an ILD layer of a wafer 2201. The adjustments are made with regard to x and y alignment marks 2222 and tilt and potentially, focal distance f 2221. However chip-level variation 2224 occurs on a much smaller length scale and certain features that are sufficiently different than the focal length may likely exceed the critical dimension tolerances specified in the design specification 2228.

The methods we have described may be used to complement conventional wafer-level stepper technology and work as a miniature stepper that adjusts to chip-level variation in printed images. The methods may be applied as a chip-level lithography correction stepper (CLiCS) system 2266 that receives the following inputs: layout, and design specifications 2260, lithography tool parameters and settings 2262 and test wafer data 2264. The CLiCS system 2266 uses the steps shown in FIGS. 46A and 46B and FIGS. 47A and 47B to perform three basic functions described in 2268, 2270 and 2272. The first function is to verify whether a given layout passes or fails the lithography process step for a given layout design level 2268. The second function is to identify areas of the layout that exceed design tolerances 2270, (similar to the situation depicted in 2271 also shown in FIG. 49). The third function is to modify the layout such that the printed (etched) dimensions and features match the desired values or are within the design tolerances 2272. The result is a modified layout that meets all the design and electrical specifications and yields the desired printed (etched) feature dimensions 2274. The layout is then used to generate the mask set for lithography 2276.

In some cases, there may be a large performance benefit to squeezing parameters well within the design tolerances. This may be accomplished by either reducing the tolerance limits or iterating between the prediction and correction components (as shown in 2024 of 46A or 2084 of 47A) until the error is sufficiently reduced. The cost of continual optimization of design and electrical parameters is that the computational burden will likely increase significantly. As such, this decision is left to the system user.

h. Implementations and Uses

The methods described above may be implemented in software running on a computer or server that communicates with various components via a network or through other electronic media. The methods can be used as a Design for Lithography (DfL) system that verifies whether a particular circuit design will be created or imaged accurately on the wafer or corrects the design where features will not be accurately reproduced. DfL incorporates lithography-related, within-chip pattern dependencies into decisions regarding the design and process development flow.

This section will describe how the software may be implemented and how it may communicate with other design and manufacturing components. This section will also describe how the software may be used with and within lithography tools and electronic design automation (EDA) tools.

The components that comprise the method are constructed in software (e.g. Java, Tcl, Basic, SQL) and modularized such that the method may or may not use all the components in the generation of measurement plans. For example, the method may only use process models to generate film thickness variation, compare this with design specifications and determine those locations that are most likely to violate the specification. The following descriptions describe the general computational framework for the method.

Figure 51:
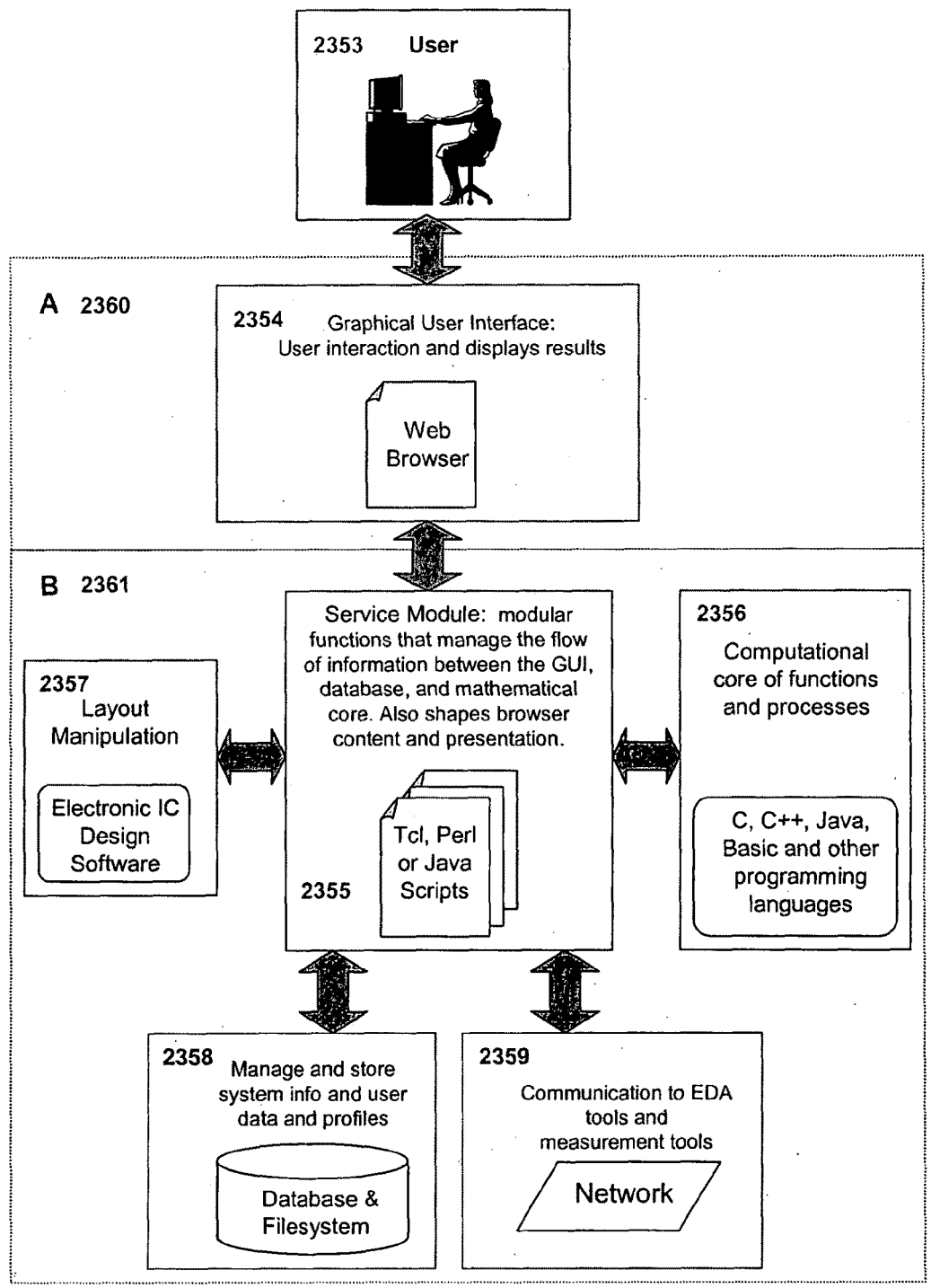
FIG. 51 illustrates an implementation of a method using computer hardware, software and networking equipment.

FIG. 51 shows a useful software architecture described in the following paragraphs. The user 2353 communicates with the system through a graphical user interface (GUI) 2354, such as a web browser. The GUI 2354 allows the user to choose and upload electronic layout design files into the system and view areas that require modification or areas of the design that have been modified by the design for lithography system. When the system is housed within an EDA tool the user may be a designer, and the GUI may be part of the EDA tool.

In general the GUI, as defined and used throughout this section, allows the user to choose, upload or transfer from another form of electronic media, electronic layouts, desired design rules, electrical performance, or CD variation for the particular device described by the design files. The user may also use the interface to select process and electrical models from a server or transfer or load models from another electronic media source or computer. The user may also use the interface to review the results of lithography prediction, design faults and modifications to the design. These results may be in the form of, for example:

histograms and other statistical plots,
full-chip images of wafer-state (including feature variation) or electrical parameters at some point in time,
movies of full-chip topography such as film thickness, dishing, erosion progression during a process step or flow,
movies of full-chip electrical parameter variation such as sheet resistance, drive current, timing closure issues and capacitance, and
tables of values.

The GUI 2354 communicates with a series of software components, services or functions 2355 (referred to here as the service module) that manage the flow of information throughout the system to the database and file system 2358 and computational core processes 2356 as well. The services 2355 are modular and serve to initiate the computational core processes 2356 that execute portions of the method and to assemble and format the content for display in the GUI. The modules may be created as scripts (e.g. in Perl, Java, or Tcl) that enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service module 2355 communicates with the computational core of processes and functions 2356 that execute computational steps of chip-level wafer topography, verification and design correction. This core also does the effective pattern density computation and layout extractions. This communication may include instructions, data, model parameters, prediction results in tabular, image or movie forms and pointers to files in the file system.

The service module 2355 also communicates with electronic IC design (EDA) software or layout manipulation software 2357 to manipulate layout information during extraction or to modify the design layout to yield desired feature dimensions.

The database 2358 communicates with the service module 2355 via SQL commands to manage system data such as measurement sites and locations, user profiles that specify permissions and preferred content and presentation, user data which may include layout extraction data, design specifications and rules, model parameters for particular tools and processes, and full-chip prediction results such as surface topology, resistance and capacitance. Examples of databases that may be used include Oracle, Informix, Access, SQL Server, and FoxPro. The file system 2358 communicates with all the components 280, 300, 750 and 800 to retrieve and store information saved as files, typically too large to efficiently store in the database.

The system may communicate directly with metrology equipment to generate measurement plans and to receive measurements before and after lithography processing. The system may also communicate directly with electronic design (EDA) tools to receive design layouts and to provide modified designs. The system may also communicate directly with electronic design (EDA) tools and foundries to generate test structures and test wafers and to develop and supply process flows and recipes to manufacturing. This communication may be done via a computer network 2359 or computer bus.

If the functionality shown in boxes A 2360 and B 2361 resides on one computer then the system is configured as stand-alone. If A and B reside on different computers and communicate across a network, the system is normally considered a client-server configuration. A network may include electrical and optical communication via an extranet, intranet, internet or VPN. In some cases both A and B will be part of the EDA tool suite and the user, 2353, is a designer.

Figure 52A:
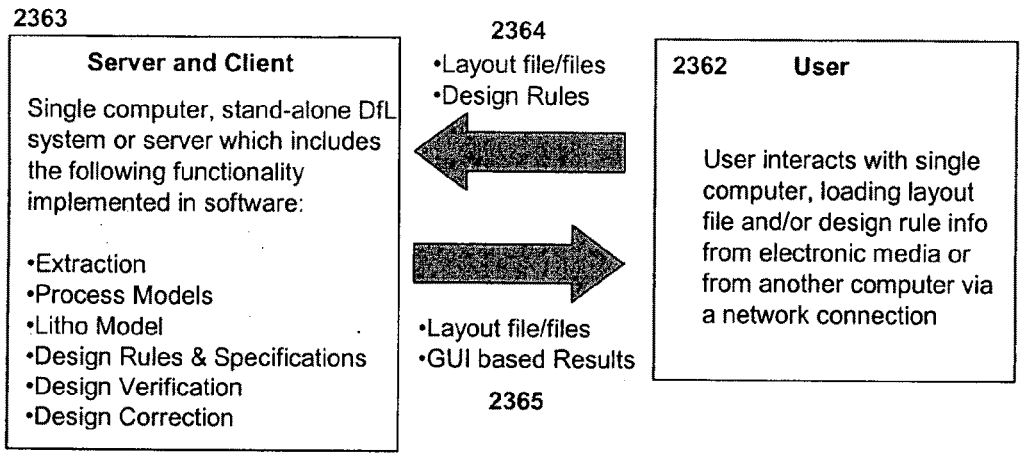
FIG. 52A illustrates an implementation of a method where client and server reside or are bundled with other software on a single computer.
Figure 52B:
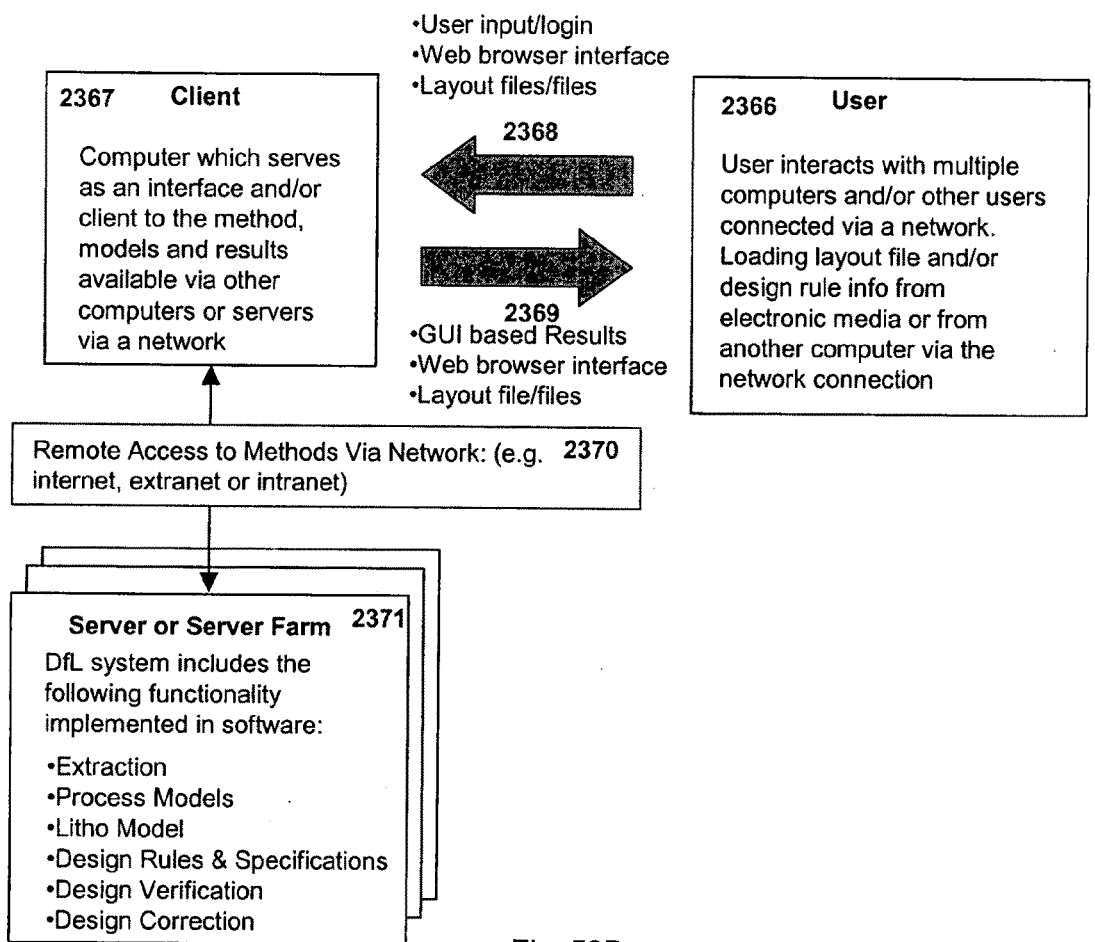
FIG. 52B illustrates an implementation of a method where the client and server communicate via a network.

Here we describe a few useful operational frameworks for applying the system to verify and correct designs to yield desired printed or etched features and dimensions. Other frameworks are also possible. There are three basic computational frameworks described in this section that constitute good methods of operation and delivery of the functionality based upon a user's needs. The first framework presented is a stand-alone configuration, shown in FIG. 52A, where the components 280, 300, 750 and 800 of FIG. 10 reside in 2363 and data in and out (2364 and 2365) are accessed from a single computer. The second framework is a client-server configuration, shown in FIG. 52B, where the GUI resides on a client computer 2367 also shown as box A in FIG. 51, which accesses, via a network 2370 the other components, shown as box B in FIG. 51, residing on a server or multiple servers, a server farm 2371. The communication could be done via internet, intranet or extranet networks 2370 and the server may serve one or more clients or users.

Figure 53:
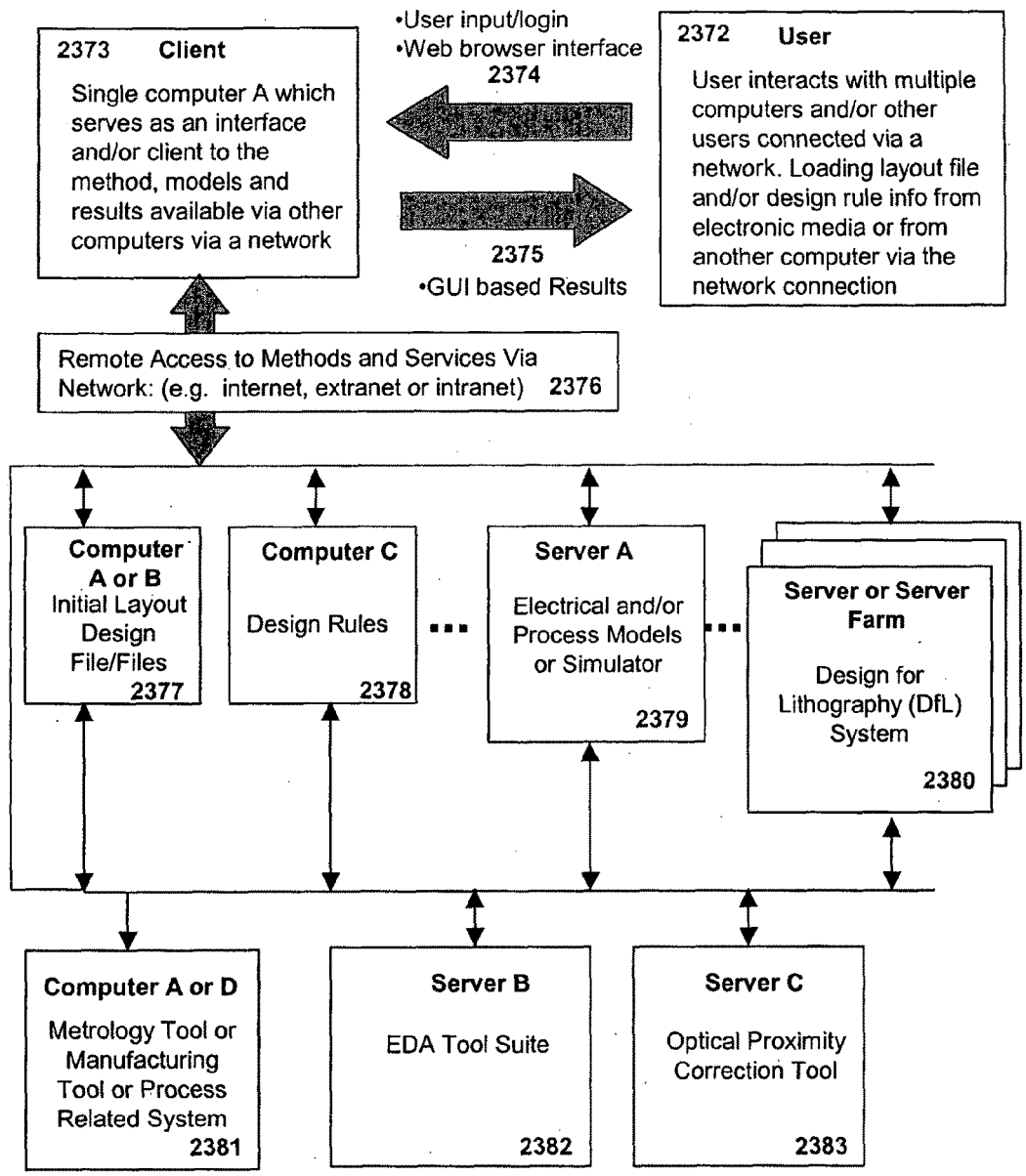
FIG. 53 illustrates an implementation of the method where the client communicates with a server and web services via a network.

The third framework, FIG. 53, is an extension of the client-server model that includes communication via a network 2376 with additional computers that may contain one of more components of the system described in sections b. through f. For example, a design house may utilize the design for lithography tools via the server 2380 but remotely utilize separate computers which house EDA tools 2382 or process models or model parameters 2379 and design specifications 2378 that are provided by the fab or a process development group. This framework also includes the transfer of measurement plan data to control computers on metrology equipment 2381 and the return of actual measurements to the server 2380. This framework also includes the transfer of process related information, such as calibration model parameters, to and from manufacturing or foundry computer systems 2381 to the server 2380. This framework also includes the transfer of information to optical proximity tools 2383 for feature density analysis and design correction.

The system and methods can be implemented and used as a Design for Lithography (DfL) system that verifies whether a particular circuit design will be created or imaged accurately on the wafer and corrects the design where features will not be accurately reproduced. The DfL system includes components 280, 300, 750 and 800 of FIG. 10 and provides layout extraction, chip-level topography computation, lithography CD variation computation, design verification, and design modification. As shown in FIG. 54, the DfL system 2522 may be used with or implemented within electronic design automation (EDA) tools 2500 either directly integrated or communicating via bus or network through an application program interface (API). FIG. 54 illustrates where the DfL system 2522 would fit within an EDA tool 2500, for example. Conventional EDA tools may have the following components: system-level design 2502, logic synthesis 2504, design layout 2506, place and route 2508, physical verification 2510, and signal integrity 2512. Each electronic design file is used during the tape-out process to create masks 2514 which are used in manufacturing 2516 the production IC. Most design for manufacturing components interact with the physical verification and place and route components. The DfL system 2522-2525 is not limited to what component it may interact with and may include place and route 2508, physical verification 2510, signal integrity 2512 and eventually mask creation 2514. However, the most likely role is within the physical verification component 2510, which ensures that a design abides by the rules and constraints provided by manufacturing.

Potential uses of the DfL system include assistance in the placement and specification of buffer regions for interconnect vias and lines during place and route. In this use, feature width variation or topographical variation could aid in determining where electrically active features and components should be positioned and how electrical features that allow communication between these components (e.g. vias and lines) may be routed across the device.

Potential uses of the DfL system include assistance in the placement and geometrical dimensions of interconnect vias and lines to improve signal integrity, timing issues and power distribution. In this use, feature width variation or topographical variation could aid in determining what the resulting feature geometries will be, after processing and how these electrical features may be modified (e.g., bloated or shrunk by some percentage to compensate for topography effects) geometrically to achieve better circuit performance or better device structural and reliability properties.

Potential uses of the DfL system include assistance in the placement and buffer regions for dummy fill added to a design. In this use, feature width variation or topographical variation could aid in determining where dummy or slotting objects should be positioned, the size of dummy and slotting objects and the buffer distance between dummy and slotting objects and nearby electrically active regions.

These components may be combined to verify or connect for problems in the electrical performance. The following example describes such a method. First, the DfL system could be used to modify features on the circuit layout. Next, the results would be passed to an RC extraction tool. Then, the RC extraction results would be used to re-simulate the circuit performance. The resulting performance could be verified, or alternatively the circuit performance results could be used to make further modifications to the design layout. In addition, several different alternative layout modifications could be made; RC extraction and subsequent simulation run all options, and the best modified layout chosen based on the circuit simulation performance.

FIG. 55 illustrates how a design group (or a design house) may use a DfL system 2659 that resides within, is directly bundled with, or directly communicates with an EDA tool 2670. Most designs begin with specifications 2655 that include tolerances on feature size and resolution as well as electrical IC parameters. The design group 2656 uses these specifications to guide them during the creation of an integrated circuit 2657. During the process, one designer or subgroup may do the logic design 2662. Another designer or subgroup may do the memory design 2664 and yet another may design the analog component 2666. A goal of design for manufacturing is to consider manufacturing constraints at various stages of design that are generated with an EDA tool 2670. EDA tools may contain several design for manufacturing components and the DfL 2659 system may be one of those components, as shown in FIG. 54. In this use, the DfL system continually verifies and corrects 2656 designs as the components are designed and added by the designers. In this use, DfL system may directly interact with place and route functions, physical verification functions, electrical simulation and extraction functions and optical proximity functions to provide feature width variation data. This process may or may not include iterative addition of dummy fill (as described in U.S. patent application Ser. Nos. 10/165,214, 10/164,844, 10/164,847, and 10/164,842, all filed Jun. 7, 2002) as well. In cases, where the system cannot find any corrections to the layout that achieves the design specifications, the design group is notified of the design failure 2660. The foundry or manufacturing group provides manufacturing information 2672 regarding the calibration of models to specific process tools and recipes.

In that the DfL system provides a bridge of information flow between the design and manufacturing sides, the DfL system may also reside with the manufacturer or on the internet and communicate with design tools via a network connection. FIG. 56 illustrates a use of the DfL system 2697 outside of or indirectly communicating with one or more EDA tools 2680. The design specifications, 2682, which include CD or associated electrical tolerances, are provide to both the design group 2684 and the design for manufacturing components 2694. The designers use the EDA tool suite to create and add components 2686, 2688 and 2690 into the IC layout 2686.

Each design level is completed 2692 and electronically transferred 2696 via media, network or the internet to the design for manufacturing components 2694, which includes the DfL system 2697. This framework includes the use of the DfL component as a web service that communicates via the internet with both the design and manufacturing groups. Each design level is processed using process information 2693, which includes calibration parameters regarding specific tools and recipe settings. Corrections to the design are uploaded to the EDA tool and server 2698. In cases where the system cannot find any corrections to the layout that achieves the design specifications, the design group is notified of the design failure 2699. In the framework shown in FIG. 57 the DfL system may:

- reside within tools in the lithography process flow and communicate via a bus or network connection,
- reside within an etch tool and communicate via a bus or network connection,
- reside on a network at a foundry that allows for process, lithography (etch) models to be developed and managed by manufacturing or process development personnel,
- reside on a server physically located away from both the design and manufacturing groups and communicates via a network, for example, as a web service, or
- reside at a design house or group but outside of a specific EDA tool and may include network communication with a number of EDA tools from different vendors, or
- reside at a foundry and may communicate via a network with a number of EDA tools from different vendors.

Figure 57:
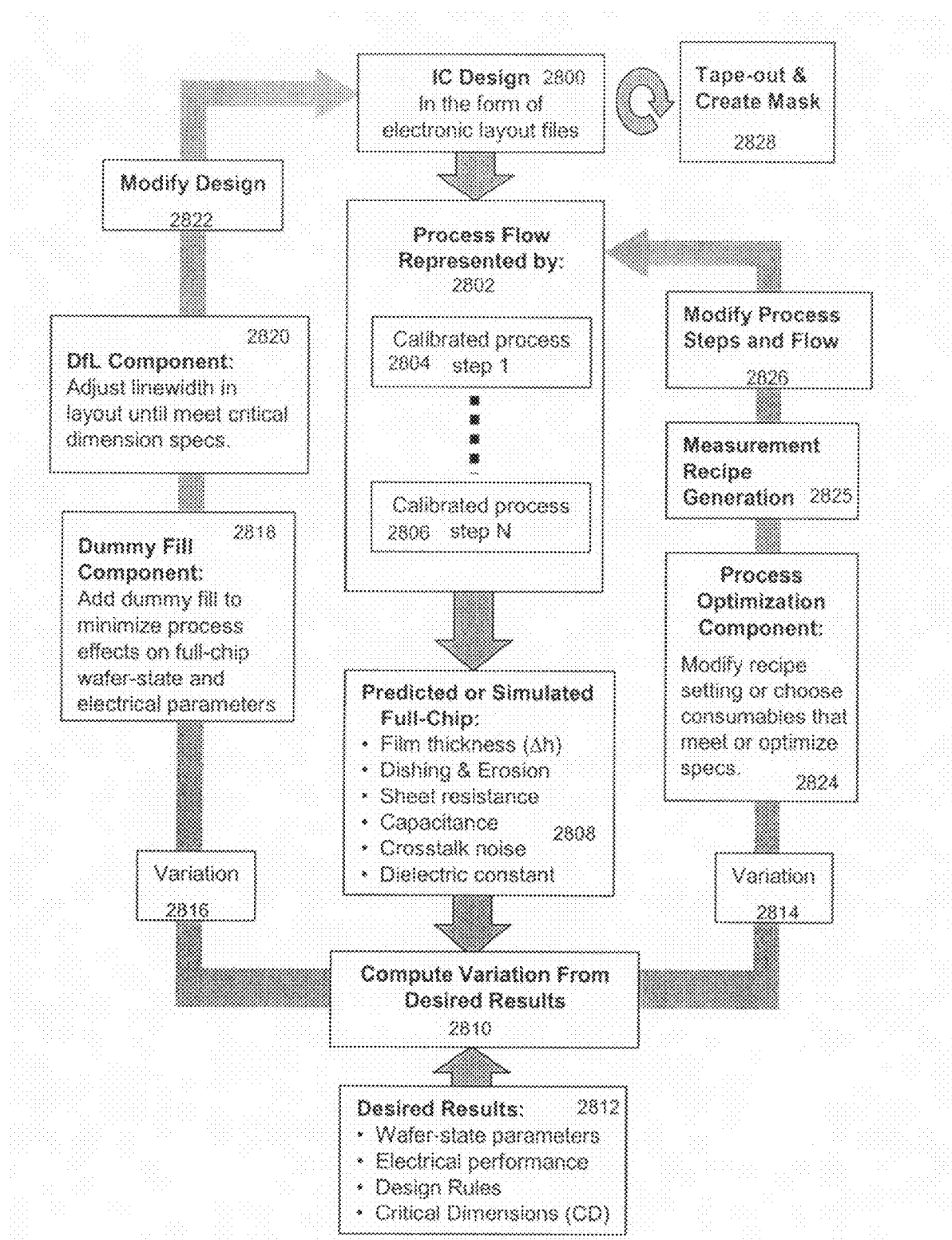
FIG. 57 illustrates use of the method within a design for manufacturing system.

As shown in FIGS. 55 and 56, the DfL system may be used within a larger design for manufacturing system or server. An example of a design for manufacturing system is shown in FIG. 57. An IC design of one or more levels is loaded 2800 and key pattern dependent parameters may be extracted. Process models or simulations of one or more steps 2802 and that may be calibrated to tools and recipes 2804 and 2806 are used to predict full-chip topography 2808 (such as film thickness, dishing or erosion) or electrical parameters 2808 (such as sheet resistance, capacitance, cross-talk noise, drive current, timing closure values or effective dielectric constant). Desired results such as physical and electrical parameters and critical dimension tolerances, often derived from the design specifications, are loaded into the system 2812. A comparison is performed 2810 and those sites or IC features that exceed the specified tolerances and the associated variation 2814 and 2816 are used to make corrections within the design or manufacturing processes.

The variation may be used as feedback to facilitate changes in the design process through use of a dummy fill component 2818 where the size and placement of dummy fill is determined and the design modified 2822. The selection and placement of dummy fill within an IC design level may include the use of pattern dependencies to improve the physical and structural makeup (e.g. use of low-k materials) and electrical performance of the IC. When the variation is primarily due to lithography or the combination of surface variation and lithography, the DfL system or component 2820 may be used to modify 2822 the IC design 2800.

The variation 2814 may be used to modify process parameters and recipe settings as well 2824. This component uses models calibrated at multiple recipe settings and using various consumables to determine the best known process and consumable set. This component may provide this information to a tool operator or modify tool recipe settings directly 2826. This component may also be used to synthesize multiple process recipe steps within a flow such that design parameters are optimized. The process optimization component may be used in conjunction with the DfL component 2820 to evaluate lithography tool settings and consumables (such as photoresist materials) with regard to yield and feature size variation. This component may also be used to generate measurement recipes 2825 for measurements to be taken during calibration or actual manufacture of the circuit 2825 (Additional information concerning selection of measurement locations is found in U.S. patent application Ser. No. 10/200,660, filed Jul. 22, 2002.)

Once the design and manufacturing process parameters are synchronized to yield an optimal circuit, the electronic design is used to tape-out and create the masks used for lithography, including the addition of dummy fill structures within the design. The optimal process and measurement recipes may also be transferred to respective tools within the manufacturing flow used to create the production circuit.

Figure 58:
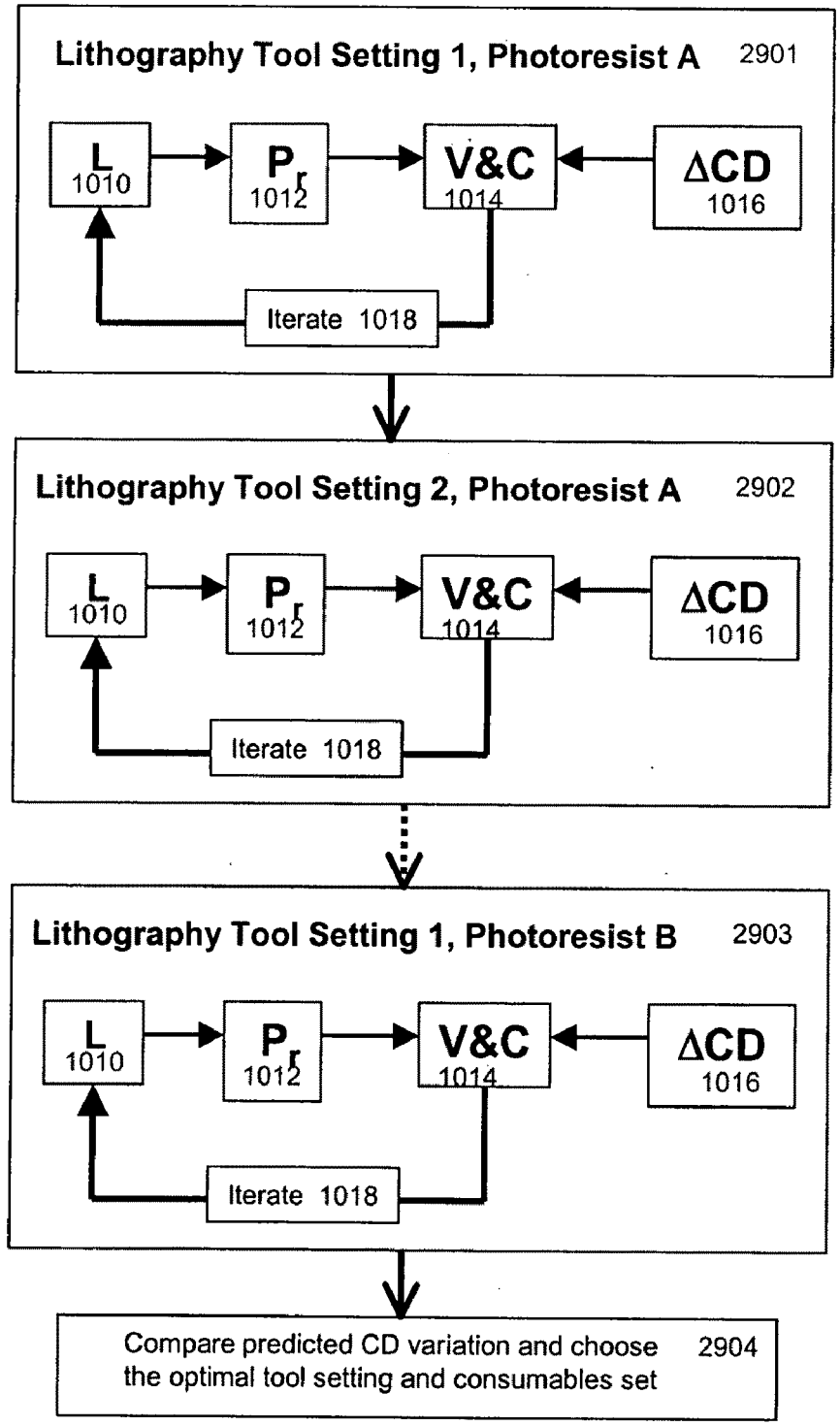
FIG. 58 illustrates use of the method within a design for manufacturing system for choosing lithography related tool settings, recipes or consumable sets.

The DfL component may also be used to choose an optimal lithography recipe among lithography tool settings and consumables (e.g. photoresist). In this use, multiple recipes for the process steps leading up to and including lithography are evaluated using test wafers described in section g. and the calibration process described in section b. A new IC design can be loaded into the system and the process and lithography models evaluated across the multiple recipe calibrations to arrive at minimal feature size variation from the desired specifications. An illustration is shown in FIG. 58 where the system uses the process described in FIG. 10 to predict first pass feature size variation or to iterate until an optimize printed feature size is reached for each set of calibration parameters associated with a recipe condition 2901, 2902, and 2903. The results are compared and the optimal recipe setting is determined 2904. The calibration parameters for each recipe condition may be generated using the processes and test wafers described above. The design for manufacturing system may also employ optimization methods to interpolate or synthesize among lithography process flow recipe conditions.

Figure 59:
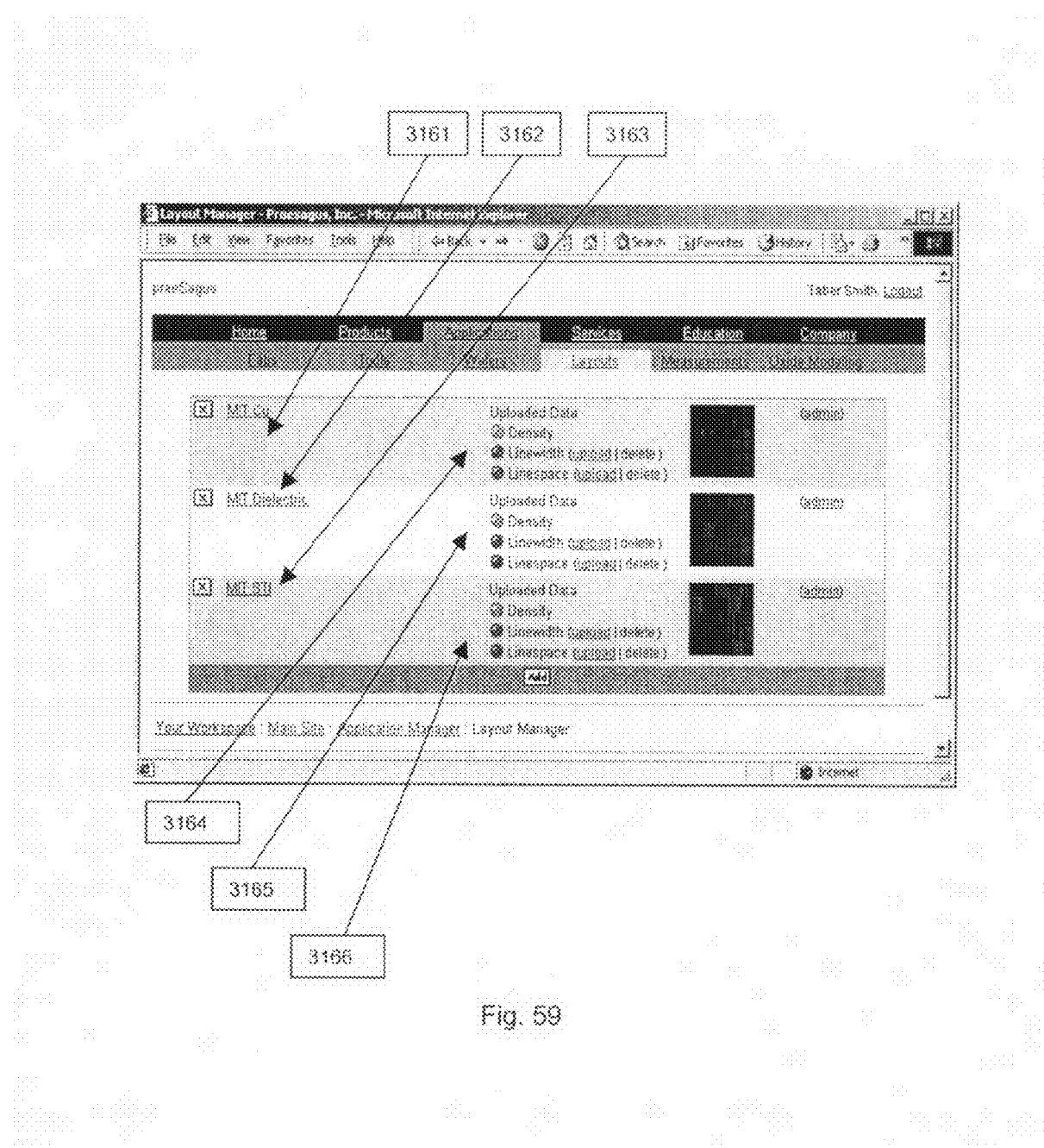
FIG. 59 illustrates a GUI for managing layout extractions from multiple designs.

Several screenshots of graphical user interfaces (GUIs) for design for manufacturing and design for lithography systems are shown in the following figures. A GUI for the Layout Manager component, shown in FIG. 59, allows the user to upload a layout through a web browser and web services, which are automatically configured to add dummy fill for the appropriate processes and according to user defined design rules (also input through a similar GUI). The three designs, 3161, 3162 & 3163, were processed using the layout extraction algorithm to compute effective density. Options are provided to the user to use our layout extraction methods to compute feature width and space or to upload this information from another source, 3164, 3165 & 3166.

Figure 60A:
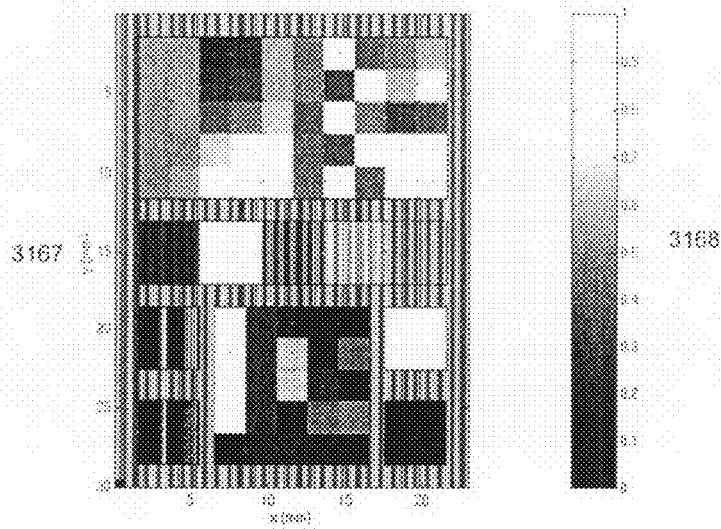
FIG. 60A illustrates results from a feature width extraction from a chip layout.
Figure 60B:
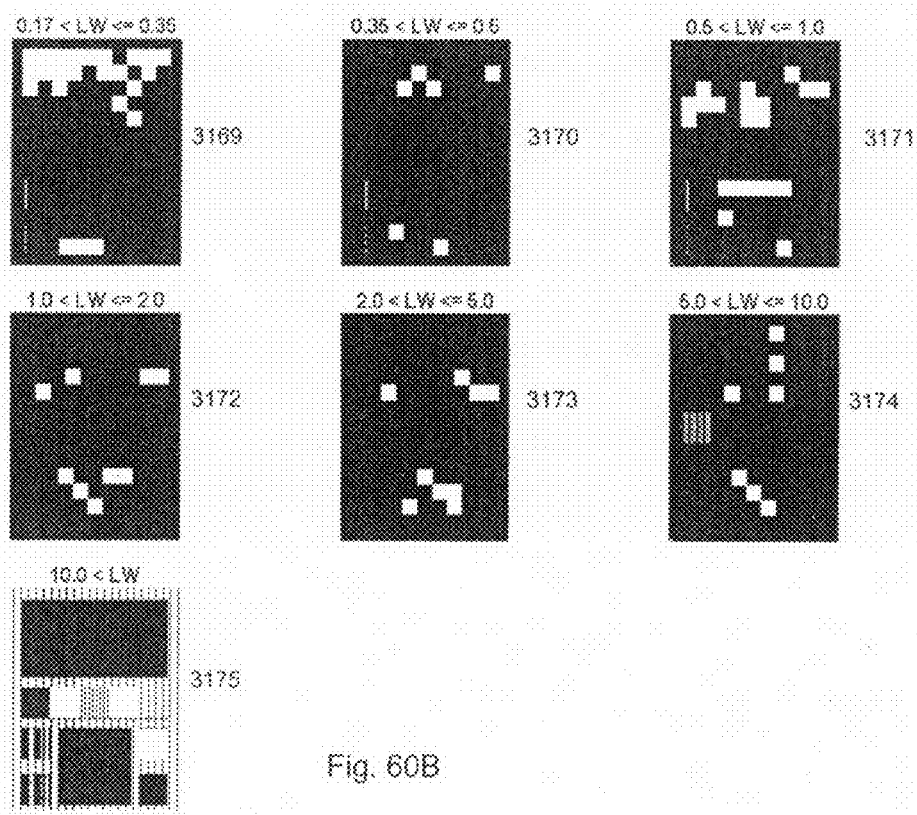
FIG. 60B illustrates results from extraction binning based upon feature width.

The results of a layout extraction using the system are shown in the images in FIGS. 60A and 60B. FIG. 60A shows a full-chip image 3167 of extracted feature widths (line Widths in this case) across the chip according to the scale shown on the right 3168. In FIG. 60B, the spatial line widths across the full-chip are shown 3169, 3170, 3171, 3172, 3173, 3174 and 3175 according to which line width bin they fall into and useful distributions may be formed. This information, as well as line space, local and effective density may be input into the models to predict process and electrical variation.

Figure 61:
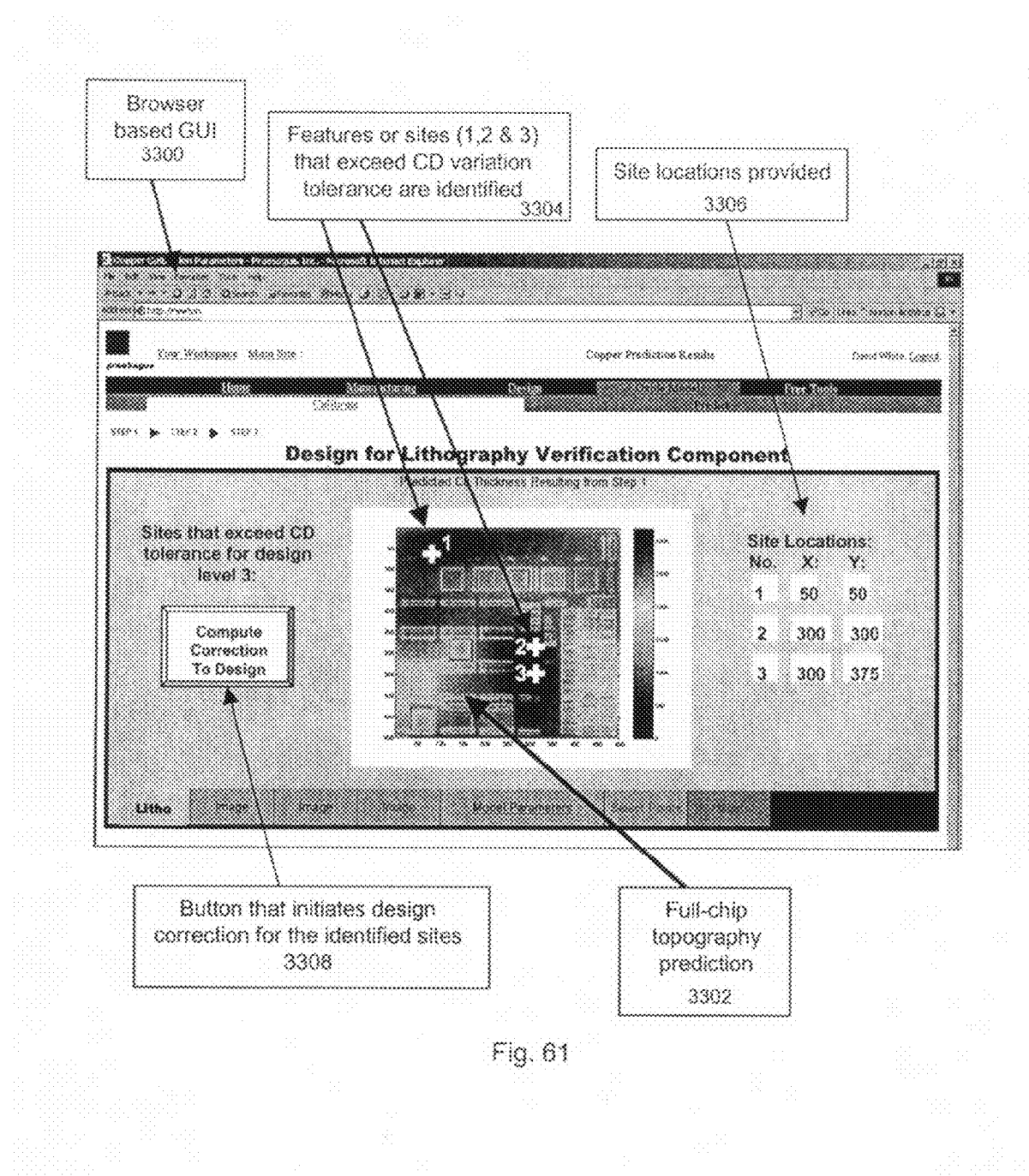
FIG. 61 illustrates a GUI for a design for lithography system embedded within a design for manufacturing system.
Figure 62:
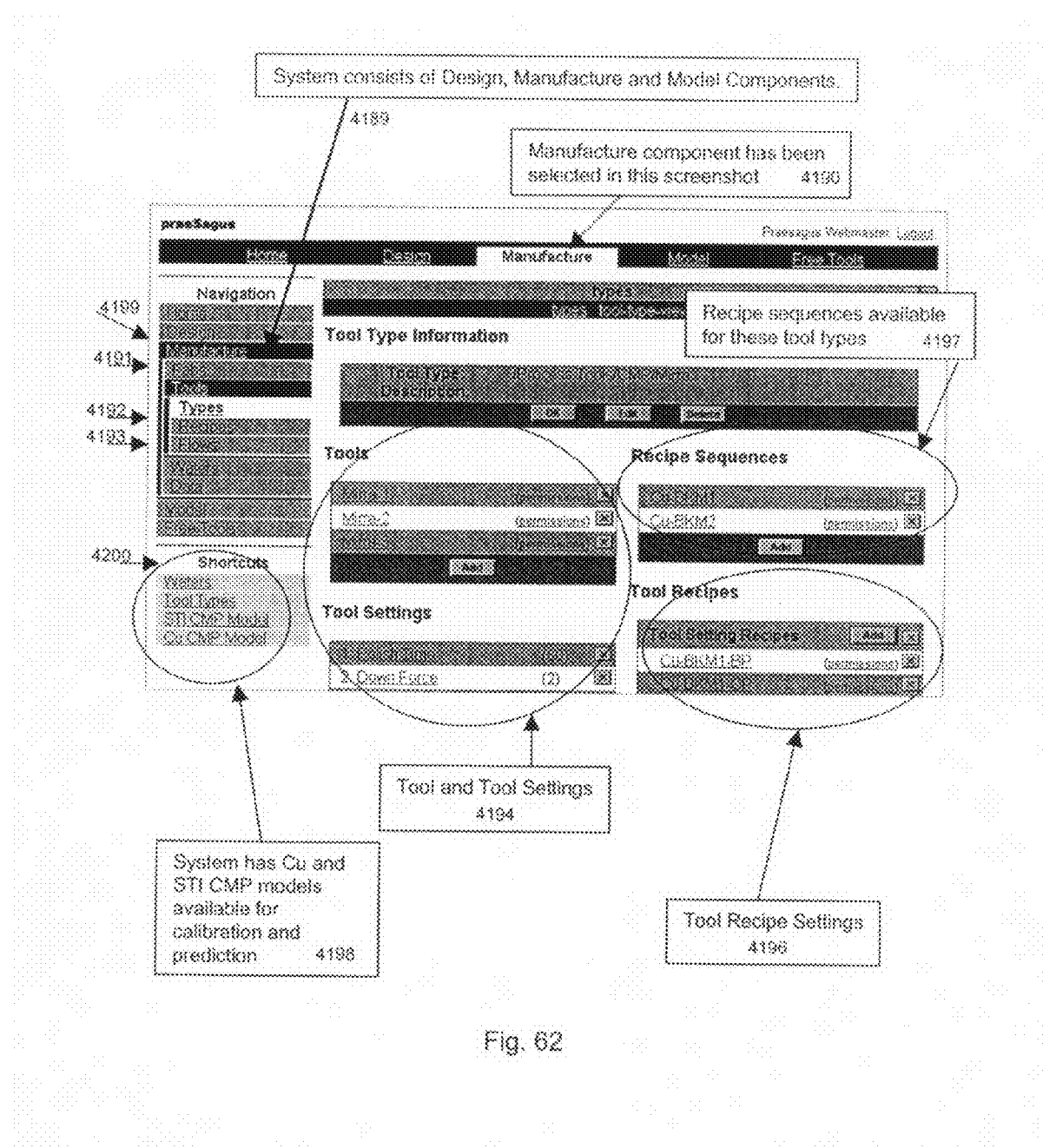
FIG. 62 illustrates a GUI for managing tools and tool recipes within a design for lithography or design for manufacturing system.

A graphical user interface (GUI) for a design for lithography component is shown in FIG. 61, operating within a design for manufacturability server, GUI shown in FIG. 62. A browser 3300 is used as the GUI that communicates with a web server based DfL component residing on a server. The benefit of using a browser is that almost every computer is now equipped with a web browser and there is a great deal of standardization across the two major browsers from Netscape and Microsoft. A full-chip topography image 3302 is shown and those sites (e.g., 1, 2 and 3) that violate feature dimension tolerances are indicated 3304. The site locations are also shown 3306. A button is shown that initiates the correction component that modifies the design to pass design tolerances 3308.

The GUI for the design for manufacturing component is shown in FIG. 62 and a good implementation again uses a web browser as the GUI. The dummy fill services and functions are grouped within the GUI into three primary components; design (4199), manufacture (4191) and model (4200). The screenshot in FIG. 62 shows in the header, 4190, and in the navigation bar, 4191, that the user has selected the manufacturing component. Within the manufacture component are subcomponents: fabs, tools, wafers, and measurement data. In this screenshot, tools, 4192, have been selected. There are three subcomponents under tools: types, recipes and flows. In this screenshot the user has selected types 4193. The types of tools and tool settings available to this user are shown 4194. The available recipes for this tool type 4196 and available recipe sequences 4197 for these tool types are shown. The system configured in this screenshot has two process models available to the user 4198 for calibration and prediction of copper CMP. The design component 4199 uses a layout manager to allow the user to upload and manage layouts and layout extractions. One goal of the design for manufacturability system GUI is to allow the user to manage all the data and results associated with design for lithography services.

Although some implementations have been described above, other implementations are also within the scope of the following claims.

The invention claimed is:
1. A computer implemented method, comprising
using at least a processor configured for:
using a pattern-dependent model, which models a first manufacturing process that is used for fabrication of an integrated circuit and produces topographical variations during the fabrication, to verify that a chip-level feature of a design of the integrated circuit is to be manufactured within focus limitations of a lithographic tool, wherein the first manufacturing process comprises a lithographic process or an etching process; and
using a computer readable storage medium or a storage device configured for storing the pattern-dependent model or using a display apparatus configured for displaying the pattern-dependent model.
2. The method of claim 1 in which the act of verifying is provided as a service in a network.
3. A computer implemented method, comprising
using at least a processor configured for:
using a pattern-dependent model, which models a first manufacturing process that is used for fabrication of an integrated circuit and produces topographical variations during the fabrication, to predict whether a design of a level of an integrated circuit is to be lithographically imaged in accordance with a design of the integrated circuit, wherein the first manufacturing process comprises a lithographic process or an etching process; and
adjusting one or more design or processing parameters so that the design is to be lithographically imaged in accordance with the design
using a display apparatus configured for displaying the pattern-dependent model or using a computer readable storage media configured for storing the pattern-dependent model.
4. The method of claim 3 in which the act of adjusting includes selecting optimal tool settings of a lithography tool.
5. The method of claim 3 in which the act of adjusting includes selecting optimal photoresist materials.
6. The method of claim 3 in which the act of adjusting includes selecting optimal photoresist deposition recipes.
7. The method of claim 3 in which the act of adjusting includes adjusting tool settings for a tool.
8. The method of claim 3 in which the act of adjusting includes adjusting power settings.
9. The method of claim 3 in which the act of adjusting includes adjusting etch times.
10. The method of claim 3 in which the act of adjusting includes adjusting polish times.
11. The method of claim 3 in which the act of adjusting includes adjusting deposition times.
12. The method of claim 3 in which the act of adjusting includes adjusting pressures.
13. A systems comprising:
at least a processor configured for:
using a pattern-dependent model, which models a first manufacturing process that is used for fabrication of an integrated circuit and produces topographical variations during the fabrication, to verify that one or more chip-level of a design of an integrated circuit can be manufactured within focus limitations of a lithographic tool, wherein the first manufacturing process comprises a lithographic process or an etching process; and at least a computer storage device or a computer readable storage medium configured for storing the pattern-dependent model or a display apparatus configured for displaying the pattern-dependent model.

14. The system of claim 13 in which the using the pattern-dependent model to verify is provided as a component in a network.

15. A computer program product that includes a computer readable storage medium, the computer readable medium comprising a plurality of computer instructions which, when executed by a processor, cause the processor to execute performing a process, the process comprising:

using at least the processor configured for:

using a pattern-dependent model, which models a first manufacturing process that is used for fabrication of an integrated circuit and produces topographical variations during the fabrication, to predict whether a design of a level of an integrated circuit is to be lithographically imaged in accordance with the design, wherein the first manufacturing process comprises a lithographic process or an etching process; and adjusting one or more design or processing parameters so that the design is to be lithographically imaged in accordance with the design.

16. The computer program product of claim 15 in which the act of adjusting includes selecting optimal tool settings of a lithography tool.

17. The computer program product of claim 15 in which the act of adjusting includes selecting optimal photoresist materials.

18. The computer program product of claim 15 in which the act of adjusting includes selecting optimal photoresist deposition recipes.

19. The computer program product of claim 15 in which the act of adjusting includes adjusting tool settings for a tool.

20. The computer program product of claim 15 in which the act of adjusting includes adjusting power settings.

21. The computer program product of claim 15 in which the act of adjusting includes adjusting etch times.

22. The computer program product of claim 15 in which the act of adjusting includes adjusting polish times.

23. The computer program product of claim 15 in which the act of adjusting includes adjusting deposition times.

24. The computer program product of claim 15 in which the act of adjusting includes adjusting include pressures.

25. A systems comprising:

at least one processor configured for:

using a pattern-dependent model, which models a first manufacturing process that is used for fabrication of an integrated circuit and produces topographical variations during the fabrication, to predict whether a design of a level of an integrated circuit can be lithographically imaged in accordance with the design, wherein the first manufacturing process comprises a lithographic process or an etching process; and adjusting one or more design or processing parameters so that the design is to be lithographically imaged in accordance with the design, a computer readable storage medium or a storage device configured for storing the pattern-dependent model or a display apparatus configured for displaying the pattern-dependent model.

26. The system of claim 25 in which the adjusting includes means for selecting optimal tool settings of a lithography tool.

27. The system of claim 25 in which the adjusting includes means for selecting optimal photoresist materials.

28. The system of claim 25 in which the adjusting includes means for selecting optimal photoresist deposition recipes.

29. The system of claim 25 in which the adjusting includes means for adjusting tool settings for a tool.

30. The system of claim 25 in which the adjusting includes means for adjusting power settings.

31. The system of claim 25 in which the adjusting includes means for adjusting etch times.

32. The system of claim 25 in which the adjusting includes means for adjusting polish times.

33. The system of claim 25 in which the adjusting includes means for adjusting deposition times.

34. The system of claim 25 in which the adjusting includes means for adjusting pressures.

35. A computer program product that includes a computer readable storage medium, the computer readable medium comprising a plurality of computer instructions which, when executed by a processor, cause the processor to execute performing a process, the process comprising:

using at least the processor configured for performing:

using a pattern-dependent model, which models a first manufacturing process that is used for fabrication of an integrated circuit and produces topographical variations during the fabrication, to verify that a chip-level feature of a design of the integrated circuit is to be manufactured within focus limitations of a lithographic tool, wherein the first manufacturing process comprises a lithographic process or an etching process.

36. The computer program product of claim 35 in which the act of verifying is provided as a service in a network.

* * * * *